United States Patent
Demaray

(10) Patent No.: US 10,120,130 B2
(45) Date of Patent: Nov. 6, 2018

(54) ADIABATIC PLANAR WAVEGUIDE COUPLER TRANSFORMER

(71) Applicant: Demaray, LLC, Portola Valley, CA (US)

(72) Inventor: R. Ernest Demaray, Portola Valley, CA (US)

(73) Assignee: DEMARAY, LLC, Portola Valley, CA (US)

( * ) Notice: Subject to any disclaimer, the term of this patent is extended or adjusted under 35 U.S.C. 154(b) by 0 days.

(21) Appl. No.: 15/987,742

(22) Filed: May 23, 2018

(65) Prior Publication Data

US 2018/0275341 A1    Sep. 27, 2018

Related U.S. Application Data

(60) Continuation of application No. 15/791,001, filed on Oct. 23, 2017, now Pat. No. 9,989,701, which is a
(Continued)

(51) Int. Cl.
*G02B 6/26* (2006.01)
*G02B 6/122* (2006.01)
(Continued)

(52) U.S. Cl.
CPC ............ *G02B 6/122* (2013.01); *C23C 14/044* (2013.01); *C23C 14/083* (2013.01);
(Continued)

(58) Field of Classification Search
CPC ........ G02B 6/14; G02B 6/12004; G02B 6/26; G02B 6/00
See application file for complete search history.

(56) References Cited

U.S. PATENT DOCUMENTS 3,799,800 A    3/1974   Thelen et al.
6,506,289 B2   1/2003   Demaray et al.
(Continued)

FOREIGN PATENT DOCUMENTS

KR    10-20100069606 A    6/2010
WO    2006113170 A2    10/2006
(Continued)

OTHER PUBLICATIONS

T.L Koch et al., "Tapered Waverguide InGaAs/InGaAsP Multiple-Quantum-Well Lasers", In: IEEE Photonics Technology Letters, vol. 2, pp. 88-90, Feb. 1990.
(Continued)

*Primary Examiner* — Jennifer Doan
(74) *Attorney, Agent, or Firm* — Haynes and Boone, LLP

(57) ABSTRACT

A solar cell includes a waveguide core for receiving light, a first layer formed on the waveguide core, a second layer formed on the first layer, a third layer formed on the second layer, first metalization coupled to the first layer, and second metalization coupled to the third layer. The first layer comprises a first optical film which varies in an index of refraction in a lateral direction between a first input end where the light is received and a first output end where the light is emitted. In some embodiments, wherein one or more of the first, second, or third layers has a tapered lateral thickness. In some embodiments, the first, second, and third layers form a PIN device. In some embodiments, the waveguide core has a first index of refraction that is lower than respective indexes of refraction for the first, second, and third layers.

20 Claims, 49 Drawing Sheets

Related U.S. Application Data continuation of application No. 15/149,492, filed on May 9, 2016, now Pat. No. 9,798,082, which is a division of application No. 14/078,168, filed on Nov. 12, 2013, now Pat. No. 9,366,816.

(60) Provisional application No. 61/725,400, filed on Nov. 12, 2012.

(51) Int. Cl.
| | |
|---|---|
| *G02B 6/132* | (2006.01) |
| *G02B 6/30* | (2006.01) |
| *C23C 14/08* | (2006.01) |
| *G02B 19/00* | (2006.01) |
| *F21V 8/00* | (2006.01) |
| *G02B 6/14* | (2006.01) |
| *G02B 6/42* | (2006.01) |
| *C23C 14/04* | (2006.01) |
| *G02B 6/12* | (2006.01) |

(52) U.S. Cl.
CPC ......... *G02B 6/0003* (2013.01); *G02B 6/1228* (2013.01); *G02B 6/132* (2013.01); *G02B 6/14* (2013.01); *G02B 6/305* (2013.01); *G02B 6/4212* (2013.01); *G02B 19/0042* (2013.01); *H05K 999/99* (2013.01); *G02B 2006/12147* (2013.01); *Y10T 74/18576* (2015.01)

(56) References Cited

U.S. PATENT DOCUMENTS

| | | |
|---|---|---|
| 6,533,907 B2 | 3/2003 | Demaray et al. |
| 6,746,890 B2 | 6/2004 | Gupta et al. .................... 438/50 |
| 6,753,255 B1 | 6/2004 | Takada et al. ................ 438/680 |
| 6,827,826 B2 | 12/2004 | Demaray et al. |
| 6,884,327 B2 | 4/2005 | Pan et al. |
| 7,076,172 B2 | 7/2006 | Kumar .......................... 385/123 |
| 7,205,662 B2 | 4/2007 | Narasimhan et al. |
| 7,238,628 B2 | 7/2007 | Demaray et al. |
| 7,378,356 B2 | 5/2008 | Zhang et al. |
| 7,381,657 B2 | 6/2008 | Zhang et al. |
| 7,413,998 B2 | 8/2008 | Zhang et al. |
| 7,469,558 B2 | 12/2008 | Demaray et al. |
| 7,544,276 B2 | 6/2009 | Zhang et al. |
| 7,826,702 B2 | 11/2010 | Dawes |
| 7,860,142 B2 | 12/2010 | Spariosu ......................... 372/75 |
| 8,045,832 B2 | 10/2011 | Pan et al. |
| 8,076,005 B2 | 12/2011 | Demaray et al. |
| 8,105,466 B2 | 1/2012 | Zhang et al. |
| 8,542,425 B2 * | 9/2013 | Cho .................... G02B 6/4215 359/245 |
| 9,112,087 B2 | 8/2015 | Wertsberger |
| 9,366,816 B2 | 6/2016 | Demaray |
| 9,377,580 B2 * | 6/2016 | Lee ......................... H01P 1/15 |
| 9,798,082 B2 | 10/2017 | Demaray |
| 2004/0052942 A1 | 3/2004 | Bijkerk et al. |
| 2005/0183946 A1 | 8/2005 | Pan et al. |
| 2006/0231382 A1 | 10/2006 | Mullapudi et al. |
| 2006/0249372 A1 | 11/2006 | Xiang et al. |
| 2008/0295962 A1 | 12/2008 | Endo et al. |
| 2011/0159702 A1 | 6/2011 | Ohizumi et al. |

FOREIGN PATENT DOCUMENTS

| | | |
|---|---|---|
| WO | WO2006110667 A2 | 10/2006 |
| WO | 2009114184 A2 | 9/2009 |

OTHER PUBLICATIONS

PCT International Search Report and the Written Opinion dated Mar. 12, 2014, in related internatioanl Application No. PCT/US2013/069723.

European Search Report; dated Jun. 7, 2016; 6 pages; in related international Application No. 13854110.7.

* cited by examiner

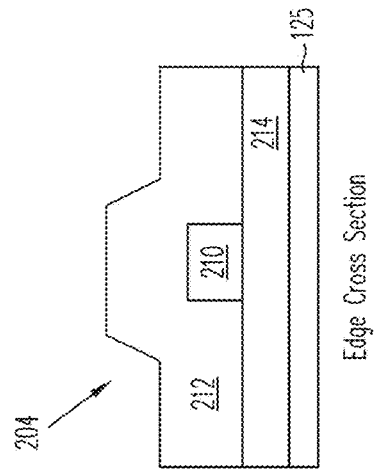
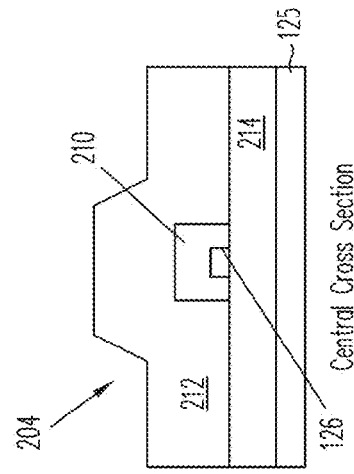
FIG. 2C Top View
FIG. 2E Edge Cross Section
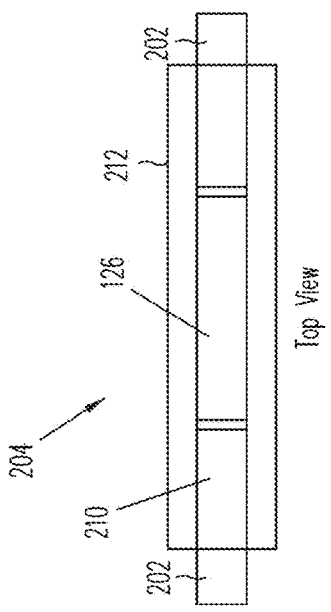
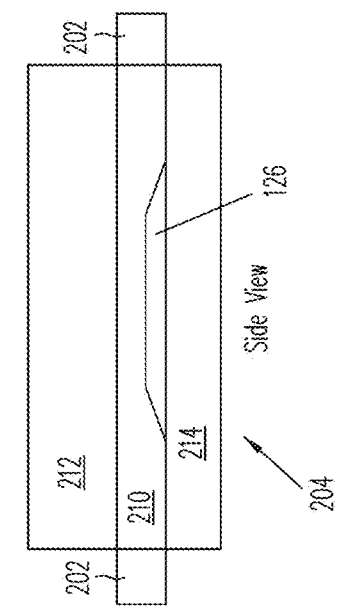
FIG. 2D Side View
FIG. 2F Central Cross Section

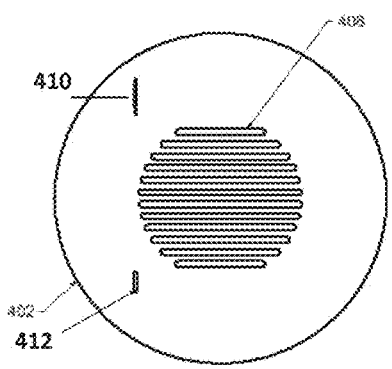
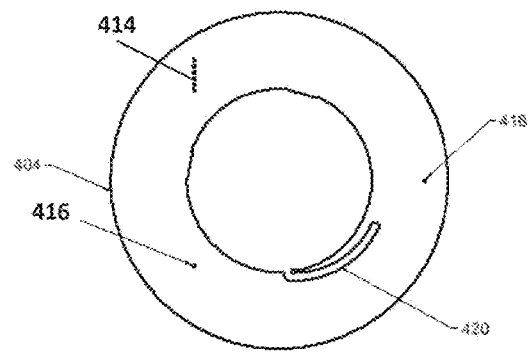
FIG. 4B    FIG. 4C
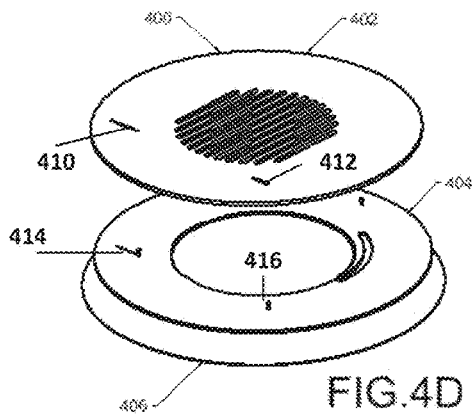
FIG. 4D
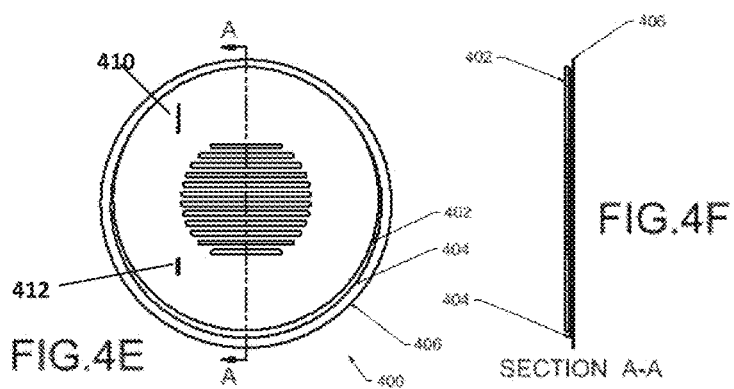
FIG. 4E    FIG. 4F  SECTION A-A

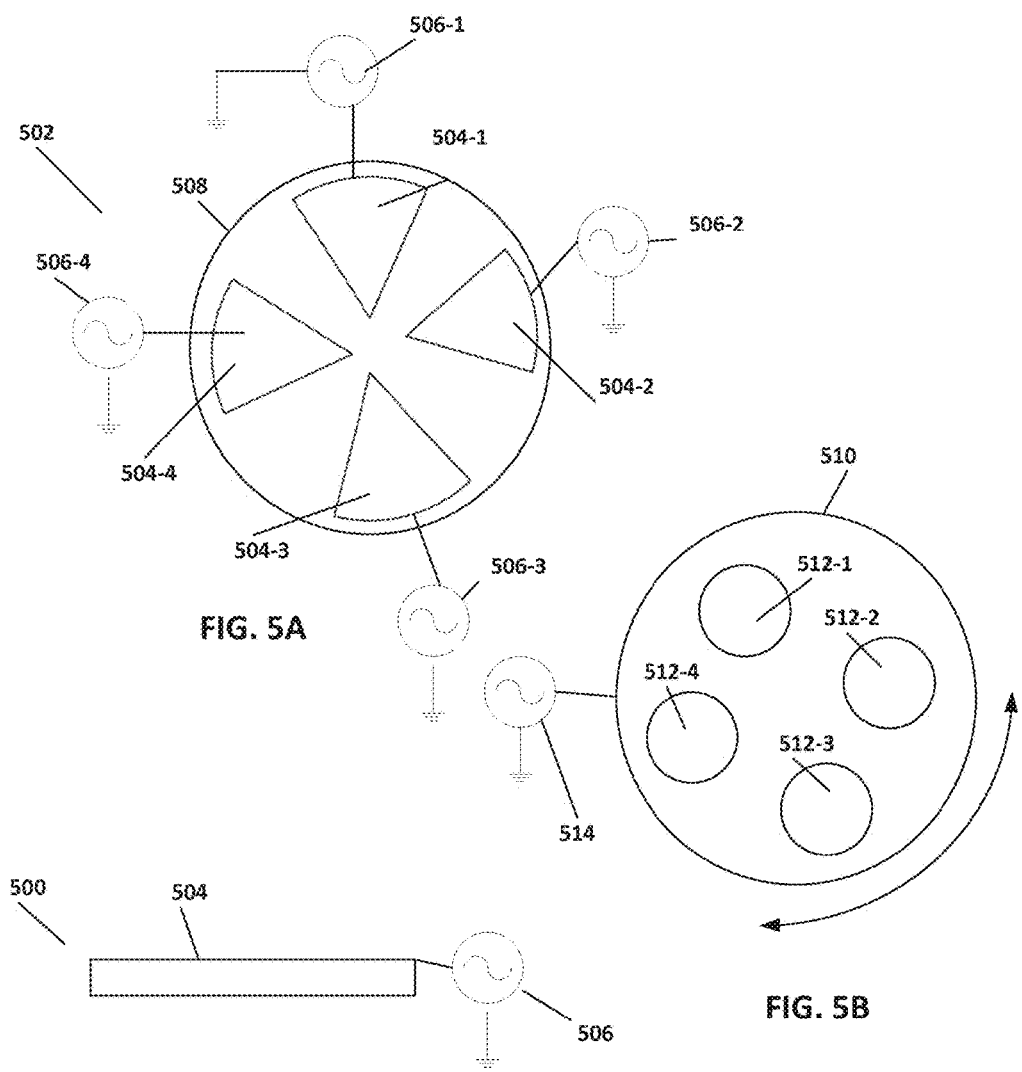

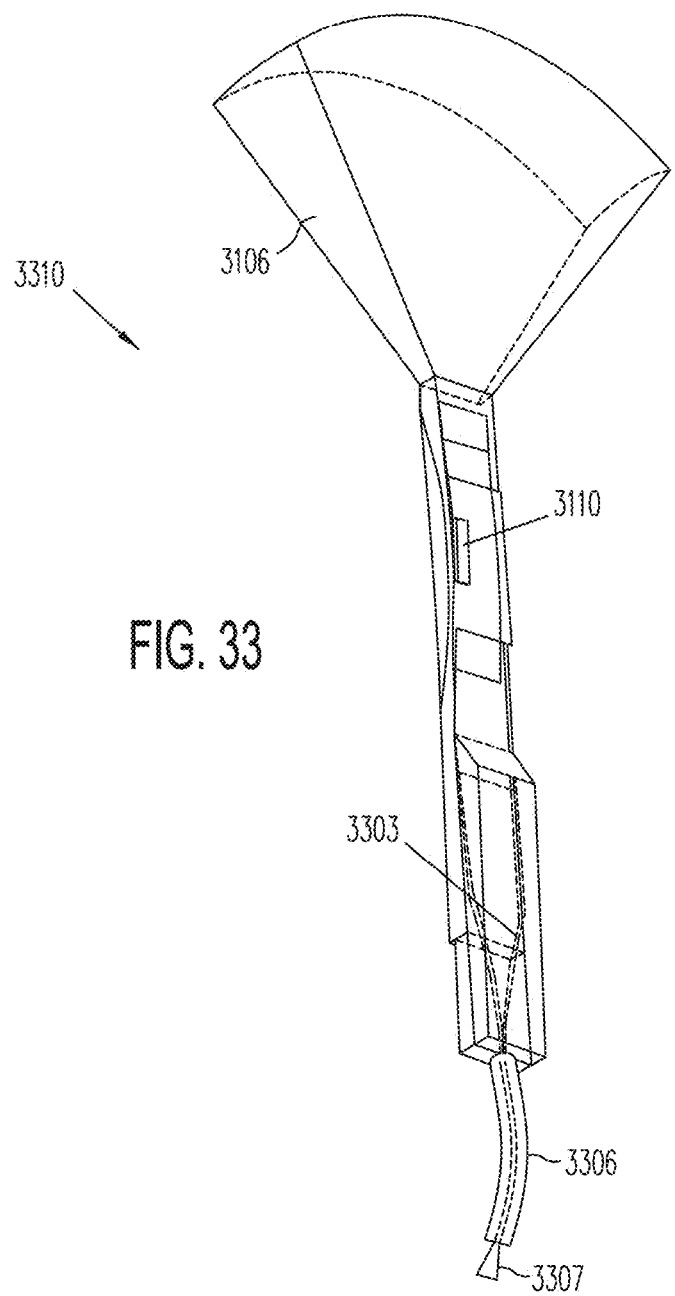

ADIABATIC PLANAR WAVEGUIDE COUPLER TRANSFORMER

CROSS-REFERENCE TO RELATED APPLICATIONS

The present application is a continuation of U.S. patent application Ser. No. 15/791,001 filed on Oct. 23, 2017, now U.S. Pat. No. 9,989,701 which is a continuation of U.S. patent application Ser. No. 15/149,492 filed on May 9, 2016, now U.S. Pat. No. 9,798,082, which is a divisional of U.S. patent application Ser. No. 14/078,168 filed on Nov. 12, 2013, now U.S. Pat. No. 9,366,816, which claims benefit of priority to U.S. Provisional Application Ser. No. 61/725,400 filed on Nov. 12, 2012, all of which are each herein incorporated by reference in their entirety.

BACKGROUND

1. Field of Invention

Embodiments of the present invention are directed towards efficient coupling of light and, in particular, to adiabatic planar waveguide couplers and their applications.

2. Discussion of Related Art

Efficient Coupling of light emitted or received by high index and high numerical aperture (NA) devices, such as organic light emitting diodes (OLEDs), light emitting diodes (LEDs) and Laser diodes, has not been available other than through discrete devices such as lenses and gratings. Such coupling is also hindered due to the lack of transparent, high index optical materials having an index n above the range of approximately 1.44 to 1.7 for such discrete devices. Transparent oxides and dielectrics are often prepared by melting or sintering of low melting precursors, for example with flame hydrolysis precursors. Highly doped glass is also used to form transparent optical films. Glass films composed of suitably transparent materials are limited to doped glass such as borophosphosilicate glass (BPSG), which can be deposited as a film and then heated to optically clarity. In general, high melting oxides have higher index of refraction and require refractory temperatures. However, such materials recrystallize upon cooling and are therefore not applicable to low loss optical applications due to increased scattering. In addition, reflection of light at an interface between a device with a first index of refraction and a second device with a different index of refraction is a further significant limitation to efficient coupling, transport, transmission and conversion of light. Coupling between adjacent optical elements with widely differing characteristics of étendue or optical size and solid angle, required discrete optical elements such as lenses, gratings or so called "photonic crystals" in order to transform the divergence or the optical size, or both, for coupling to a second device with different optical characteristics. To date, there has not been an optical coupler which was able to couple and transform in one continuous device. Consequently, it has not been possible to integrate high index film layers to form a waveguide structure having a larger index contrast.

Scientific modeling confirms that the measured efficiency of discrete lens-based coupling devices such as a single mode laser diode to an optical fiber is less than about 20-30% after optimization. Consequently, fiber coupled sources are less than about 15% efficient. Similarly, out coupling of an LED to air is less than about 30-40% efficient in production due to the high numeric aperture (NA) of diode devices, which are typically lateral wave guide devices where light is out coupled generally through the p-side window and through a transparent conductor layer. Similarly, collection from a concentrating mirror is limited to less than about 40%, even for high f-number (long distance focal point) mirrors, and is typically much less with low f-number mirrors that are more compact and cost effective concentrators. Out coupling of OLEDs, which have recently been shown to be 100% efficient internally, can result in less than 20 to 25% of the light being actually extracted.

Therefore, there is a need for better production of materials directed to coupling light into and out of discrete devices, waveguides and fiber more efficiently.

SUMMARY

Some embodiments according to the present invention include a method of depositing materials to provide for efficient coupling of light from a first device to a second device, the method including mounting one or more wafers on a rotating table; continuously rotating the rotating table under one or more source targets; providing a process gas; powering the one or more source targets; biasing the one or more wafers with an RF bias; and depositing an optical dielectric film on the one or more wafers. In some embodiments, a shadow mask can be laterally translated across the one or more wafers during deposition. In some embodiments, deposited films can have lateral and/or horizontal variation in index of refraction and/or lateral variation in thickness.

These and other embodiments are further described below with respect to the following Figures.

DESCRIPTION OF FIGURES

FIGS. 2C through 2F illustrate a mode size converter.

FIGS. 4A through 4F show a mask and fixture for providing a shadow mask to a wafer.

FIGS. 5A, 5B, and 5C illustrate a deposition system that can be used to deposit materials according to some embodiments of the present invention.

FIG. 5I illustrates an example process for deposition of material according to some embodiments of the present invention.

FIG. 33 shows a lateral absorbing photovoltaic cell in the waveguide having a series transformer for out coupling below band light into an optical fiber for transport according to some embodiments of the present invention.

Figure 1A:
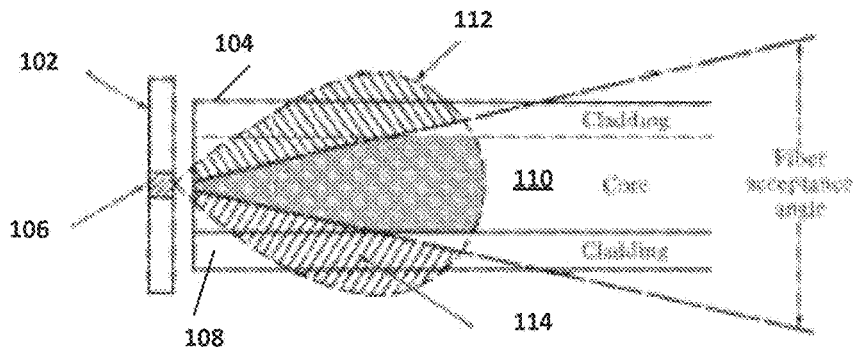
FIG. 1A illustrates the optical emission solid angle of a typical LED.

These and other embodiments of the invention are further discussed below with reference to the above figures.

DETAILED DESCRIPTION

It is to be understood that the detailed description provided below are exemplary and explanatory only and are not restrictive of the invention, which is limited only by the attached claims. Further, specific explanations or theories regarding the deposition of materials or the performance of wave guide structures according to some embodiments of the present invention are presented for explanation only and are not to be considered limiting with respect to the scope of the present disclosure or the claims.

Aspects of embodiments of the present invention include materials, deposition processes to produce the materials, and devices produced from the materials for efficient coupling, transport and transformation of optical energy throughput, étendue and related luminous energy. As described below, some structures according to the present invention can have a variable composite index structure through the thickness or across the thickness or both that may facilitate light coupling and transport via bound mode propagation and transformation.

In the following disclosure, the following terms and acronyms are given their ordinary meaning and are discussed below only for clarity:

étendue: The étendue of an optical system characterizes the ability of an optical system to accept light and is a product of the area of the emitting source and the solid angle into which the light propagates. The étendue is proportional to the square of the numerical aperture (NA) in that the étendue of light crossing an area S is proportional to the product of the area and $NA^2$.

Numerical Aperture (NA): The Numerical Aperture of an optical system is given by n sin θ where n is the index of refraction of the medium in which the optical system is operating and θ is the half-angle of the maximum cone of light that can enter or exit the system.

f-number: The f-number is typically given by the ratio of the focal length to the diameter of the entrance of a lens system.

index of refraction (n): The index of refraction (n) of a material is a material property given by the ration of the speed of light in vacuum and the speed of light in the material.

Some embodiments efficiently provide luminance flux (i.e. optical energy) into and out of planar thin film and macroscopic waveguide devices or between other optical devices. Such optical devices include light emitting materials (e.g. semiconducting materials), high index materials, and high numerical aperture (i.e. high étendue optical systems). Adiabatic coupling of optical devices with other devices of similar étendue, including some semiconductor materials and other devices, can be accomplished over a range of refractive indices. Some embodiments provide energy coupling, transformation and transport of optical luminance with little or no loss of optical energy or power between devices having high or diverse étendue. Some embodiments provide for optical energy collection, transformation and transport as well in order that the optical energy can be efficiently converted to electrical, chemical or thermal energy in a device.

As is well known, the étendue of an optical system characterizes the ability of an optical system to accept light and is a product of the area of the emitting source and the solid angle into which it propagates. Looking through an optical system the étendue can be conserved or, in the presence of dispersion, absorption or other loss mechanisms, increased. Due to conservation principles, the étendue is difficult to decrease. As is discussed below, however, devices with an adiabatic variation of refractive index and layer thickness can reduce the étendue.

Embodiments of the present invention are related to materials, material depositions and devices for the efficient and adiabatic or low-loss coupling and transport of optical energy in planar and macroscopic waveguide devices. Such deposited materials include a wide range of refractive index materials deposited to form devices that can be tapered physically and can have continuous and varying indices over a cross section and axially through a thickness of the material. Such devices may have high numerical aperture or étendue or may have low index and or low numerical aperture or étendue. Some embodiments provide energy coupling, transformation and transport with low or no loss of optical energy or power. Some embodiments provide transformation which conserves étendue. Some embodiments provide continuous and slow change, transforming the étendue from the input to the output.

Some embodiments relate to the deposition of amorphous refractory dielectric films and materials that are transparent and provide for optical films and devices with a wide range of characteristics and applications. According to some embodiments of the invention, such material, films and devices can have an extended range of index of refraction. The index can, for example, range from MgF to Silica to Sapphire (n=about 1.38 to 1.44 to about 1.7) up to that of Titania and titanium oxide (n of about 3.0 or higher). Mixtures of such oxides provide a continuous index over that range through the film, across film and axially through the film Previous work has focused on the formation of dense transparent films with high indexes (e.g. indexes up to n~1.7). As such, the following U.S. Patents and Applications provide background for certain embodiments of the present invention: U.S. Pat. No. 7,378,356 entitled "Biased Pulse DC Reactive Sputter of Oxide Films;" U.S. Pat. No. 7,381,657 entitled "Biased Pulse DC Reactive Sputtering of Oxide Films;" U.S. Pat. No. 7,413,998 entitled "Biased Pulse DC Reactive Sputtering of Oxide Films;" U.S. Pat. No. 7,544,276 entitled "Biased Pulsed DC Sputtering of Oxide Films;" U.S. Pat. No. 8,105,466 entitled "Biased Pulse DC Reactive Sputtering of Oxide Films;" U.S. Pat. No. 7,205,662 entitled "Dielectric Barrier Films;" U.S. Pat. No. 7,238,628 entitled "Energy Conversion and Storage Films and Devices by Physical Vapor Deposition of Titanium and Titanium Oxides and Sub-Oxides;" U.S. Pat. No. 7,826,702 entitled "Optical Coupling into Highly Uniform Waveguides;" U.S. Pat. No. 8,076,005 entitled "Energy Conversion and Storage Films;" U.S. Pat. No. 6,884,327 entitled "Mode Size Converter for Planar Waveguide;" U.S. Pat. No. 8,045,832 entitled "Mode Size Converter;" U.S. Pat. No. 6,506,289 entitled "Planar Optical Devices and Methods of Manufacture;" U.S. Pat. No. 6,827,826 entitled "Planar Optical Devices and Methods for their Manufacture;" U.S. Pat. No. 6,533,907 entitled "Method of Producing Amorphous Silicon for Hard Mask and Waveguide Applications;" U.S. Pat. No. 7,469,558 entitled "As-Deposited Planar Optical Waveguides with Low Scattering Loss and Methods for their Manufacture;" and U.S. Pat. No. 7,205,662 entitled "Dielectric Barrier Layer Films." Each of the above cited patents is herein incorporated by reference in their entirety.

Embodiments of the present invention provide for the deposition of one or more films having vertically and/or lateral graded index of refraction over an extended range. Some embodiments provide new processes for deposition of materials that are capable of a wide area deposition at low cost. Devices designed and manufactured according to some of these embodiments provide efficient and loss-less wave guide structured devices coupling to and between optical elements with widely varying optical aspects such as étendue and index of refraction. Wave guide couplers and transformer devices according to some embodiments of the invention can be manufactured by utilization of a high index to match the numerical aperture and optical extent of semiconductor devices.

Some embodiments of the invention include, but are not limited to, devices which provide adiabatic or loss-less coupling over a wide range of devices with optical aspects having different numerical aperture (NA), optical size and index of refraction. These devices can, for example, include OLEDs, LEDs, laser diodes (LDs), and mirrors with high NA. In another aspect, some embodiments of the invention relate to coupling light between devices with the same étendue as well as to coupling sources and devices having different étendue with adiabatic transfer of light energy. Some embodiments of the invention relate to coupling high NA devices to low NA devices such as optical fiber, semiconductor devices, planar waveguides, and optical elements with large f-number and low NA. In some embodiments, planar thin films and stacked thin films, which are also waveguide devices and which are manufactured by methods according to some embodiments of this invention, can have vertical and lateral variation in index so as to provide waveguide transport of light and also continuous transformation of étendue within the waveguide, so as to match NA, optical size and index as required in combination, into and out of devices including active devices and layers such as emissive and absorbing semiconducting devices or phosphor doped layers. Some embodiments of the invention provide methods for manufacturing a coupling device for transforming the étendue and index within the device continuously to provide transport between devices with lossless coupling or for coupling to a device and providing selected free space emission different from the coupled source. The subject waveguide device can be formed according to embodiments of the present invention so as to transform between devices without loss of optical through put by conserving étendue where the NA and optical size of two coupled devices varies as the inverse.

In some embodiments, devices with different étendue can be coupled with gradual change in étendue by the waveguide coupler transformer. Such a coupler transformer device can also accommodate internally passive and active elements so as to act upon a selected portion of the guided light spectrum while coupling the remaining portion of the optical energy without further loss to free space or an output device. Such a device can also be formed by methods according to some embodiments as a planar device on a wafer can couple one or more integrated optical devices.

Some embodiments of the present invention are directed to methods of depositing high index transparent films and materials. Further, some embodiments of the invention are directed to optical devices utilizing the high index films for the efficient coupling and transformation of light capacity and flux between optical devices.

Some embodiments are directed to the transformation of light by phosphor and or band absorber material or layers within the waveguide layers and devices. Further, some embodiments are directed to optical energy collection, concentration, conversion and transport from high NA devices to low NA devices through a waveguide coupler transformer.

Some embodiments are directed to coupling between optical devices with different numerical aperture and or optical size and different indices, including, for example, semiconductor, mirrors, fiber or other devices having different étendue and or different optical size, numerical aperture or index of refraction.

In some embodiments, films and or devices having in part high index and high index contrast or high numerical aperture including waveguide coupling and transport of coupled light wherein the waveguide transport transforms the NA and optical size and or the index of refraction over a wide range of values from high index materials and or high numerical aperture associated with high étendue to materials, films and devices having low index and/or low numerical aperture and associated low étendue and differing optical size.

In some embodiments, the deposition of transparent dielectric films with an optical index with a range from magnesium fluoride (n~1.38) to silica (n~1.44) to high index, characteristic of semiconductor materials and devices and titania (n~3 or higher) can utilize a Bias Pulsed DC processes such as that described in U.S. Pat. No. 8,105,466.

In some embodiments, refractory additions including, but not limited to, titanium to oxide films deposited with biased pulsed reactive PVD can be used. Such films, including high index films composed of dielectric and oxide materials as single compounds or as an alloy of one or more dielectric compounds, including Titanium, as described in U.S. Pat. No. 7,238,628 can be utilized.

Some embodiments provide a process and method for the formation of uniform layers having a wide range of index, including an index by addition of titanium oxide. Such high index layers can have a graded composition through the thickness and also laterally over the substrate or another layer. As such, embodiments of the invention can include the deposition of a film or films with a wide range of lateral index forming at least one layer of a wave guide structure with a wide range of étendue or optical extent within a continuous waveguide structure.

In some embodiments, a waveguide device according to some embodiments has a first étendue and transforms the optical capacity or étendue over a wide range and without loss between a source and another device or free space, which includes both high NA and low NA as well as high optical size and low optical size. Some embodiments of the invention relate to devices that can be made to couple to a high NA optical device at one end, matching the NA and optical size of the source device so as to transport light without loss and then couple to a low NA device, without loss so as to provide an adiabatic coupler transformer.

Embodiments of the invention may include fabrication of a planar coupler transformer that incorporates both macroscopic optical components as well as thin film microscopic waveguide elements to facilitate coupling, transporting, converting and or transforming light within a continuous waveguide structure to optical elements with widely different numerical aperture, optical extent and index of refraction. In some embodiments, two or more layers with suitable index of refraction variation both vertically and laterally to form a light guiding structure to vary both optical size and NA. Consequently, a device can be formed having the optical size and NA of a waveguide device by varying the index of refraction laterally and gradually in inverse proportion to conserve étendue in order to efficiently couple light into the waveguide device.

In another aspect the NA and optical size of a waveguide coupler transformer can be gradually varied so as to gradually increase or decrease the étendue, minimizing the rate of change of optical throughput within the waveguide transformer. Etendue can be decreased by either reducing the optical size of the waveguide at fixed contrast or by increasing the contrast of the waveguide at fixed waveguide size. In the last case it is expected that the mode distribution of a waveguide would increase in mode number. Etendue can also be decreased by doing both. If the change in etendue is over a distance large with respect to the wavelength of light reduction in etendue will be adiabatic or lossless.

Some embodiments provide highly efficient devices for coupling high index and high numerical aperture devices, for example LED, laser diodes, photodiode receivers and OLEDs or polymer luminaire components and assemblies. In applications of planar emissive materials, a layer or layers having continuous or graded index of refraction, similar and adjacent and increasing in index away from the emissive layer, in another embodiment of the invention provide a wave guide layer to which the light will be directed and by which the light will not be absorbed but can be directed away from the emissive layer to free space or to additional high index layers according to this invention for transport or scattering extraction. Some embodiments of the invention enable the integration of active layers having an index of refraction within the wave guide, such as layers containing phosphor or dopants with electrical activity or semiconducting layers with continued high efficiency wave guide transport.

Some embodiments are directed to a lateral graded waveguide structure that provides for the continuous and gradual conversion of étendue to an active region of the waveguide containing a phosphor, a diode such as a photo diode or a photo voltaic energy converter or an electrically active layer. Such region or layer conveys and/or transforms a portion of the optical energy into and/or out of semiconductor devices embedded with the waveguide portion of the planar coupler transformer. The optical coupler or transformer converter comprises a region of an integrated circuit and or discrete component of an integrated passive or active element of an extended and integrated optoelectronic device or circuit.

Efficient optical coupling between a high numerical aperture (NA) component (e.g. a photo diode (PD), LED or laser diode (LD), or a wide angle (low f-number) mirror) with or to a low NA component (e.g. a waveguide or distant source such as the sun) depends on matching and overlap of three things: the optical area; the solid or cone angle of emission or acceptance; and the index of refraction (n). The product of the first two is the étendue (E). The coupling might be by free space, where the solid angle overlap is the important component, or facet to facet between the two components, where their optical areas should be aligned. It might be for surface or lateral in plane coupling. Since semiconductor devices have a high range of index, from as low as 1.7 or 1.8 for OLED diodes to 3.4 for amorphous silicon, and optical components and films have a low range of index, from 1.44 to ~1.5 and up to ~1.7. To date, it has not been possible to match all three aspects of high and low NA devices, leading to very low coupling efficiency between methods of optical concentration and transportation and semiconductor devices.

Matching of the small source size of LEDs or LDs with large sources used for lighting applications also leads to losses. Étendue can be matched by the use of lower index materials having a matched contrast resulting in facet reflection with no useful benefit for coupling to low index devices. In some embodiments of the present invention, matching to semiconductor diodes, whether for light extraction or for in-coupling to a photo diode, can be accomplished. In all cases, coupling low NA devices such as optical fiber or waveguides to high NA, can be accomplished by interposing one or more lenses to transform some of the source solid angle into the acceptance angle of the coupled component and is accompanied by a loss of optical throughput and reflection.

FIG. 1A illustrates conventional coupling of light from an optical source 102 to a waveguide 104. As illustrated in FIG. 1A, optical source 102 includes active area 106 where light is emitted. Optical waveguide 104 includes a core 110 that is surrounded by cladding 104. As is shown in FIG. 1A, the source radiation pattern 112 is too extensive to couple into waveguide core 110 and, as a result, there is a lost power portion 114 of the source radiation pattern 112 that is not coupled into core 110.

FIG. 1A, therefore, illustrates the loss of coupling efficiency due to mismatched NA and solid angle overlap. FIG. 1A illustrates the optical emission solid angle of source radiation pattern 112 that is typical for a LED. The LED illustrated in FIG. 1A may have NA~0.7 (resulting from a half-angle of ~44.4 deg.). The mismatch is with both the solid acceptance cone represented by the fiber acceptance angle and the optical area extent of an optical fiber waveguide, which has an NA~0.14 (resulting from a half angle~8 deg.).

The mismatch can be evaluated for a high NA LED or LD having an NA up to 0.65 for coupling to a lower NA fiber. The emission pattern of the LED, as shown in FIG. 1A, can be given by $B(\theta,\varphi)=B_0 \cos\theta$, where $B_0$ is the radiance along the normal to the radiating surface of active area 106. If A is the normal area of the source and $\Omega$ is the solid emission angle of the active area (or source) 106, the Brightness can be given by $B_0 A \Omega$. For a step-index fiber (i.e. where core 110 has a first index and cladding 108 has a second index different from the first index), NA of fiber 104 is independent of positions $\theta$ and radial distance r and the power coupled into fiber 104 is given by, $$P_{coupled} = \pi r_c B_0 (NA)^2.$$

The power emitted by an LED source 106 of area A into a hemisphere is $2\pi r_s^2 B_0$, where $r_s$ is the radial distance from the source 106.

When $r_c = r_s$ and $NA_{source} = NA_{fiber}$, the optical throughput is continuous and there is no loss or change of étendue. A waveguide core comprised of 33% alumina with an index of 1.55 in a host glass of silica with an index of 1.44, which may be formed according to embodiments of the present invention, will have an NA of 0.65, matching the LED device with respect to solid angle overlap. With equal optical areas, the étendue of such a high NA fiber or waveguide 104 matches that of source 106, providing a continuous optical throughput. However due to the difference in index between source 106, core 110, and the gap between source 106 and core 110, reflection at the input facet will cause loss of optical throughput.

Moreover, at the output facet of a coupling device that matches the contrast and mode field characteristics of a high NA source, there will be a mismatch again, due to the high contrast, with source size. With regard to reflection, even with ideal overlap of optical area and solid angle, 'adiabatic' or "loss less" coupling cannot be achieved because facet reflection will result if the two components being matched have a different index. LED and LD devices are comprised of much higher index materials than conventional optical films, with an average index from 2.4 in the III-Nitrides to 3.6 or more in GaAs. Even with facet to facet alignment and elimination of an air filled cavity with optically polished facets, the reflection is given by $$R = \left(\frac{n_1 - n}{n_1 + n}\right)^2$$

where $n_1$ and n are the average index of the LED and waveguide, respectively. The large loss can be appreciated by the example of a GaAs LED with an index average of 3.6 placed line to line with an optical fiber with average index 1.48, independent of any mismatch of étendue. The coupled power $P_{coupled}$ is given by $(1-R)P_{source}$. In the present example, then, $P_{coupled}$=0.83 $P_{source}$, resulting in a 17% reflection loss in this coupling.

Fiber coupled LEDs and LDs have been coupled to an index fluid and shaped photonic couplers have been employed for light extraction. However, extraction of light efficiently from a high NA device into another device comprised of low index material is not known. This is due to the Fresnel loss incurred by the use of low index material, even with suitable contrast and provision of NA. With the addition of anti-reflection coating, this loss can be reduced. However the need to transform the NA to a lower value remains. Neither is there a continuous optical element that couples and transforms optical capacity, etc. as a waveguide device.

Figure 1B:
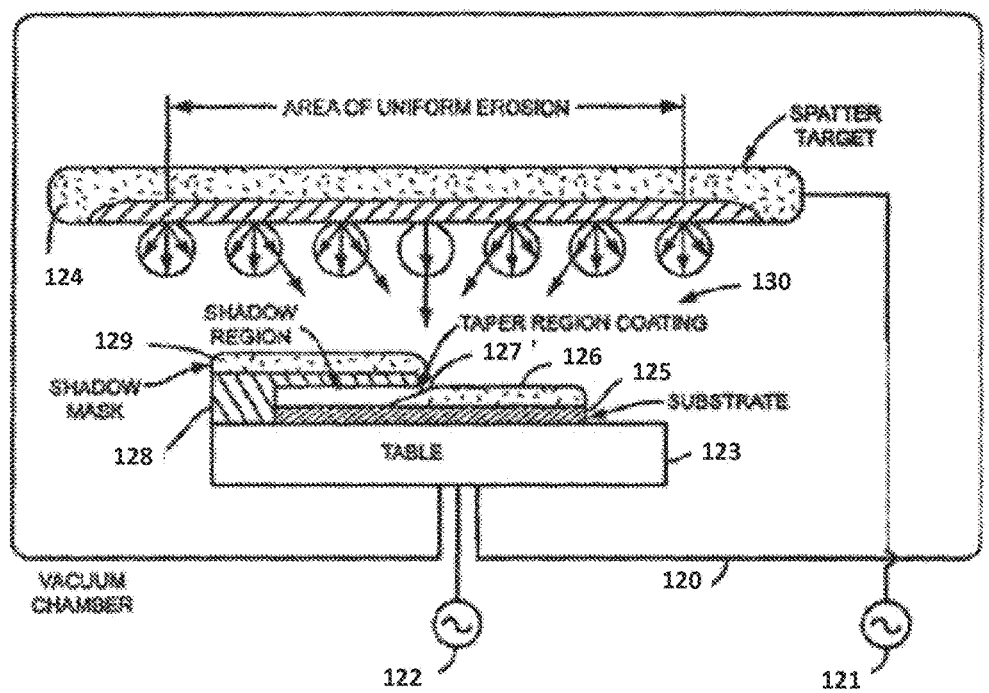
FIG. 1B shows deposition of a material on a substrate to form a lateral taper.

As was discussed in U.S. Pat. No. 8,045,832 and U.S. Pat. No. 6,884,327, a mode size converter that can help couple light from source 106 to optical fiber 102 can be provided. FIG. 1B illustrates deposition of a material with a lateral taper as described in U.S. Pat. No. 8,045,832 and U.S. Pat. No. 6,884,327. As shown in FIG. 1B, a sputter target 124 is powered with a power generator 121, which can be a pulsed-dc generator or an RF generator. A substrate 125 is placed on a mount table 123, which is powered with an RF generator 122 to provide an RF bias to substrate 125. A shadow mask 128 is coupled to mount table 123 in order to partially block substrate 125 from sputter target 124. As shown in FIG. 1B, material is sputtered from sputter target 124 and is deposited to form material layer 126 on substrate 125. Because of shadow mask 128, taper 127 is formed in material layer 126. A layer of material 129 is also deposited on shadow mask 129. The deposition occurs within vacuum chamber 128 and sputtered material 130 is drawn to substrate 125 in the process.

Figure 1C:
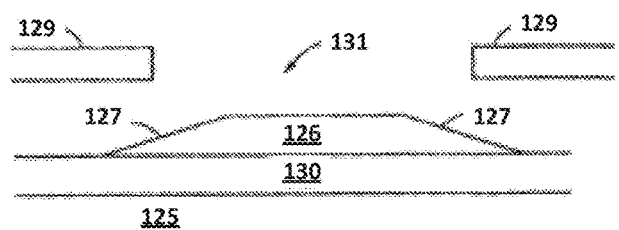
FIG. 1C shows a cross section of the tapered core of the waveguide mode size converter formed under the shadow mask.

FIG. 1C illustrates a mode-size converter deposited according to the process illustrated in FIG. 1B. FIG. 1C illustrates device 131 formed with two shadow masks 209. Further, an additional layer 130, which may be a cladding layer or may be a passive core layer, may be deposited over substrate 125 prior to deposition of layer 126 with tapers 127, which may be a core of a planar waveguide.

Figure 1D:
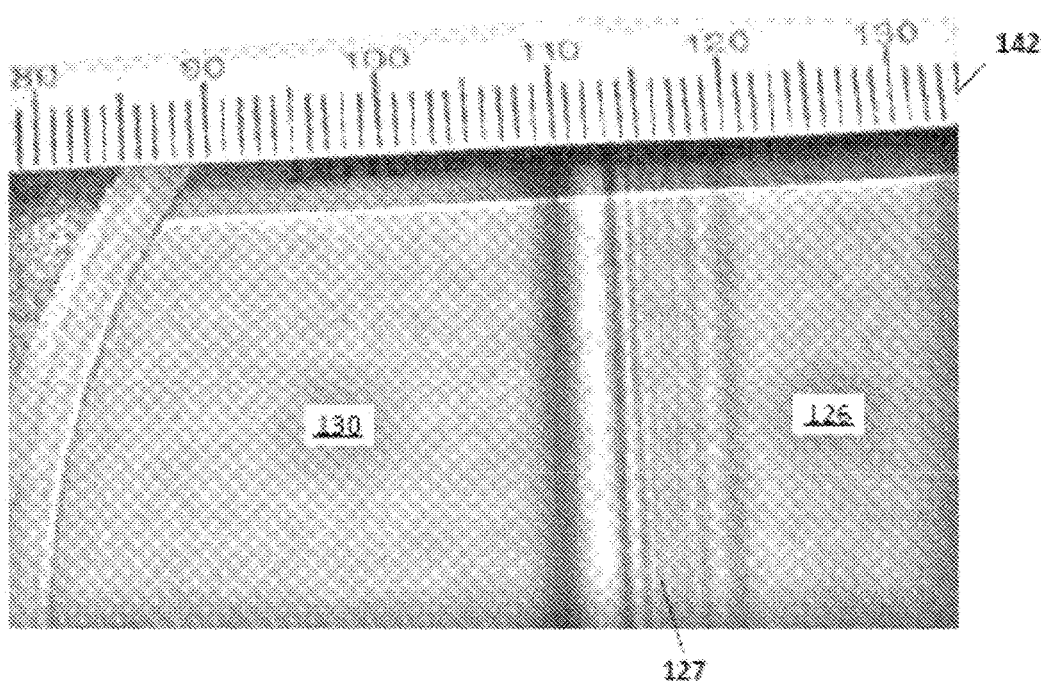
FIG. 1D shows a tapered region with a gradual taper.

FIG. 1D illustrates an alloy film of 92% SiO2 and 8% Al2O3 deposited through a shadow mask according to the process described above. FIG. 1D shows taper 127 of an $E^{18}/cm^3$ $Er^{+3}$ ion doped film in ambient light, which extends from layer 126 across taper 127 indicated the region indicated by the optical fringes to uncovered layer 130. Such tapered regions having an extent of gradual taper over a distance of more than 10 mm, as illustrated in ruler 142, from full thickness to the uncoated portion of layer 130 on the left hand side to the full thickness of deposited layer 126 on the right hand side.

Figure 2A:
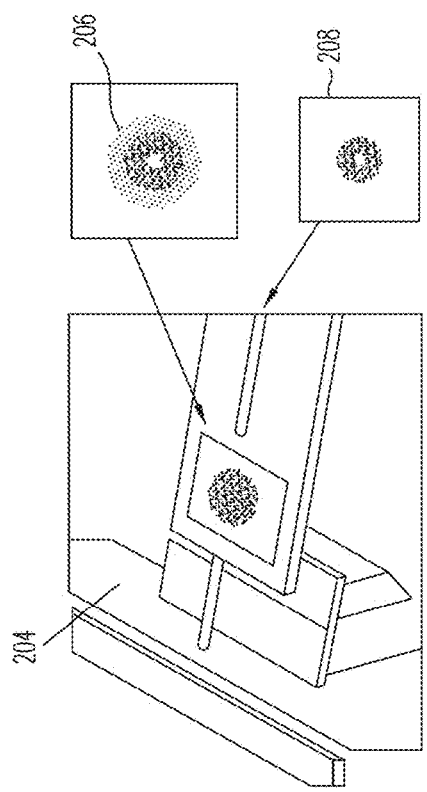
FIGS. 2A and 2B shows a schematic of an active tapered film forming a mode size converter.
Figure 2B:
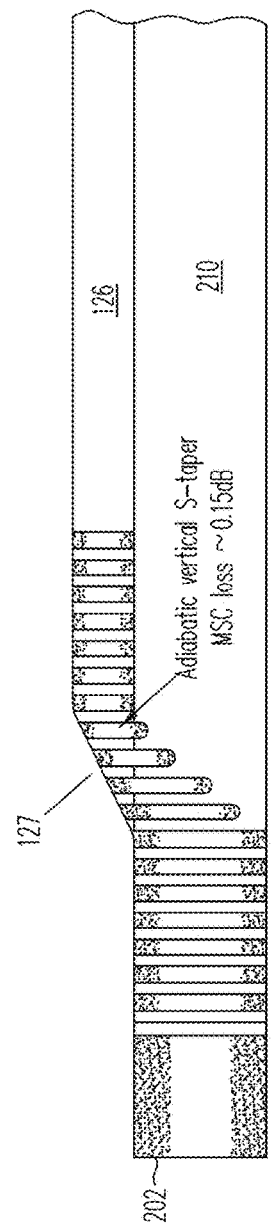

FIGS. 2A and 2B show an active device 131 according to the processes described above that performs a mode size conversion from 1060 optical fiber 202 into a similar sized passive waveguide layer 130 with mode size conversion into the higher index tapered film 126. Actual loss was measured in an actual device as shown in FIG. 2A showing the pump fiber coupled 1350 nm pump light coupled into the passive waveguide, with lower NA and large mode size picture taken with cleaved device. Also, green fluorescence and small mode size from higher NA Erbium ion doped 92/8% Aluminosilicate film (92% $Al_2O_3$ and 8% $SiO_2$) forming the core of a planar optical amplifier formed as layer 210. As shown in FIG. 2A, light 206 is a cross section of fiber 202 and light 208 is from a cross section of amplifier layer 126. Mode size conversion is accomplished with taper 127 in amplifier layer 126. As shown in FIG. 2B, tapered layer 126 is deposited over core 210 and prior to deposition of a cladding layer.

FIGS. 2C through 2F illustrate another embodiment of Mode Size Converter device 204. In this case, the tapered layer 126 is deposited over a lower cladding layer 214 and then core layer 210 is deposited over tapered layer 126 and an upper cladding layer 212 is deposited over core layer 210. FIG. 2C illustrates a top view of device 204. As shown in FIG. 2C, light from fiber 202 is coupled into core layer 210. Tapered layer 126 is formed on core layer 210 and an upper cladding layer 212 is provided. FIG. 2D illustrates a side view of device 204. As shown in FIG. 2D, tapered layer 126 can be formed on a lower cladding layer 214 and core layer deposited on tapered layer 210. A top cladding layer 212 is then deposited on core layer 210. FIG. 2E illustrates a cross section of device 204 in a region of device 204 that does not include tapered layer 126. FIG. 2F illustrates a cross section of device 204 in a region of device 204 that includes tapered layer 126.

Figure 3:
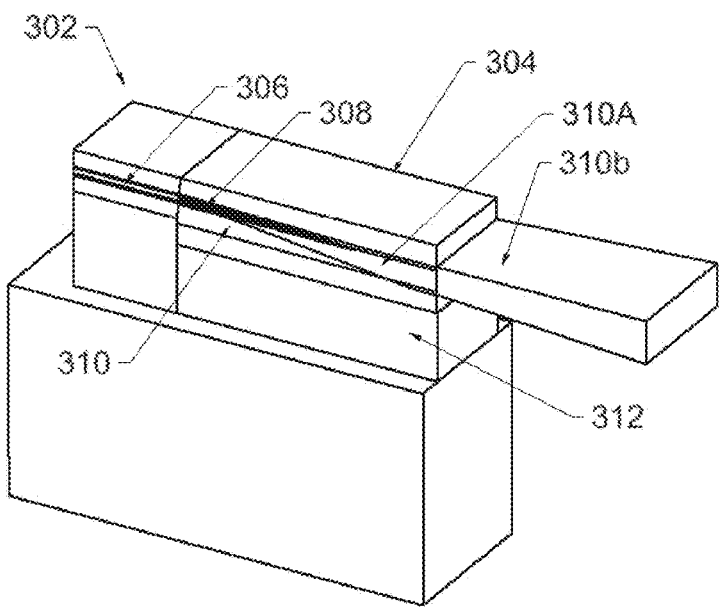
FIG. 3 illustrates a planar waveguide coupler design with an LED chip.

FIG. 3 is a rendering of a planar waveguide coupler 304 with an LED chip 302. FIG. 3 shows coupling from a lateral facet 306 of the LED proximate to and aligned with the core of the NA matched waveguide 308 of the coupler transformer portion. The coupler transformer portion couples and transforms the optical throughput into the macroscopic substrate 310 with a lower NA and a low angular far field emission formed by macroscopic waveguide elements. Light propagated in layer 308 undergoes a mode-sized expansion and expands into light 301A in substrate 310 and exits chip 302 as light 310b. As a result, light is more efficiently coupled from LED 302 out of waveguide 304.

Figure 4A:
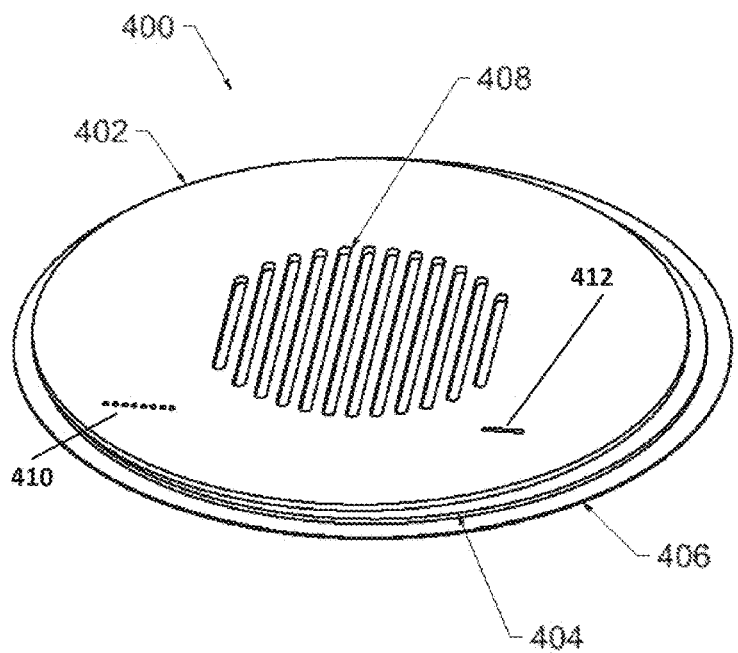

FIGS. 4A through 4F illustrate an apparatus 400 for providing a shadow mask 402 over a wafer 406. As shown in FIG. 4A, a shadow mask 402 with openings 408 can be mounted to a fixture 404 that itself is mounted to a wafer 406. Openings 408 in shadow mask 402 provide for masking that results in a tapered deposition as discussed above. As is further shown in FIG. 4A, ball positioning array of sockets 410 and slot 412 can be used to position and register mask 400 to wafer 404.

FIGS. 4B through 4F illustrate apparatus 400 in more detail. In particular, FIG. 4B illustrates shadow mask 402 with openings 408. Aligners 410 and 412, which may be balls or dents, can be used for alignment of shadow mask 402 with fixture 404. As discussed above, sockets 410 is a ball positioning array and slot 412 can receive a pin. FIG. 4C illustrates fixture 404. Fixture 404 has aligners a ball 414 and pin 416 to align with shadow mask 402 at socket 410 and slot 412, respectively, and a preload flex finger 420. Pin 416 can be a linear guide pin for guidance of mask 400 over wafer according to the position of ball 414 in sockets 410. FIG. 4D shows the combination of shadow mask 402 with fixture 404 and a wafer 406. FIG. 4E illustrates the assembled apparatus 400, including wafer 406. FIG. 4F illustrates a cross section of apparatus 400 as shown in FIG. 4E across the direction AA. In some embodiments, balls and detents are shown as a method of lateral displacement positioning of the mask over the substrate so as to provide lateral overlapping coating over lateral portions of the substrate in sequence.

Apparatus 400 can be of any convenient size. As a single example, which is only intended to be illustrative and is not intended to be limiting, openings 408 can be 5.0 mm wide and separated by 10.0 mm. Further, shadow mask 408 can have an outer diameter of 274.3 mm. Fixture 404 can have an inner diameter of 150.0 mm and an outer diameter of 279.4 mm. The lengths, number and spacing of slots 408 can be determined by the number of individual layers to be deposited.

The above discussion demonstrates how a physical taper can be formed in a layer. FIGS. 5A, 5B, and 5C illustrate a deposition chamber 500 for deposition of materials. FIG. 5A illustrates the top 502 of deposition chamber 500, which includes plate 508 into which multiple individual targets 504 are mounted. Targets 504-1, 504-2, 504-3, and 504-4 are illustrated but there may be any number of targets 504 mounted in plate 508. As illustrated in FIG. 5A, individual targets 504 may be appropriately shaped and spaced around plate 508 and each coupled to an individual power source 506 (power sources 506-1, 506-2, 506-3, and 506-4 are illustrated). Each of targets 504 may be chosen appropriately for deposition of different material layers, for example material layers of differing indices of refraction. In some embodiments of the present invention, multiple ones of targets 504 may be powered by the corresponding one or more power sources 506 during deposition. For example, two individual targets 504 can be powered by corresponding power supplies 506 during deposition in order to form an alloyed layer material.

FIG. 5B illustrates a rotating table 510 that is mounted opposite top 502 in deposition chamber 500. Table 510 can include mounts for multiple wafers 512, of which wafers 512-1, 512-2, 512-3, and 512-4 are illustrated. In some embodiments, each of the multiple wafers 512 may be coupled to a separate power source 514 to provide bias, however in the example illustrated in FIG. 5B a single power source 514 is illustrated. Wafers 512 are mounted on rotating table 510. Rotating table 510 is rotated at a particular rate during the deposition process.

FIG. 5C illustrates a cross section of deposition chamber 500 where one of sources 504 is aligned with one of wafers 512 for a deposition of material on wafer 512 when power supplies 506 and 514 are activated. Power sources 506 and 514 are chosen appropriately for the particular deposition process and, for example, can be pulsed-DC, DC, or RF sources. Rotational speed of table 510 along with the power applied by power supplies 506 and 514 can be set accordingly for a particular deposition of materials, which can result in an alloyed layer of materials as discussed further below. Bias power supply 514 can be used as an etch bias plasma to densify and mix deposition materials from multiple targets 504 to create the deposited alloyed material, which may be amorphous materials.

Figure 5D:
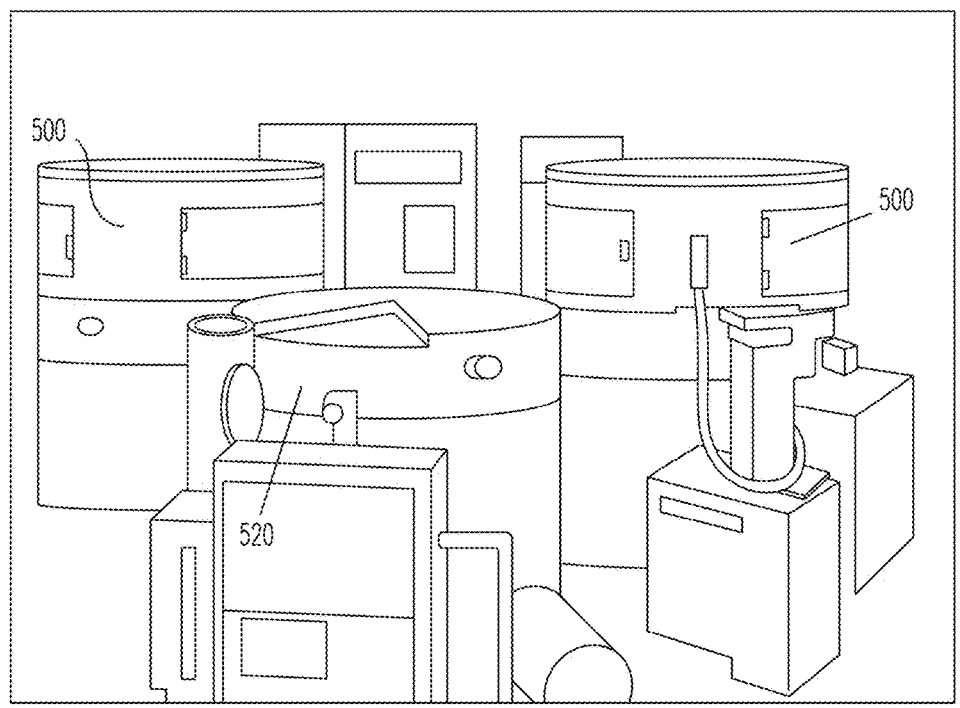
FIG. 5D shows a Tango Systems AXcela PVD sputter system that operates as illustrated in FIGS. 5A-5C.
Figure 5E:
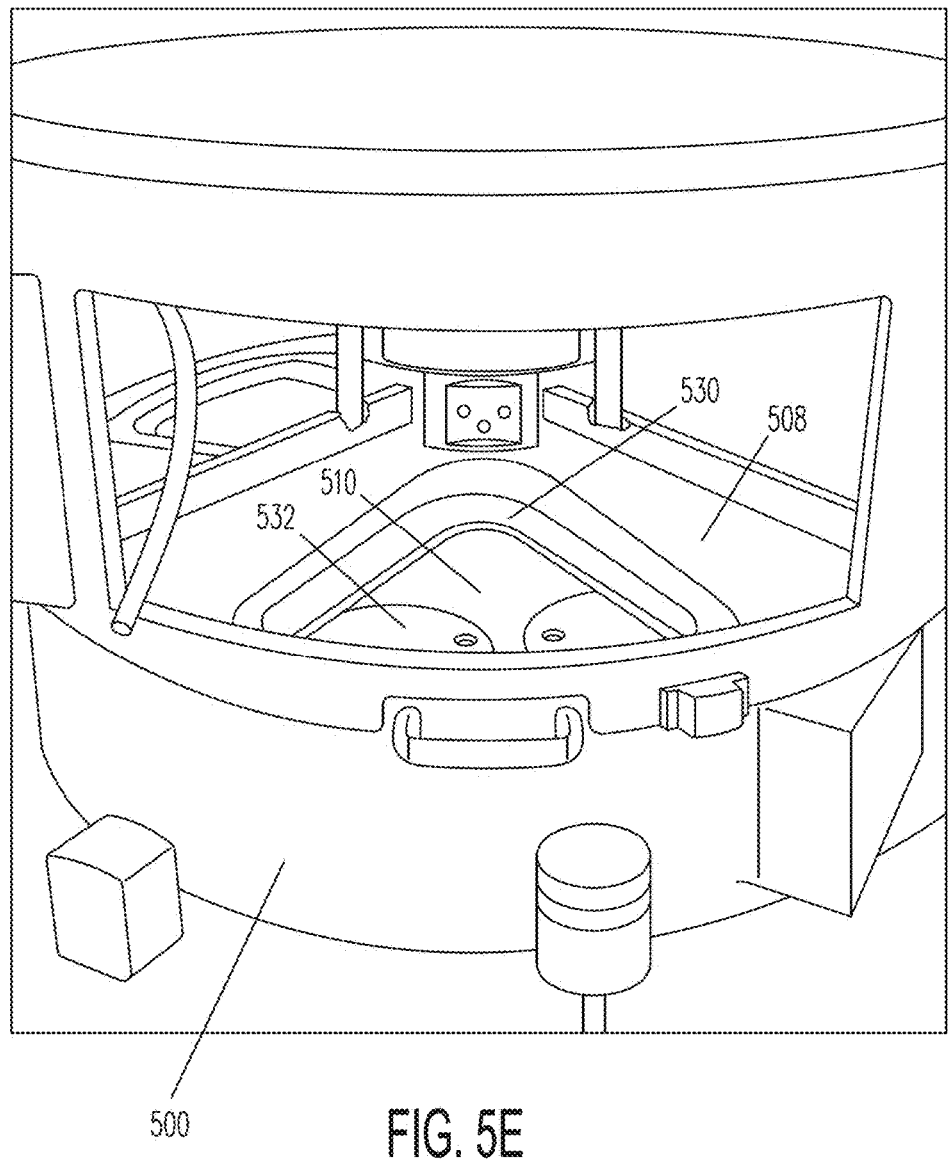
FIG. 5E shows a process chamber for the system illustrated in FIG. 5D.

FIG. 5D, shows the Tango Systems AXcela PVD sputter system 500 with soft clean chamber 520 and two process chambers 500 on either side. Process chambers 500 are described above with respect to FIGS. 5A-5C. FIG. 5E shows a process chamber 500 of the system illustrated in FIG. 5D. As shown in chamber 500 illustrated in FIG. 5E, plate 508 includes openings 530 into which targets 504 are inserted. As shown in FIG. 5E, targets 504 can be described as a triangular "delta" sputter source targets, which for purposes of illustration are removed from plate 508 in FIG. 5E. Through opening 530, rotatable table 510 is illustrated along with mounts 532 on which wafers 512 are positioned. Table 510 can be described as a 'wrap around inline' rotation table. Deposition of material layers from each of the sputter source targets 504 can be made uniform across each of wafers 512. Operation of two or more of sputter source targets 504 simultaneously can provide a film of uniform composition through the film thickness and across each of wafers 512. Variation of deposition parameters such as power in each of sputter source targets 504 can provide variation of material properties such as index of refraction through the thickness. The vertical composition can be changed uniformly provided that the change in deposition parameters is slower than the mixing of layers from source targets 504.

Figure 5F:
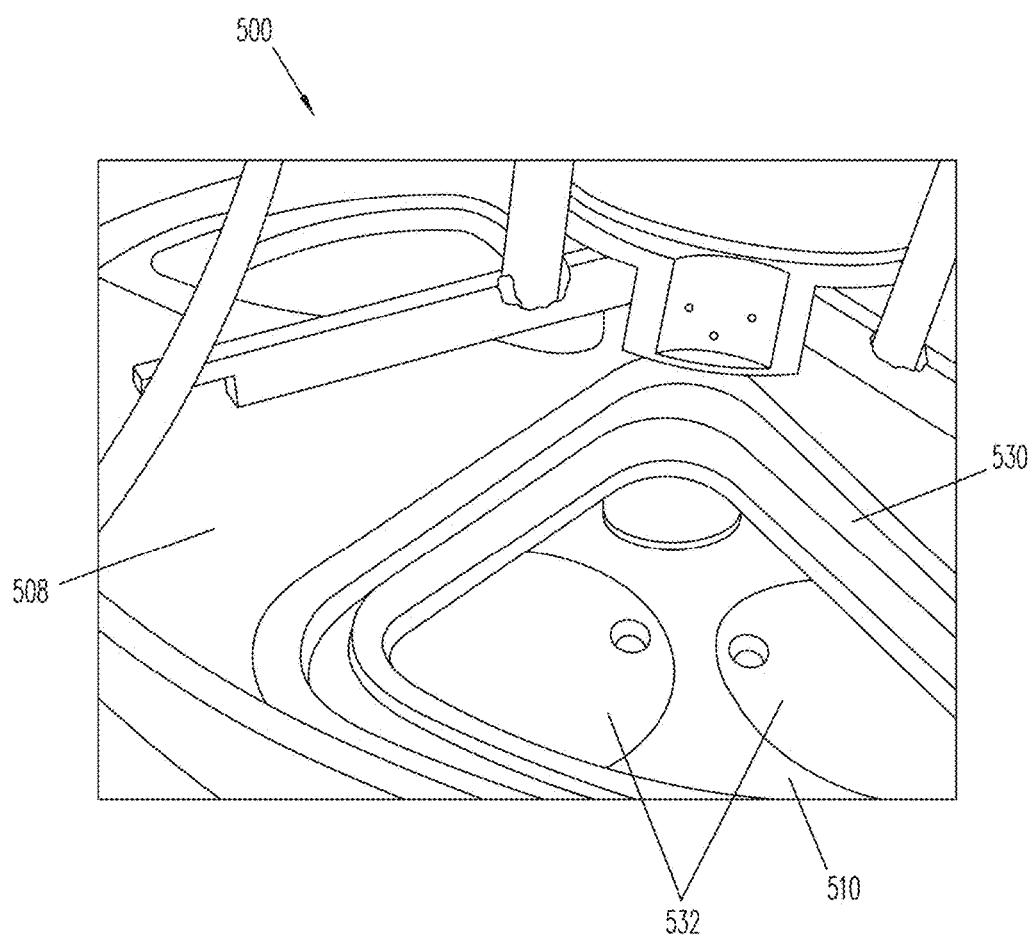
FIG. 5F shows two sequential substrate positions on the rotating table, underneath the sputter target position, in the process chamber illustrated in FIG. 5D.

FIG. 5F illustrates two sequential substrate positions of mounts 532 on rotating table 510 underneath opening 530 where sputter target 504 is positioned in process chamber 500. A wafer 512 positioned on mounts 532 can be rotated under sputter target 504 as part of a sequential depositions of material.

Figure 5G:
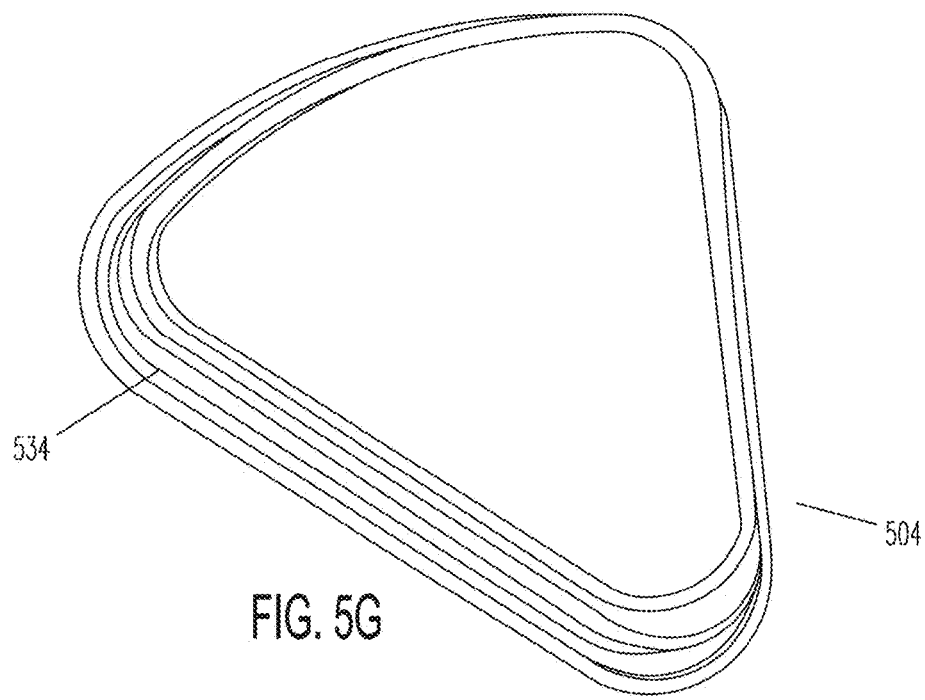
FIG. 5G shows the triangular 'Delta' sputter source with metallic target, removed and facing up, that can be used in the system illustrated in FIG. 5D.

FIG. 5G shows the triangular 'Delta' sputter source target 504. As illustrated, target 504 includes a metallic target material 536 mounted on a backing 534. Target 504 is shaped to be mounted into opening 530 with target material 536 facing towards table 510.

Figure 5H:
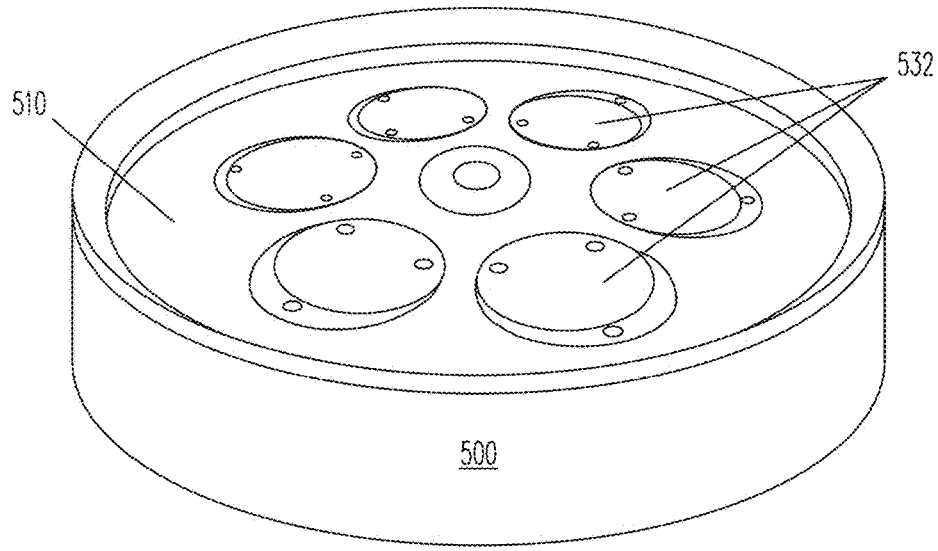
FIG. 5H shows the rotating table in a process chamber as illustrated in FIG. 5D.
Figure 51:
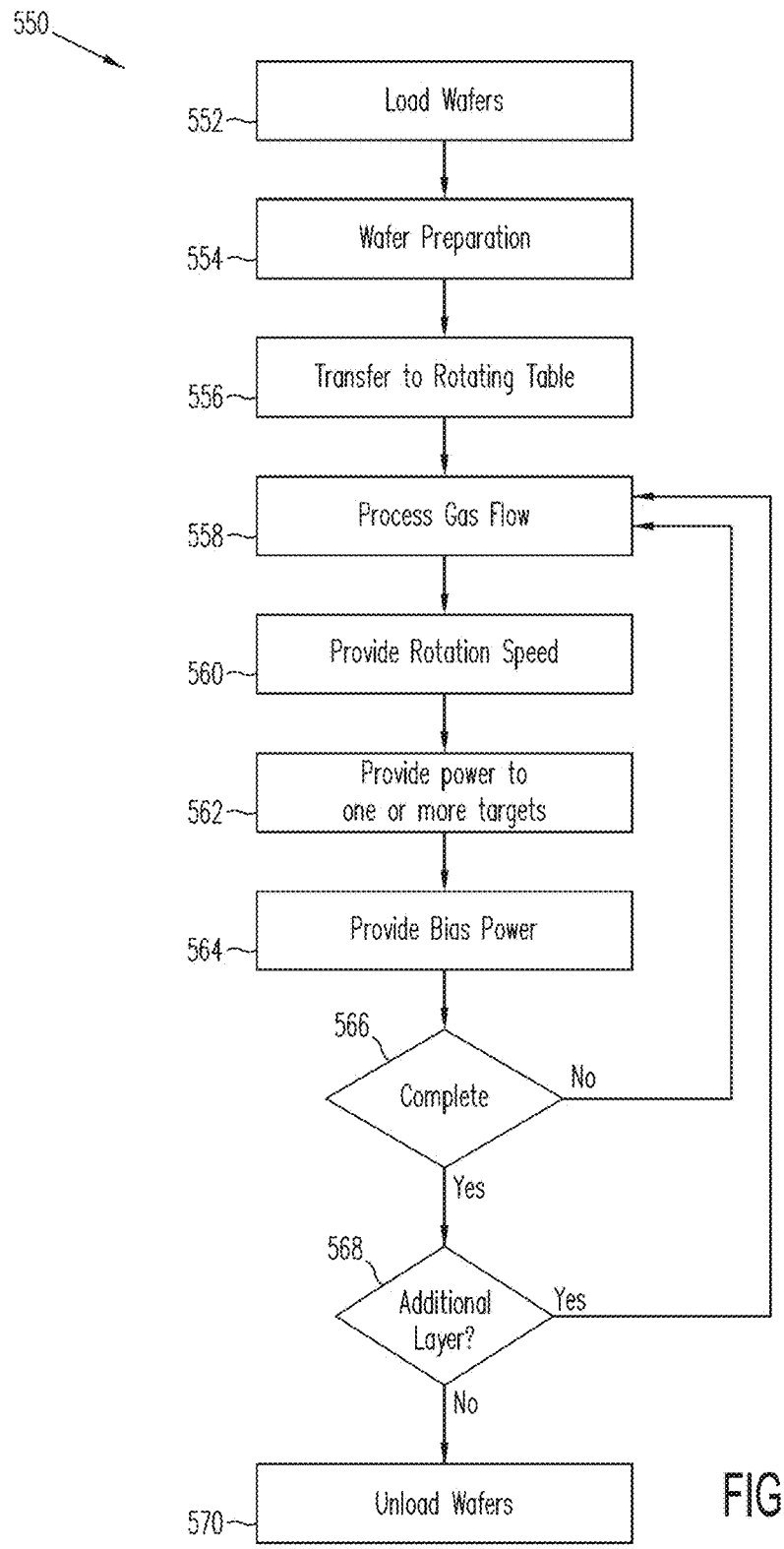

FIG. 5H shows rotating table 510 in process chamber 500. As illustrated, mounts 532 are positioned around table 510 so that wafers on mounts 532 can be rotated under targets 504.

FIG. 5I illustrates a process 550 for depositing alloyed materials according to some embodiments of the present invention. As shown in FIG. 5I, wafers are loaded into cleaning chamber 520. Cleaning chamber 520 is in vacuum and provides an etch step to clean the surface of the wafers in wafer preparation step 554. Wafers are transferred to rotating table 510 in step 556. Wafers 512 are positioned on mounts 532 on rotating table 510. Deposition chamber 500 is already evacuated and, in step 558, process gas is flowed for the deposition. In step 560, a particular rotation speed is set. In step 562, one or more of targets 504 is powered to provide deposition material. In step 564, a bias power is set and applied to wafers 512. In step 566, a determination of whether the material layer is deposited as desired is made. If not, then process 550 returns to process gas flow step 558. During deposition, process gas flow, rotational speed, target power, and bias power may be varied stepwise or continuously to alter the material composition and/or thickness. of the material layer. If, in step 566, the material layer is determined to have been completely deposited, in step 568 it is determined if an additional material layer is to be deposited. If so, process 550 returns to step 558. In a second material layer, different targets 504, powers, gas flows, rotational speeds, and deposition parameters may be adjusted as is suitable. Any number of material layers may be deposited. If all of the material layers have been deposited, then process 550 proceeds to step 570 where wafers 512 are unloaded from the deposition system 500.

According to some embodiments, a plurality of film layers can be deposited according to process 550 that corresponds to a planar waveguide structure. These layers can be deposited continuously or in a step index fashion forming a lower index layer upon a higher index layer. With a lower index substrate two composite films can be deposited as either a step index or graded index composite films forming with the substrate a wave guide structure. The contrast ratio of the high and low layers deposited from a plurality of sputter sources determines the associated numerical aperture, the average index and also the associated bound mode volume can be selected by rule of mixture of transparent oxides as composite layers along with the thickness of the composite wave guide layers so as to provide a wave guiding structure in the plane of the substrate.

The thickness of a film, or film portion, deposited according to process 550 can include contributions from a plurality of sources that are co-sputtered and may be proportional to the sputter power applied to each individual target 504 and inversely proportional to the relative rotation speed between target 504 and substrate wafer 512. A film with a plurality of film layers will be formed if substrate bias is not applied. With higher rotational speed or lower sputter power, layers formed in sequence as the substrate passes under each of the sputter targets in sequence will form a thinner layered composite film. If the layer thickness provided is less than about a quarter wavelength thickness of light in the film, the light will be governed by an average effective index. If the films are deposited with a substrate bias, the layers will be mixed and densified by the bias ion current. If the film layers from the discrete sputter sources target 504 are less in thickness than the bias effected zone, often taken as about three to ten monolayers, they will be mixed and densified and form a continuous alloy with a composite composition.

A rotary inline sputter system 500 as discussed above with a plurality of substrate wafers 512 and a plurality of sputter source targets 504 with target material or materials utilized for co-sputtering can form films or layers of uniform composite composition from multiple sources having the properties of a portion of a wave guide. A material layer can be deposited as a step film of constant composite composition and properties or a film having a graded or continuously changing thickness and index of refraction through thickness by variation of the power applied to the sputter source targets 504 which have a uniform film thickness over the substrate wafer 512. A rotary inline system 500 provides continuous deposition from one or more target materials on all substrates at preselected and varied rates of deposition by process 550 so as to form a continuous film having a constant or continuously varying composition and index. By deposition of less than a monolayer or by deposition of less than the thickness which is mixed by forward scattering into the film by the bias ion current (power supply 516) and the coupled ion current impinging on the accumulating film, a dense transparent film can be formed. Such a film or layer composition is continuous or layered depending on the power applied to one or more of the sputter sources.

Films were deposited on 300 mm wafers with the 300 mm Axcela Magnetron three cathode rotary inline sputter system at Tango Systems, 2363 Bering Drive, San Jose, Calif. using a process such as that illustrated by process 550. Substrates to be coated were placed in the vacuum chamber 500 and a vacuum was attained of better than E-7 Torr. Oxide films were deposited using biased pulsed DC reactive sputtering (i.e. Power Supplies 506 are pulsed DC and power supply 514 is an RF supply) with the Axcela, rotary inline sputter system 500. Metallic targets 504 included one each of Titanium, Aluminum, Hafnium and Silicon target materials. The metallic targets 504 were sputtered at 3 kW Pulsed DC power with a pulse return time of 2.6 us and a pulse frequency of 150 KHz. The bias power was applied through a matching network to convey the power to the back side of the substrate wafer 512 and showed less than 5 Volts reflected power. The applied bias power was 400 W at 13.56 MHz. Rotation of table 510 was set at 10 rpm. The time of deposition was 1500 sec or 25 minutes for all except Run #3, which was 1200 sec. The number of passes under one or more source targets 504 for the nominal 300 Ang film in 25 minutes was 250 passes with a net thickness of 1.2 Ang per pass which is essentially half a monolayer, assuring complete mixing of the material due to the bias and elimination of deflects such as single point vacancies on a sub atomic scale. The duel sputtered films, deposited at essentially half the rate of the pure films were mixed twice as well with the substrate passing under both source targets 504 on each rotation for about a quarter of a monolayer deposition and mixing. The ratio of Argon to O2 in SCCM of process gas was between 15/25 to 20/40. Run #4 was performed at a ratio of 10/30. The oxide thickness was measured by an lab optical thickness tool initially and is approximate. The index of refraction for several films is illustrated in FIGS. 12A through 12D.

| RUN | Material | Refractive index at 450 nm | Extinction coefficient at 450 nm | Thickness (nm) |
|---|---|---|---|---|
| 1 | TiOx | 2.86 | $<1.0 \times 10^{-5}$ | 44 |
| 2 | HfOx | 1.67 | $<1.0 \times 10^{-5}$ | 70 |
| 3 | AlOx | 1.63 | $\sim1.0 \times 10^{-5}$ | 54 |
| 4 | TiHfOx | 1.91 | $<1.0 \times 10^{-5}$ | 115 |

FIGS. 12 A, 12B, 12C, and 12D show the ellipsometer data for the optical index and extinction values for films made according to some embodiments of the present invention. FIG. 12A illustrates the index of refraction for a film of $TiO_x$ for wavelengths of light from 1 micron to 0.3 microns and shows a k value below detection near 350 nm, which is about E-5 indicating very high transparency.

Figure 12A:
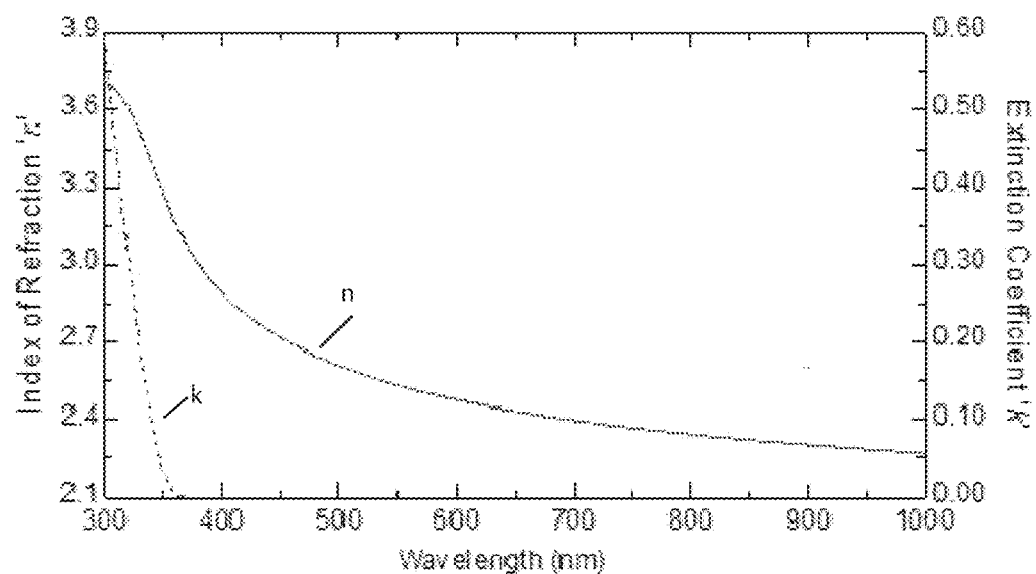
FIGS. 12 A through 12D show the ellipsometer data for the optical index and extinction values for films made according to aspects of the present invention.
FIG. 12E shows a scanning electron microscope image of a cross section of a titanium dioxide coating on a substrate with an amorphous phase or layer portion and a crystalline layer portion.
FIG. 12F shows n and k data for two films of titanium dioxide deposited according some embodiments of the present invention.
FIG. 12G shows ellipsometry data n and k for two amorphous alloy films deposited according to some embodiments of the present invention.
FIG. 12H shows the increase in index for a $HfO_2$ film sputter deposited with bias compared to the same film deposited without RF bias.
FIG. 12I shows the range of index for four films: $TiO_2$, an alloy of $TiO_2$ and $HfO_2$; HfO2; and $Al_2O_3$, each deposited according to embodiments of the present invention.
FIG. 12J shows the extinction value for three films according to embodiments of the present invention.
FIG. 12K shows the index of refraction of $TiO_2$ films alloyed with $HfO_2$ over a range of sputter power according to some embodiments of the present invention.
FIG. 12L shows the index of a range of $TiO_2$ films alloyed with HfO2 over a range of sputter power according to some embodiments of the present invention.
Figure 12B:
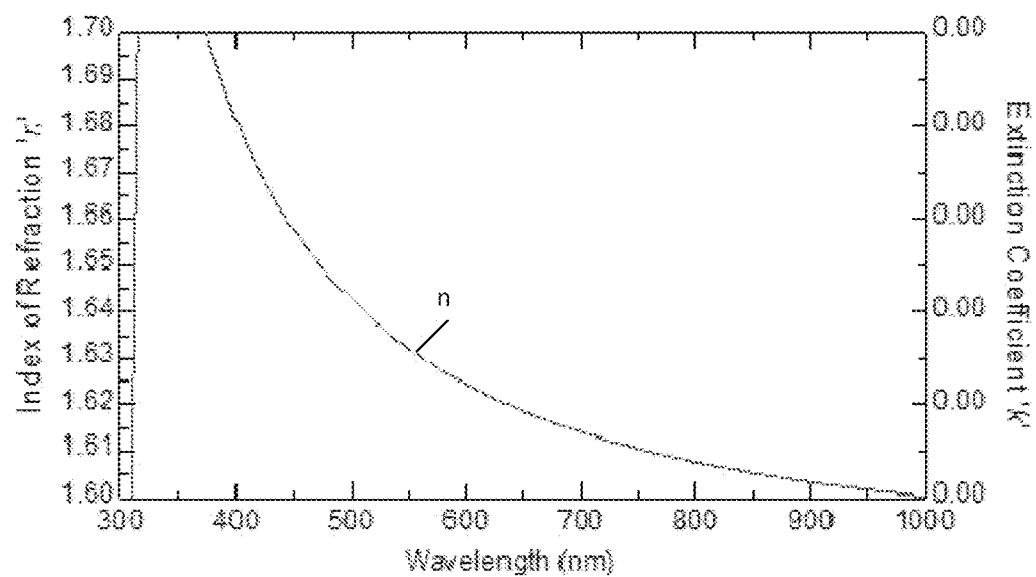
Figure 12C:
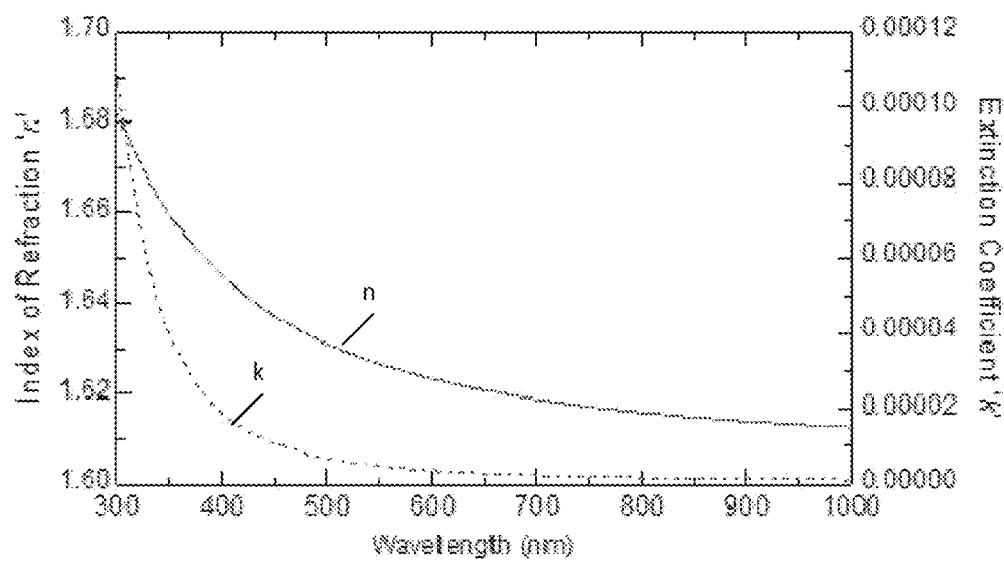
Figure 12D:
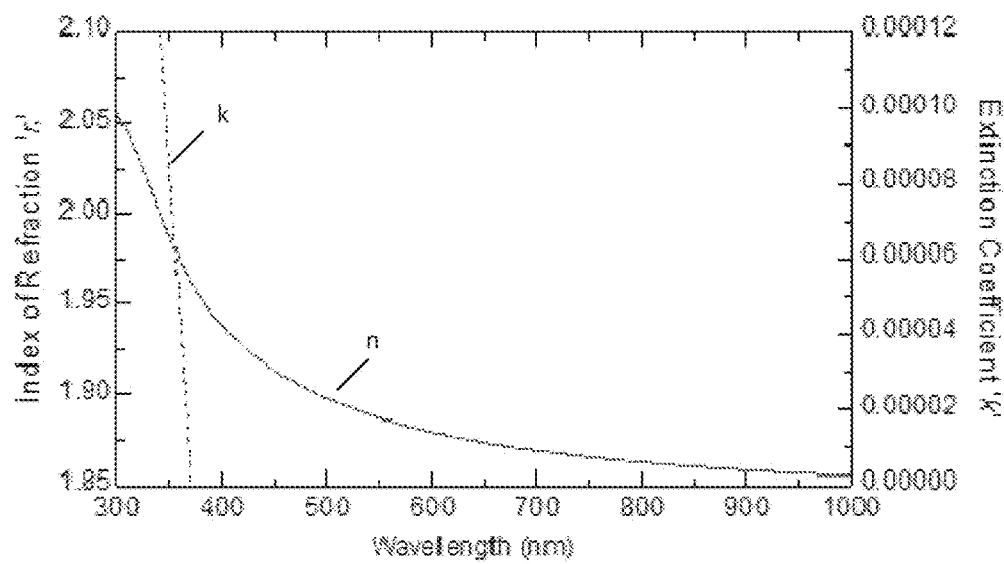

FIG. 12B is for hafnium oxide for the same range with undetectable k value throughout. FIG. 12C is for aluminum oxide showing a k value from below 2E-5 to less than 1.2E-4. FIG. 12D is for a mixture of titanium oxide and hafnium oxide sputter deposited as a uniform amorphous alloy as described in the present invention.

Figure 36:
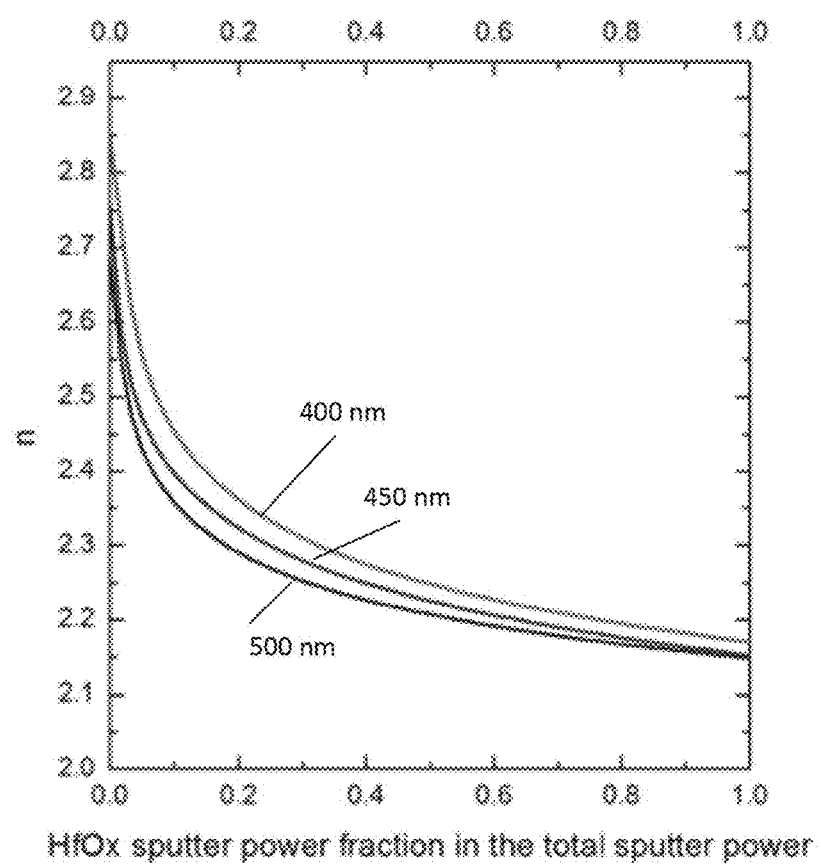
FIG. 36 illustrates a graph of and fit index as a function of the power ratio of $TiO_2$ and $HfO_2$ deposited according to embodiments of the present invention.

In Run #4, two source targets 504 were run simultaneously at 3 kW each. The total thickness of run #4 is the sum of runs #1 and #2, that is 115 vs. 114, better than 1%. However a rule of mixture from thickness of the film thickness, ~38.6% $TiO_2$ and 61.4% $HfO_2$ gives a total weighted index of 2.12 from the two measured index values at 450 nm, higher than the measured index of the mixture of 1.91 measured. An index below the rule of mixture is well known and can be referred to as "parabolic" but an actual shape for the trend of alloy index for a mixed oxide must be measured in application. But it is clear that a mixture of the two oxides provided by selection of a suitable power ratio can be achieved with the compounding of the high index amorphous $TiO_2$ oxide fraction for the 450 nm LED MQW planar waveguide coupler core and cladding layers of approximately n=2.4 for p and n GaN and n=2.6 for the Indium doped GaN light emitting region. Measured and fit index as a function of the power ratio of $TiO_2$ and $HfO_2$ is shown in FIG. 36 for three wavelengths, 400 nm, 450 nm and 500 nm, which are illustrated from top to bottom in FIG. 36.

Film deposition for a waveguide coupler transformer for use at 450 nm with an LED or Laser diode is shown in the following table using process 550 according to some embodiments of the present invention. The waveguide coupler has a fast output angle of ~about 40 degree, an NA of about 0.624884 and an average index of about 2.59. The coupler also exhibits transformation and out coupling to an optical fiber or free space with an NA of about 0.12, Deposition is carried out using the measured and fit tabular index data shown graphically in FIG. 36 for constant power deposition of the $TiO_2$ at 4 kW pulsed DC power as indicated in the table below.

| Film deposition example at 4 kW TiOx/HfOx | | | | |
|---|---|---|---|---|
| HfO2/TiO2 Power ratio | index at 450 nm | NA | HfO2 Watts | half angle |
| 0 | 2.7544 | 0.932581 | 0 | 68.84074 |
| 0.01695 | 2.59172 | 0.624884 | 67.8 | 38.67365 |
| 0.0339 | 2.51526 | 0.470409 | 135.6 | 28.06087 |
| 0.05085 | 2.47088 | 0.392229 | 203.4 | 23.09328 |
| 0.0678 | 2.43955 | 0.342907 | 271.2 | 20.05408 |
| 0.08475 | 2.41533 | 0.30809 | 339 | 17.94418 |
| 0.10169 | 2.3956 | 0.281951 | 406.76 | 16.37667 |
| 0.11864 | 2.37895 | 0.261174 | 474.56 | 15.13973 |
| 0.13559 | 2.36457 | 0.244454 | 542.36 | 14.14956 |
| 0.15254 | 2.3519 | 0.230475 | 610.16 | 13.32506 |
| 0.16949 | 2.34058 | 0.218488 | 677.96 | 12.62024 |
| 0.18644 | 2.33036 | 0.208209 | 745.76 | 12.01742 |
| 0.20339 | 2.32104 | 0.199156 | 813.56 | 11.48758 |
| 0.22034 | 2.31248 | 0.191225 | 881.36 | 11.02428 |
| 0.23729 | 2.30456 | 0.18416 | 949.16 | 10.61216 |
| 0.25424 | 2.29719 | 0.177657 | 1016.96 | 10.23331 |
| 0.27119 | 2.29031 | 0.171898 | 1084.76 | 9.898217 |
| 0.28814 | 2.28385 | 0.166674 | 1152.56 | 9.594491 |
| 0.30508 | 2.27776 | 0.161744 | 1220.32 | 9.308149 |
| 0.32203 | 2.27201 | 0.157274 | 1288.12 | 9.048722 |
| 0.33898 | 2.26656 | 0.153297 | 1355.92 | 8.818039 |
| 0.35593 | 2.26137 | 0.149241 | 1423.72 | 8.58293 |
| 0.37288 | 2.25644 | 0.145872 | 1491.52 | 8.387753 |
| 0.38983 | 2.25172 | 0.142444 | 1559.32 | 8.189271 |
| 0.40678 | 2.24721 | 0.139435 | 1627.12 | 8.015147 |
| 0.42373 | 2.24288 | 0.136377 | 1694.92 | 7.838252 |
| 0.44068 | 2.23873 | 0.133768 | 1762.72 | 7.687377 |
| 0.45763 | 2.23473 | 0.131121 | 1830.52 | 7.534349 |
| 0.47458 | 2.23088 | 0.128605 | 1898.32 | 7.389015 |
| 0.49153 | 2.22717 | 0.126229 | 1966.12 | 7.251725 |
| 0.50847 | 2.22359 | 0.124176 | 2033.88 | 7.133172 |
| 0.52542 | 2.22012 | 0.121916 | 2101.68 | 7.00271 |
| 0.54237 | 2.21677 | 0.119994 | 2169.48 | 6.891728 |
| 0.55932 | 2.21352 | 0.118048 | 2237.28 | 6.779442 |
| 0.57627 | 2.21037 | 0.116077 | 2305.08 | 6.66577 |
| 0.59322 | 2.20732 | 0.114467 | 2372.88 | 6.572875 |
| 0.61017 | 2.20435 | 0.11284 | 2440.68 | 6.479036 |
| 0.62712 | 2.20146 | 0.111195 | 2508.48 | 6.384202 |
| 0.64407 | 2.19865 | 0.109732 | 2576.28 | 6.299862 |
| 0.66102 | 2.19591 | 0.108052 | 2644.08 | 6.203016 |
| 0.67797 | 2.19325 | 0.106762 | 2711.88 | 6.128697 |
| 0.69492 | 2.19065 | 0.105253 | 2779.68 | 6.041769 |
| 0.71186 | 2.18812 | 0.104149 | 2847.44 | 5.978114 |
| 0.72881 | 2.18564 | 0.102611 | 2915.24 | 5.889532 |
| 0.74576 | 2.18323 | 0.1017 | 2983.04 | 5.837073 |
| 0.76271 | 2.18086 | 0.100351 | 3050.84 | 5.759358 |
| 0.77966 | 2.17855 | 0.098987 | 3118.64 | 5.680836 |
| 0.79661 | 2.1763 | 0.098053 | 3186.44 | 5.627056 |
| 0.81356 | 2.17409 | 0.097113 | 3254.24 | 5.572921 |
| 0.83051 | 2.17192 | 0.09594 | 3322.04 | 5.505414 |
| 0.84746 | 2.1698 | 0.094984 | 3389.84 | 5.450424 |
| 0.86441 | 2.16772 | 0.093791 | 3457.64 | 5.38176 |
| 0.88136 | 2.16569 | 0.093052 | 3525.44 | 5.339237 |
| 0.89831 | 2.16369 | 0.092075 | 3593.24 | 5.282997 |
| 0.91525 | 2.16173 | 0.09109 | 3661 | 5.226307 |
| 0.9322 | 2.15981 | 0.090336 | 3728.8 | 5.182911 |
| 0.94915 | 2.15792 | 0.089336 | 3796.6 | 5.125396 |
| 0.9661 | 2.15607 | 0.088814 | 3864.4 | 5.095362 |

Figure 12E:
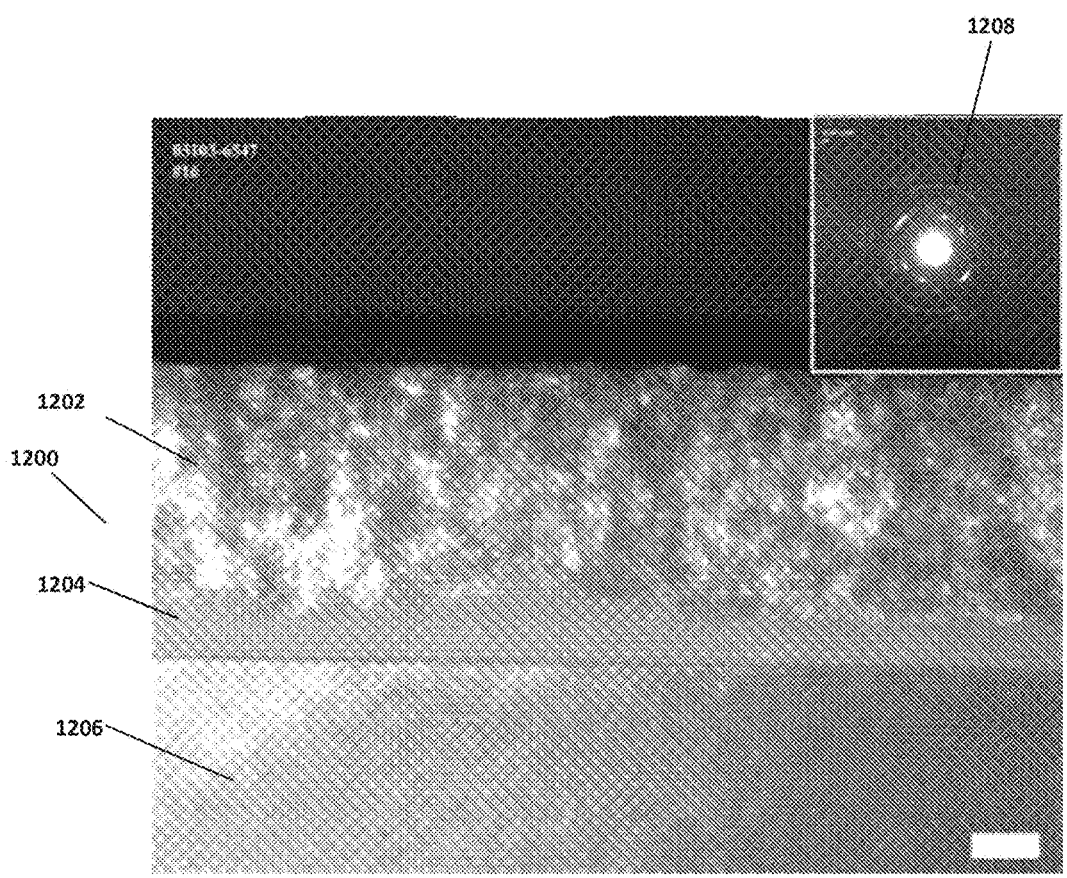

FIG. 12E is a scanning electron microscope image of a cross section of a titanium dioxide ($TiO_2$) coating 1200 on a substrate 1206 containing an amorphous phase or layer portion 1204 and a crystalline layer portion 1202. The material in FIG. 12E is a biased pulsed-DC deposited $TiO_2$ at similar powers as described above. Amorphous portion 1204 is clearly seen between substrate 1206 and crystalline layer 1202 as a smooth gray layer with a sharp lower interface and a diffuse upper interface having variable thickness shading into the crystalline layer 1202. The crystalline phase 1202 was induced by increasing the deposition temperature and formed during deposition without crystallization of the amorphous layer 1204 deposited prior to heating by the heat of deposition. The inset 1208 shows a selected area diffraction in which the center disk region indicates the presence of amorphous phase 1204, and stress elongated point group patterns appear as outer spots arranged on rings associated with the crystalline phase 1202. Substrate temperature control below about 150-180 deg. C. maintains deposition of the amorphous phase 1204 with demonstrated optical transparency. Pure $TiO_2$, will provide the maximum acceptance angle and solid angle for edge emission or in coupling as a layer on a plate of lower index dielectric, such as glass. The high index film maximizes the solid angle acceptance of the surface of the coated plate or glass, providing maximum collection of diffuse light which is transported to the edge of the structure.

Figure 12F:
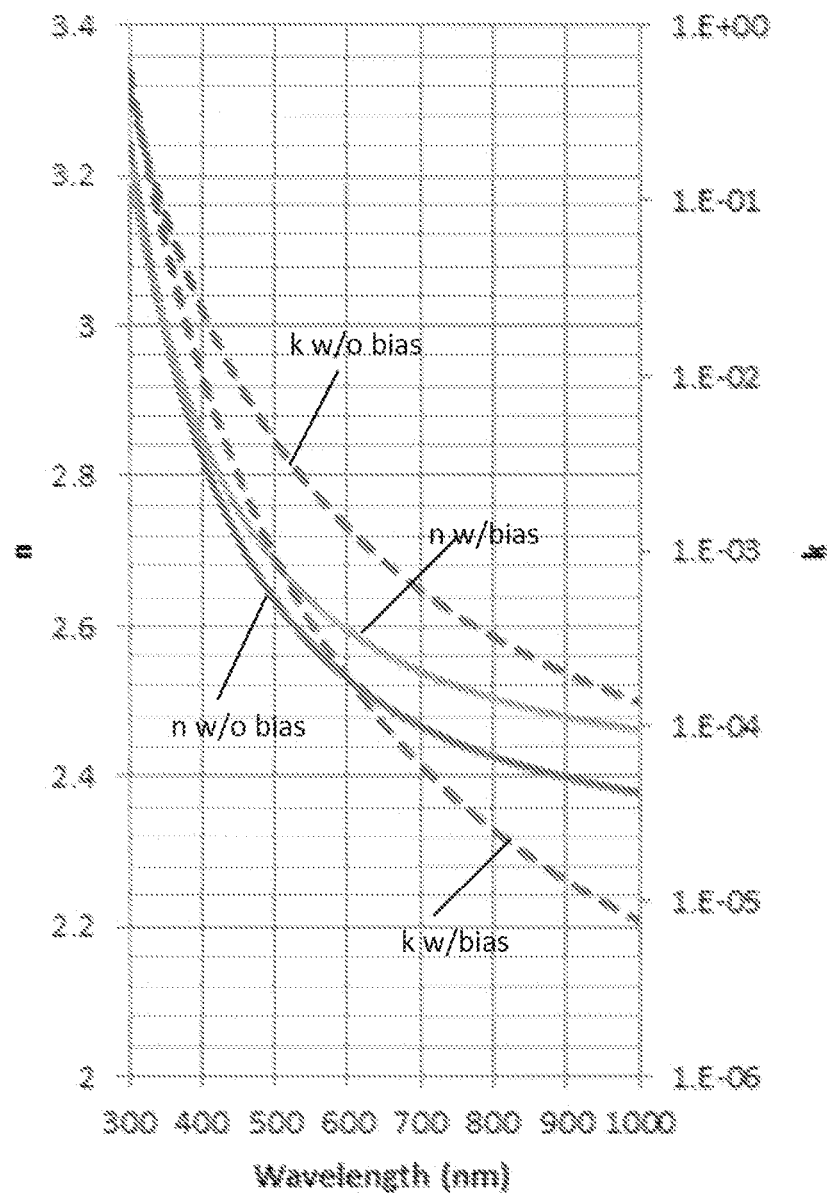

FIG. 12F shows n and k data for two films of titanium dioxide deposited at 4 kW pulsed DC power from a metal target by reactive deposition according to some embodiments of the present invention. TiO2 films were sputtered at 3 kW Pulsed DC power at a rotational rate of 10 rpm on 300 mm borosilicate wafers with and without 500 W of 13.56 MHz RF bias. The ellipsometer data in FIG. 12F shows the effect of the RF bias which increases the index over the visible range, due in part to the formation of a higher density film which is in turn due to the ion bombardment effect of the RF bias. In addition the RF bias decreases the k or extinction value of the film, making it suitable for low loss waveguide fabrication. The decrease in the k value is due in part to the elimination of the columnar structure familiar to thin refractory films. The application of RF bias in the amount of 500 W can be seen to have raised the index and lowered the k value of the amorphous films across the measured range, providing a high index film with very low k value. This represents the film material that is utilized to achieve mixtures with other oxides as demonstrated here with different and varying n values and low k values.

Figure 12G:
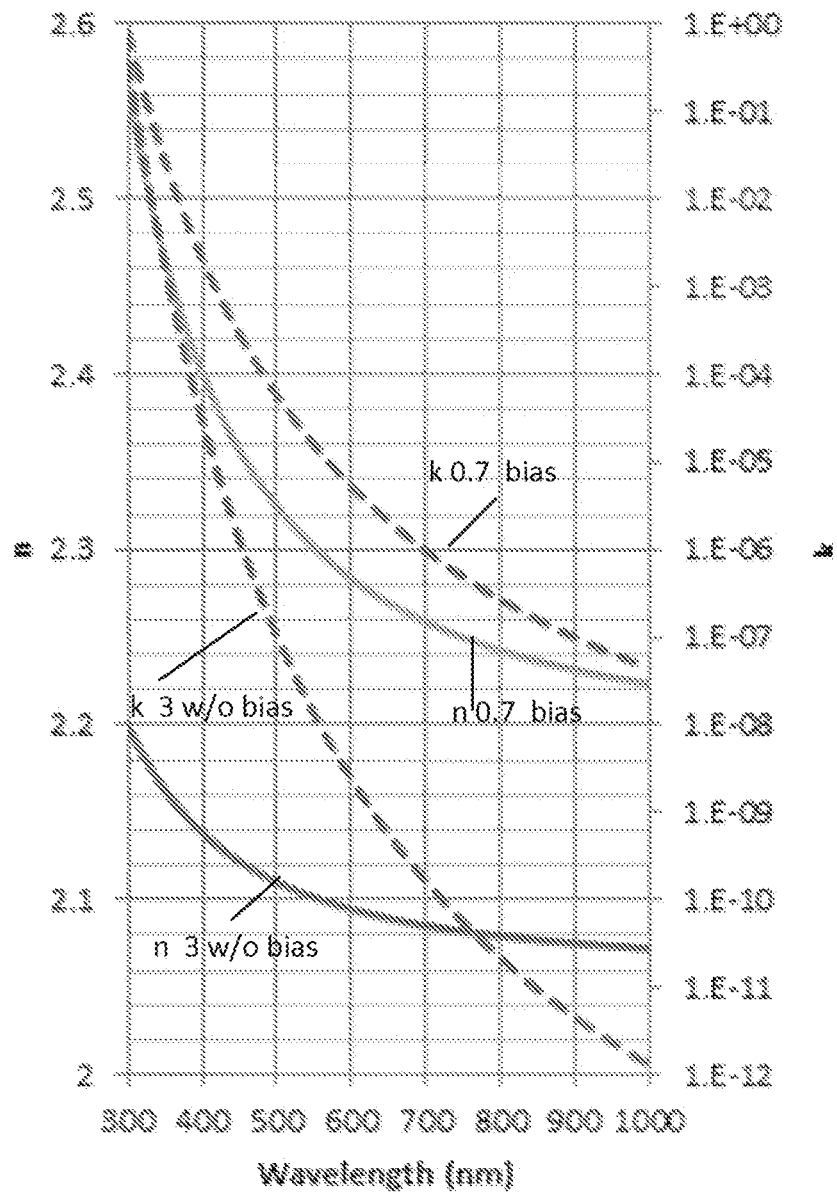

FIG. 12G shows ellipsometry data n and k, for two amorphous alloy films of $TiHfO_x$ deposited with 500 W substrate bias at 13.56 MHz and compounds of Titanium oxide and Hafnium oxide according to some embodiments of the present invention. Each film has a different pulsed DC sputter power in kW as shown. The $TiO_2$ portion of the films was deposited at 4 kW. The film with the portion of $HfO_2$ deposited at 0.7 kW has a higher index than the film with HfO2 deposited at 3 kW by an index difference, dn~0.2 in the visible, showing a wide range of high index by mixture, between the index of the two pure compounded films. The film with the higher power portion of HfO2 has a lower k value, showing the very large decrease in extinction available with increasing addition of the Hafnium oxide.

Figure 12H:
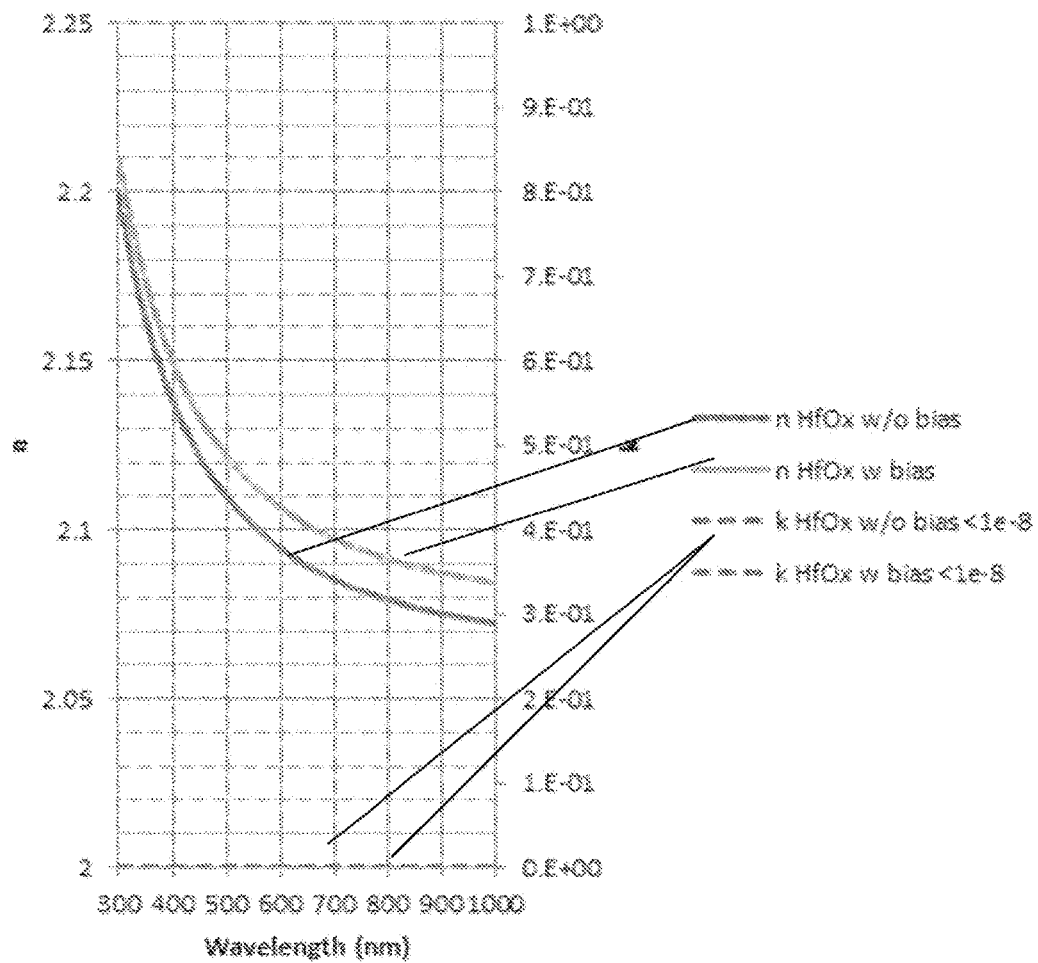

FIG. 12H shows ellipsometry data n and k for films of $HfO_x$ and shows the increase in index for a $HfO_x$ film sputter deposited with 500 W RF bias compared to the same film deposited without RF bias. Both films have k values below detection over the measured range.

Figure 12I:
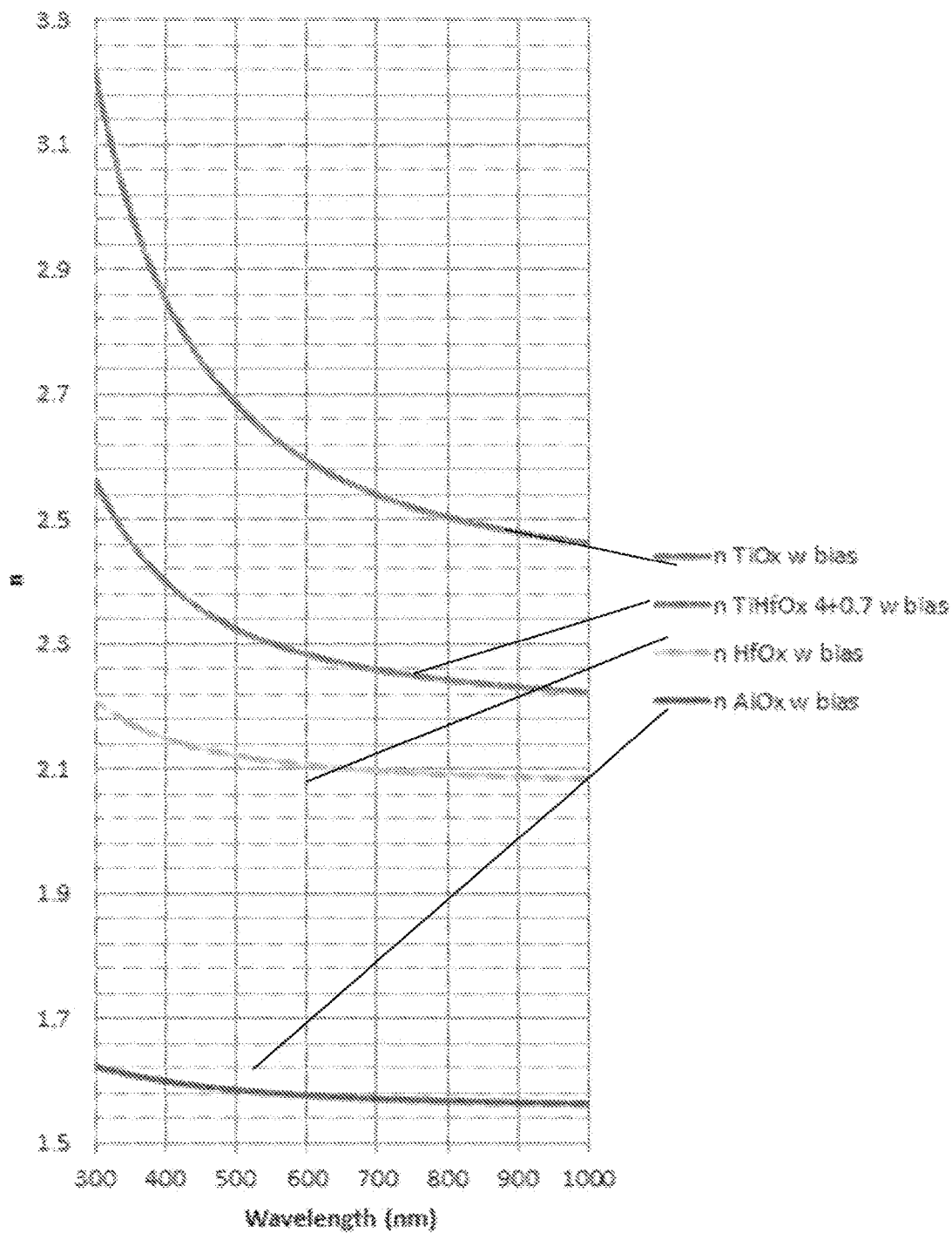

FIG. 12I shows ellipsometry data indicating the range of index for four films: $TiO_2$, an alloy of $TiO_2$ and $HfO_2$; $HfO_2$; and $Al_2O_3$, each deposited according to embodiments of the present invention. These films are available to form transparent alloyed optical films alloys from the lowest index to the highest index of the pure films as well as forming transparent films and devices continuously graded through thickness as well as including a laterally graded index.

Figure 12J:
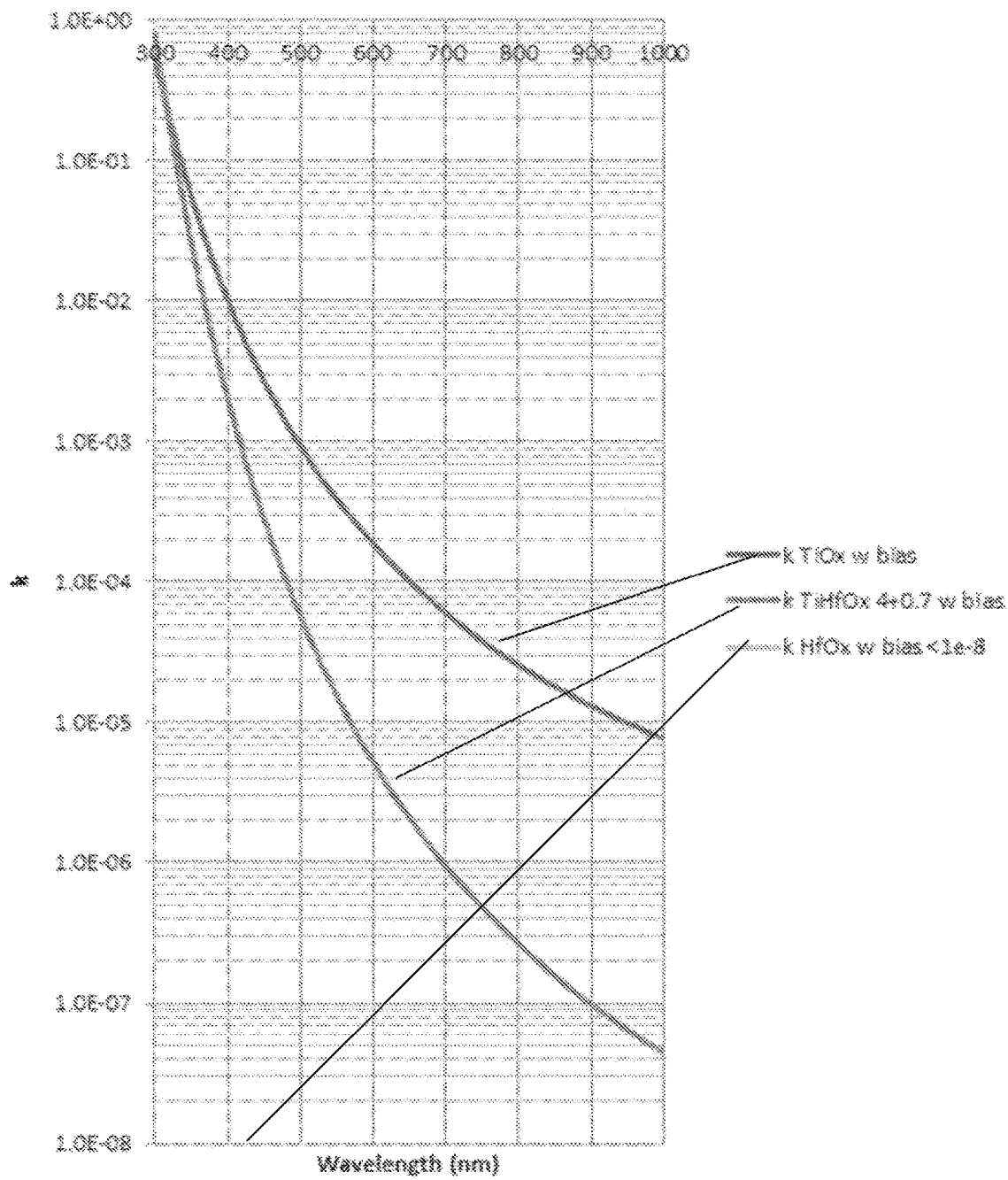

FIG. 12J shows the extinction value for three films according to embodiments of the present invention. These films may be utilized to provide transparent, low absorption layers and devices over the range shown and by extrapolation in the infrared and UV. Note that the pure $HfO_2$ value is below E-8 across the range.

Figure 12K:
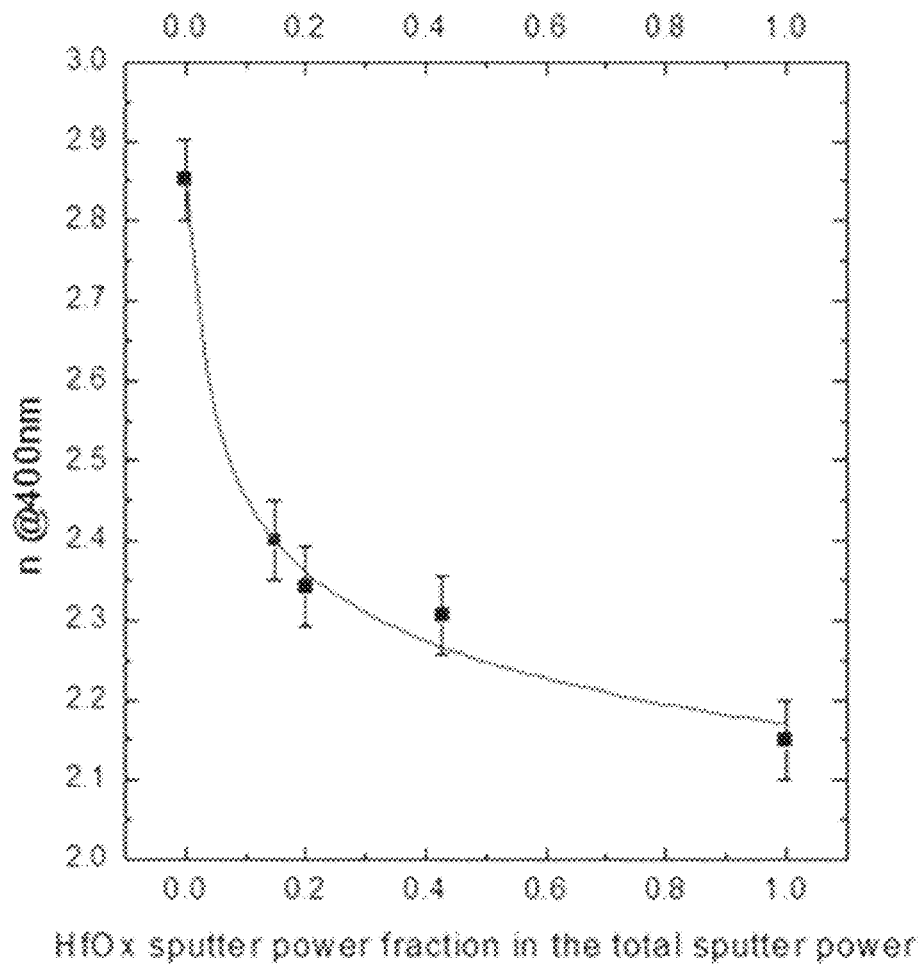
Figure 12L:
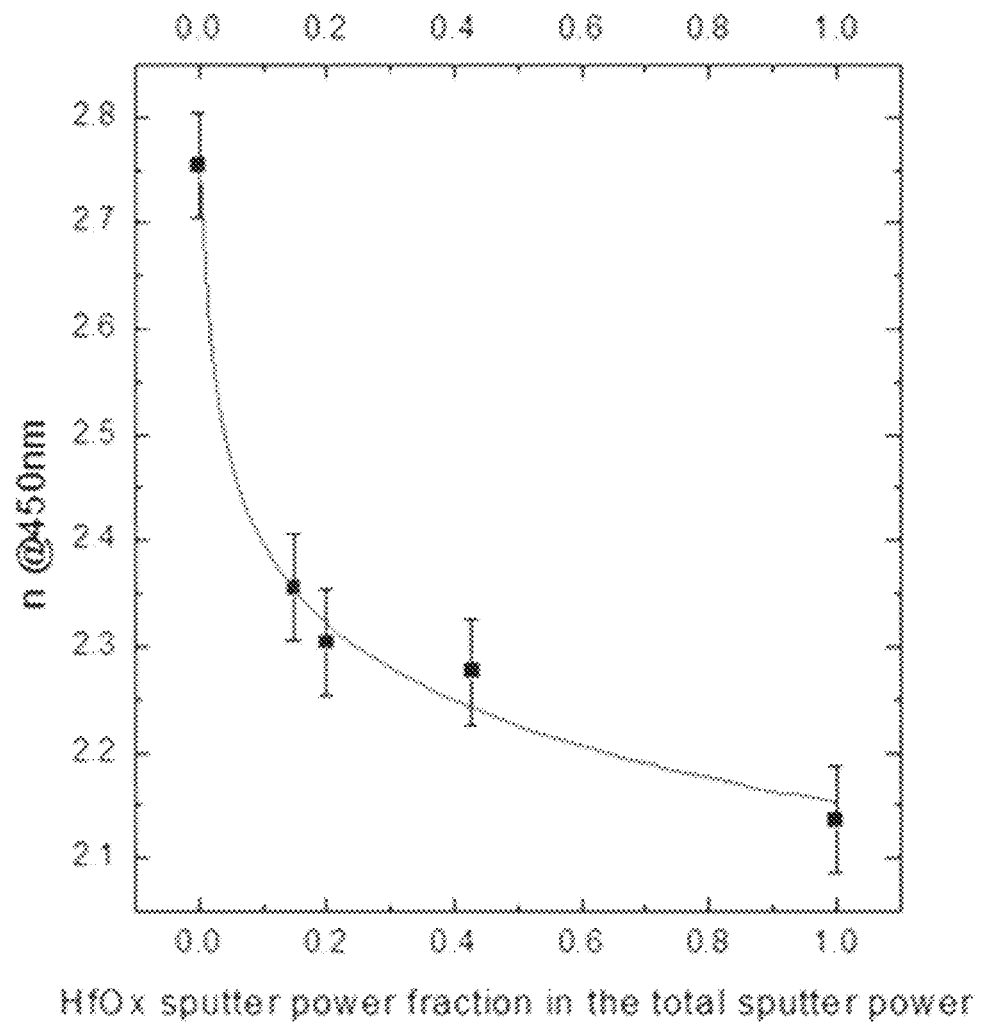

FIG. 12K shows the index of a range of $TiO_2$ films alloyed with $HfO_2$ over a range of sputter power at 400 nm. FIG. 12L shows the index of a range of $TiO_2$ films alloyed with $HfO_2$ over a range of sputter power at 450 nm. As indicated, the index of refraction can be controlled by varying the sputter power of deposition. As indicated in FIGS. 12K and 12L, at multiple wavelengths a desired index can be formed by the selection of power ratios to provide the selected composition and index. By varying the power ratio continuously across a selected range index, particular pre-defined shape of the index of refraction with thickness can be deposited to provide a continuously grated or shaped index.

In addition to a series of individual layers as discussed above, individual layers with differing shadow mask positioning can be deposited. Individual layers of continuously varying composition can be deposited in each position of shadow mask 400 according to process 440. Additionally, shadow mask 400 can be moved across the wafer in substantially a continuous procedure, as discussed below.

Figure 6A:
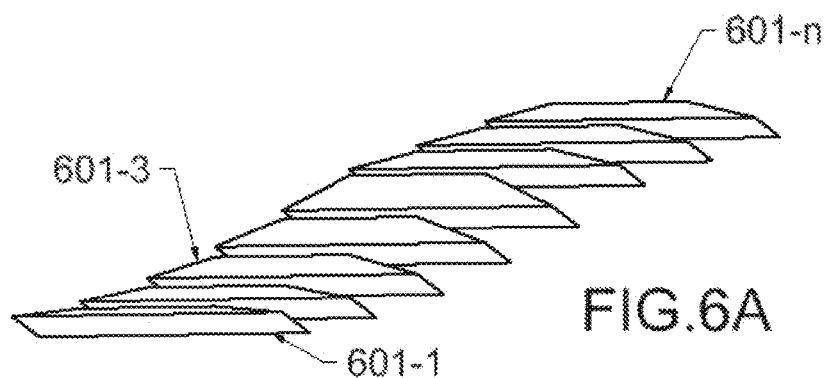
FIGS. 6A and 6B illustrate lateral coating portions through a lateral moving shadow mask on a substrate.
Figure 6B:
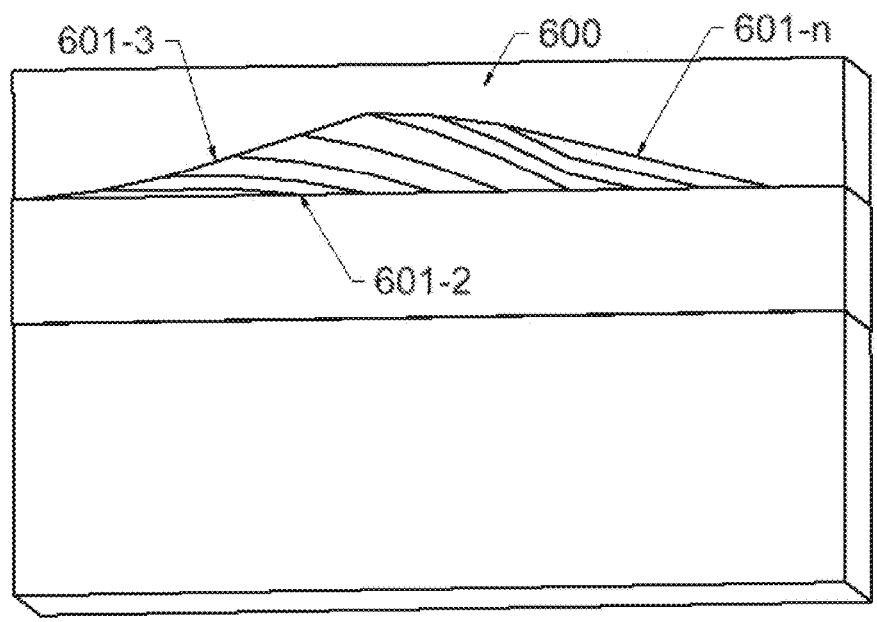

FIGS. 6A and 6B illustrate coating portions transmitted through a laterally moving shadow mask 400 sequentially as the mask 400 is moved over a substrate during deposition Deposition can be performed according to process 550. As illustrated in FIG. 6A, coatings 601-1 through 601-n are sequentially deposited and can form a converter layer. FIG. 6B illustrates the results of the sequential deposition. A lateral portion of a deposited film at each of a number of positions of the shadow mask 400 is formed as separate coating thicknesses 601-1 through 601-n arriving from bottom left to top right in time through the shadow mask positioned at different lateral positions. As illustrated in FIG. 6B, the resulting film is shown as a cumulative coating buildup laterally formed from coatings 601. The thickness of the layer is determined by the rate of deposition of each portion at each position and the time duration of the substrate beneath the position of the shadow mask. In some embodiments, each coating layer 601 of the film is provided a material composition so as to provide a continuous lateral change in thickness, composition and, or index of refraction through film 600.

Figure 6C:
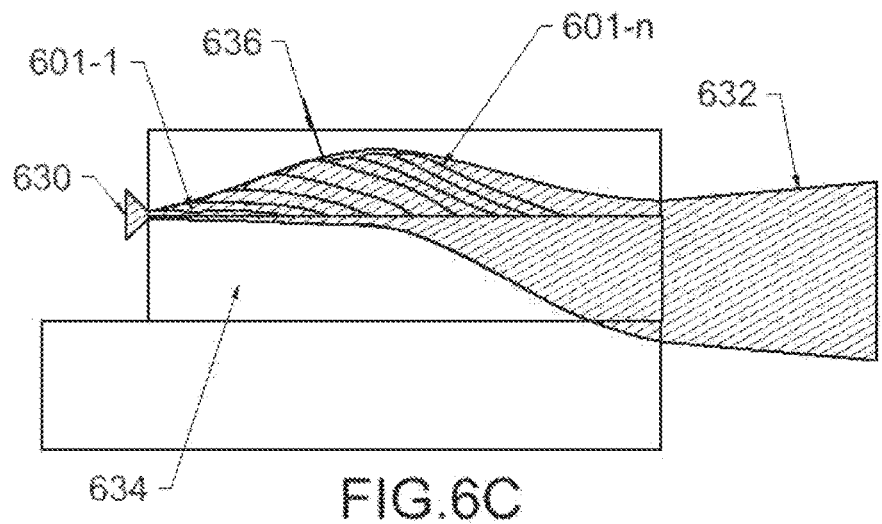
FIG. 6C shows the cross section of a waveguide device with layers accumulated through lateral movement of a shadow mask with deposition of a film with varying index according to some embodiments of the present invention.

FIG. 6C shows the cross section of a waveguide device 620 with layers 601-1 through 601-n accumulated through lateral movement of a shadow mask 400 with deposition of a film with varying index according to some embodiments of the present invention. The deposited layer forms a core 636 of a waveguide having an input light solid angle 630 with a small optical area, high index and high contrast to the upper and lower cladding materials with a large half angle as illustrated. The core layer 636 (formed by layers 601), from left to right, represent lateral portions of the film having lower index contrast to the cladding and therefor a larger optical size for the guided light, left to right. The light capacity or étendue of waveguide 636 is shown such that the index of the deposited core layers 601 on the far right are just above, equal to and then just under the index of substrate 634. The optical capacity is formed into the substrate which has a lower NA with respect to its upper and lower material to provide a small contrast, small NA and small half angle as well as a large optical size at the output facet as illustrated by output 632. Such a device can be formed according to some embodiments so as to conserve the étendue of the source, transforming solid angle ratio into optical size ratio. It can be formed so as to gradually or adiabatically increase or decrease the étendue.

Figure 7:
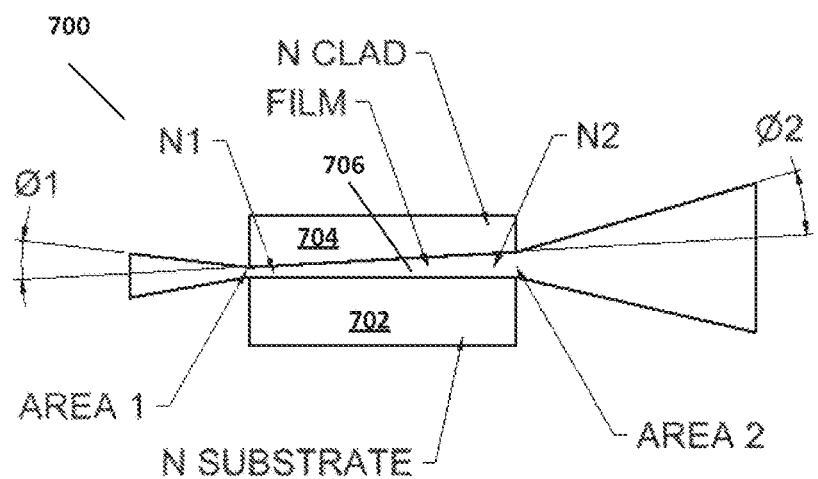
FIG. 7 shows a cross section of a device having layers formed according to some embodiments of the present invention.

FIG. 7 shows a cross section of a device 700 having layers formed according to some embodiments of the present invention. As illustrated in FIG. 7, device 700 includes a substrate 702, cladding 704, and core 706 formed as a varying index series of layers 601 as illustrated in FIG. 6B. The waveguide device 700 has a first optical size, area A1 and first index n1, left, gradually changing into a second area A2 and index n2, right. The optical capacity remains centered in the film and a first étendue, $E1=2\pi A1(1-\cos \Phi_1)$ is transformed and is equal to the second étendue, $E2=2\pi A2(1-\cos \Phi_2)$. Case 2 is that the étendue E1 does not equal E2 but is transformed gradually and adiabatically to the component element values of E2 through the lateral graded index.

Figure 8:
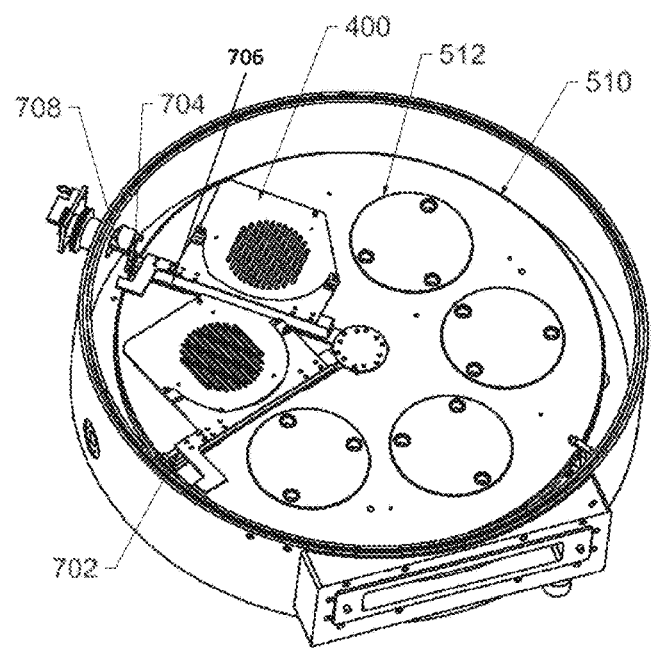
FIG. 8 shows the installation design of the shadow mask position 'clock' drives in the AXcela rotary inline process chamber according to some embodiments of the present invention.

FIG. 8 shows the installation design of the shadow mask position 'clock' drives 702 in the AXcela rotary inline process chamber. As illustrated in FIG. 8, mask 400 covers a wafer 512 mounted on table 510. Each clock drive 702 has a shadow mask 400 and a substrate wafer 512 to be coated. Each clock drive 702 has a drive gear 704 and drive screw 706 to utilize the rotational motion of table 510 to move the shadow mask 400 laterally. In some embodiments, drive gear 704 and drive screw 706 can also be referred to as a cogged wheel and a lead screw, respectively, and drive movement of shadow mask 400 on rotary table 510 in a wrap-around inline rotary coating process within a vacuum chamber. As illustrated in FIG. 8, a pin 708, whose location is fixed on chamber 500, is used to rotate cogged wheel 704 a portion of a rotation each time wheel 704 of clock drive 702 passes the fixed position of pin 708. As indicated, pin 708 can be rotated to move cogwheel 704 either clockwise or counterclockwise, depending on position, or disengaged to leave mask 400 stationary. Advancing cogged wheel 704, through lead drive screw 706, advances shadow mask 400 across substrate wafer 512 laterally a portion of the amount of the pitch of drive screw 706.

Figure 9A:
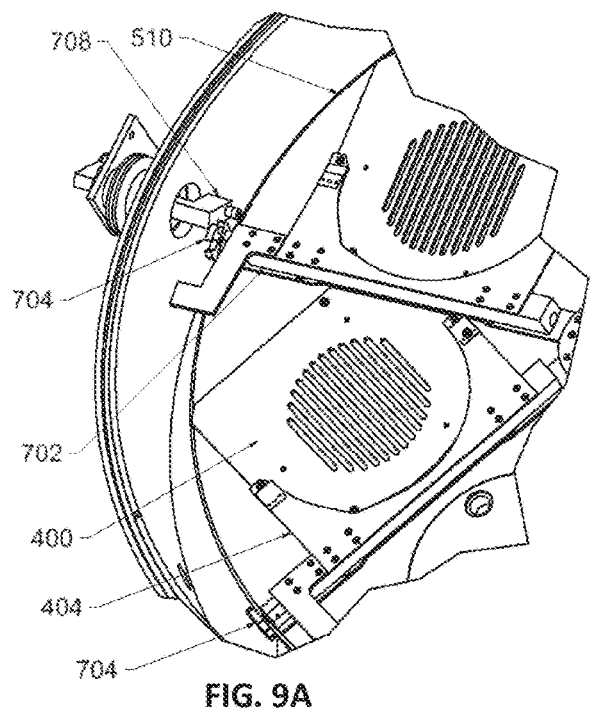
FIGS. 9A and 9B show some aspects of the clock drive and shadow mask driven by rotation of the cogged wheel by a chamber pin.
Figure 9B:
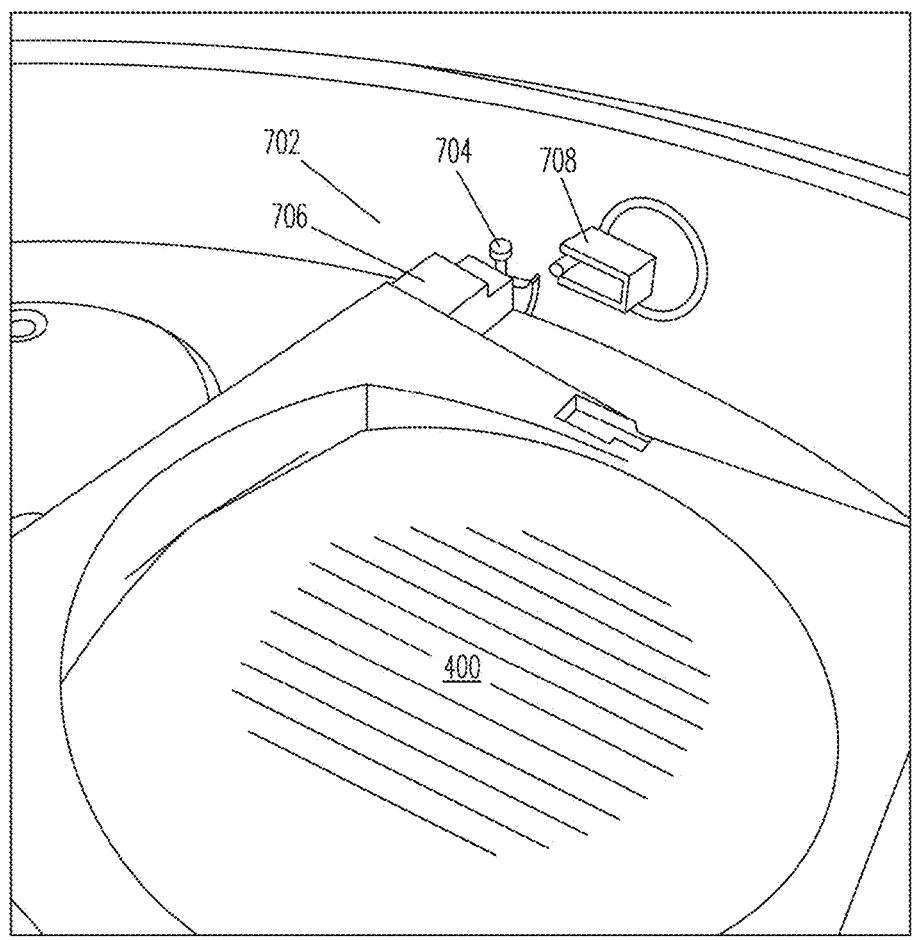

FIGS. 9A and 9B are photos showing some aspects of clock drive 702 and shadow mask 400 driven by rotation of cogged wheel 704 by chamber pin 708. In some embodiments, pin 708 can be withdrawn and inserted as substrate table 510 rotates and mask 400 drives passed the pin position to turn cogged wheel 704 and move mask 400 or removed, to leave mask 400 in a position so as to accumulate additional coating through having shadow mask 400 at its current position.

Figure 10:
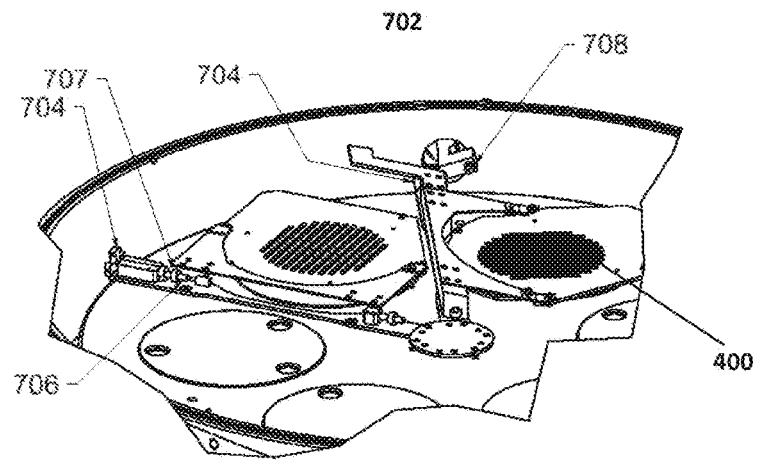
FIG. 10 is an illustration showing the drive pin engaged with the cogged wheel.

FIG. 10 is an illustration showing the drive pin 708 engaged with the cogged wheel 704. As table 510 rotates, cogged wheel 704 captures pin 708 and rotates. Screw 706 is then driven by cogged wheel 704 and moves shadow mask 400. The amount of rotation of screw 706 by cogged wheel 704 is determined by the number of receivers on cogged wheel 704. The amount of movement of shadow mask 400 depends on the amount of rotation of cogged wheel 704, the pitch of screw 706, and the coupling between screw 706 and shadow mask 400.

Figure 11:
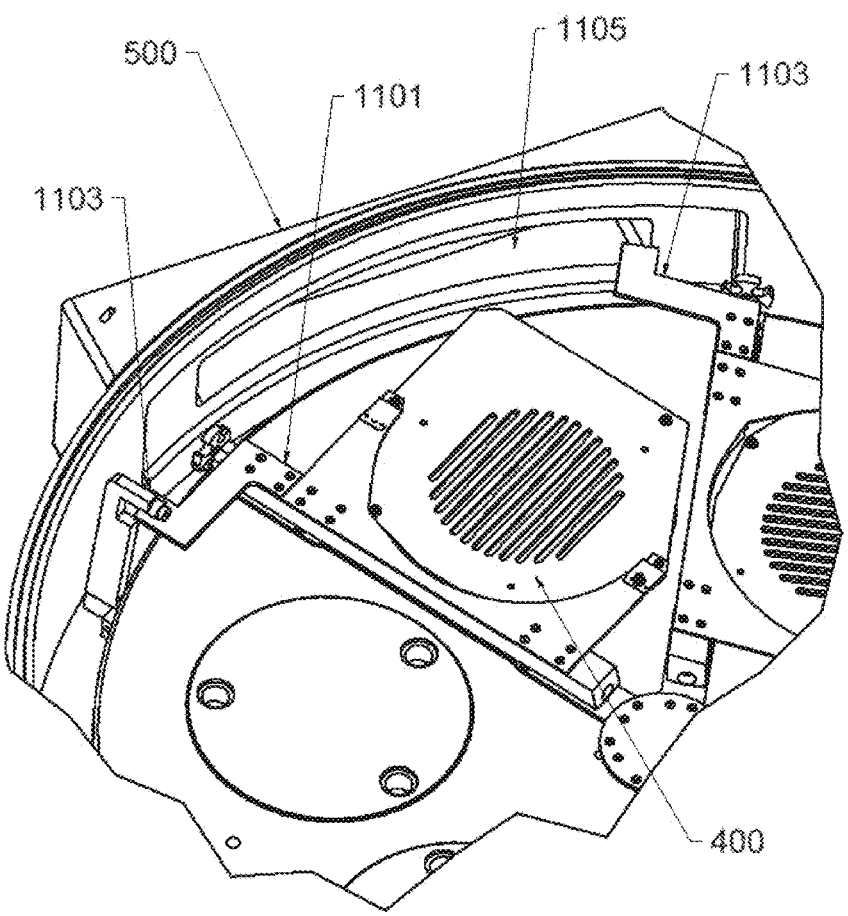
FIG. 11 shows a lift mechanism according to some embodiments of the present invention.

In addition to a lateral movement of mask 400, mask 400 can also be lifted. FIG. 11 shows a lift mechanism 1101 activated mechanically by an arm 1103 that extends through a vacuum seal in vacuum chamber 500 so as to lift shadow mask 400 vertically away from wafer 512 at the load, unload position opposite the gate valve 1105 for unloading of coated substrates and loading of substrates to be coated.

Figure 13:
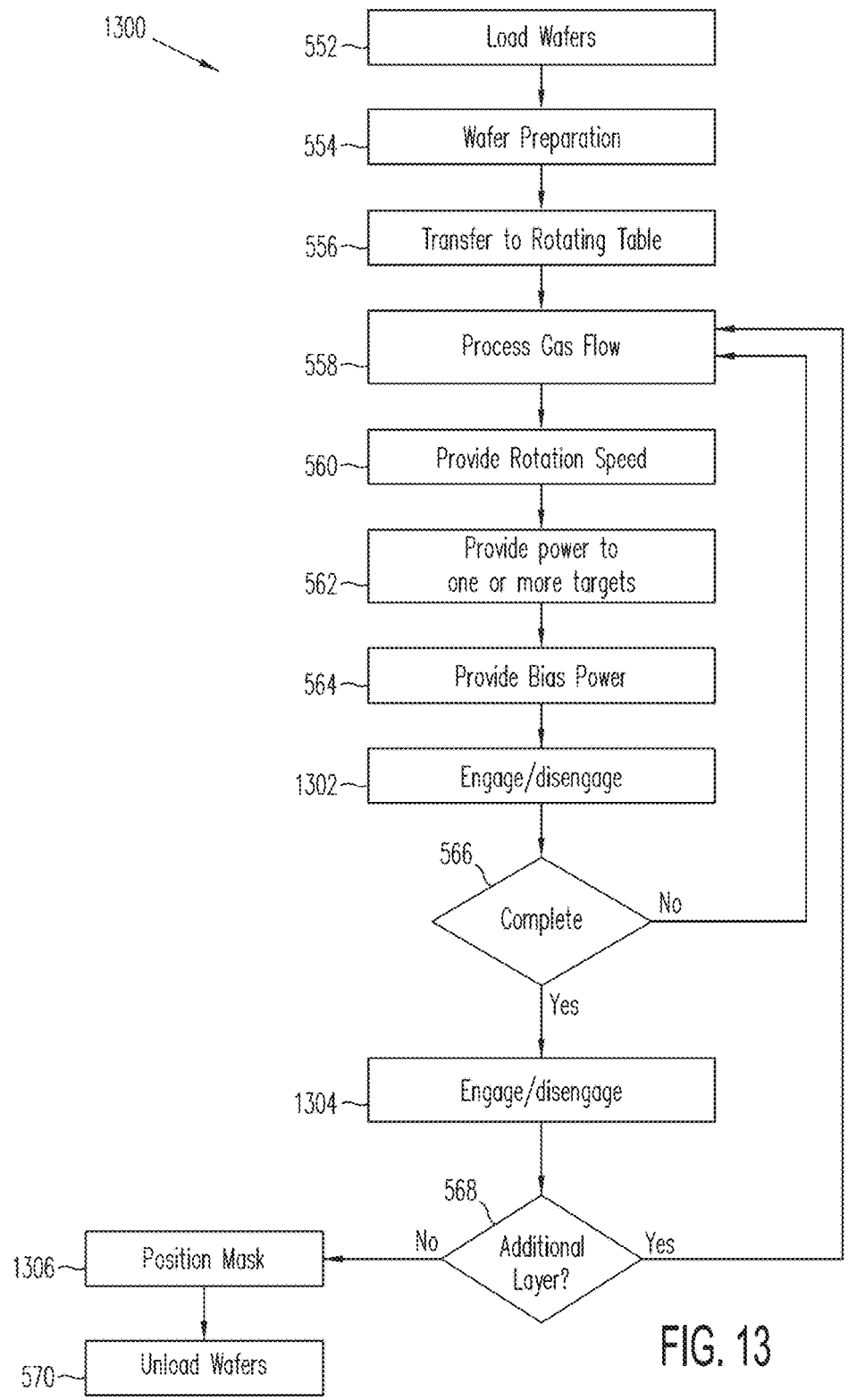
FIG. 13 shows a process for deposition of materials that uses a clock drive to move a mask over a wafer during the deposition process according to some embodiments of the present invention.
Figure 14:
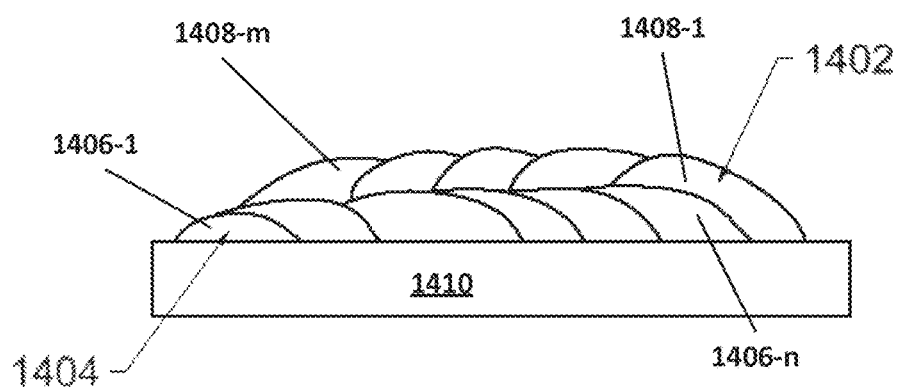
FIG. 14 illustrates the cross section of a coating on a substrate according to some embodiments of the present invention.
Figure 15:
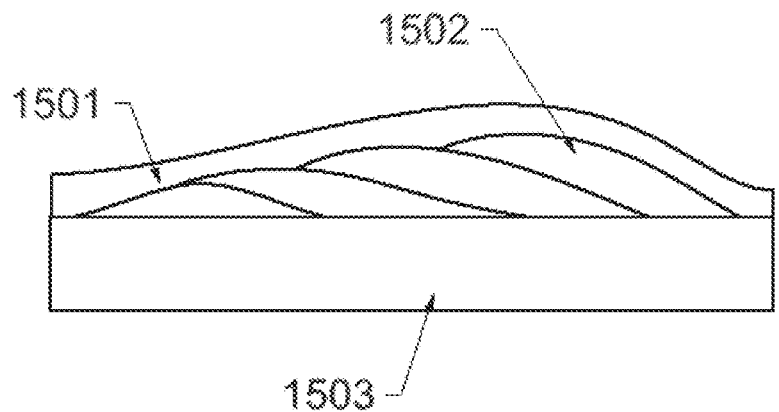
FIG. 15 shows a core wave guide series of portions representing stages of a continuous process of forming a first layer such that the thickness of the coating is continuously increased according to some embodiments of the present invention.

FIG. 13 illustrates a process 1300 that uses a clock drive 702 according to embodiments of the present invention. As illustrated in FIG. 13, process 1300 is substantially the same as is process 550 illustrated in FIG. 5I. However, after step 1302, clock drive 702 may be engaged (either clockwise or counterclockwise) to rotate cogwheel 708 or disengaged. Further, after deposition of one layer is completed as determined in step 566, clock drive 702 may be engaged or disengaged to rotate cogwheel 708 prior to deposition of a second material layer. Further, a step 1306 can be performed before the wafers are unloaded in step 570. Step 1306 can reposition shadow mask 400. One skilled in the art will recognize that process 1300, as is process 550, is exemplary only. Processes can be varied accordingly to accomplish particular material layer depositions FIG. 14 illustrates the cross section of a coating on a substrate 1410. Coating portion layers 1406-1 through 1406-n (collectively 1406) to form layer 1404 followed by layers 1408-1 through 1408-m (collectively 1408) to form material layer 1402. Layers 1406-1 through 1406-n form sequential portions of a continuous deposition accomplished by coating through the lateral moving shadow mask 400 according to process 1300 and constitute a first coating layer 1404, which results from coating by scanning the shadow mask 400 in a first direction. In some embodiments of the invention portions 1406-1 through 1406-8 have a continuous lateral variation of composition and associated continuous variation of the index of refraction. Coating portions 1408-1 through 1408-m constitute a second coating layer 1402 and are deposited over the top of the first layer 1404 in a second direction, which in this diagram is opposite the first direction. Some embodiments comprise a continuous range of lateral variation of composition and index of the second layer 1402. In some embodiments the average index of the second layer 1402 can be lower than the average index of the first layer 1404. In some embodiments all the index of the portions of the second layer 1402 have an index less than any of the layers of the lower layer 1404, forming a light guiding structure with an NA that varies laterally. FIG. 15 shows a core wave guide series of portions representing stages of a continuous process of forming a first layer 1502 deposited on substrate 1503 such that the thickness of the coating is also continuously increased from left to right. Layer 1501 is a second layer deposited over the first layer and has a single index of refraction and thickness and forms a light guiding cladding on the higher index first layer 1502. When facets are formed at a distance from each end, a light guiding device with a small optical facet on the left hand facet and a large optical facet at the right hand facet with a continuous change or transformation of the optical size from on to the other facet.

Figure 16:
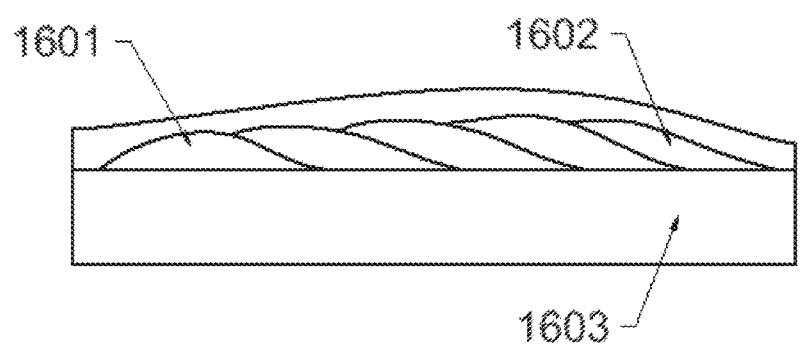
FIG. 16 shows the cross section of a first layer of constant thickness with gradually varying index of refraction under a second layer so as to form a light guiding structure according to some embodiments of the present invention.

FIG. 16 illustrates the cross section of a first layer 1602 of constant thickness with gradually varying index of refraction under a second layer 1591 so as to form a light guiding structure. Forming facets of equal optical size but varying NA and étendue can be formed.

Figure 17:
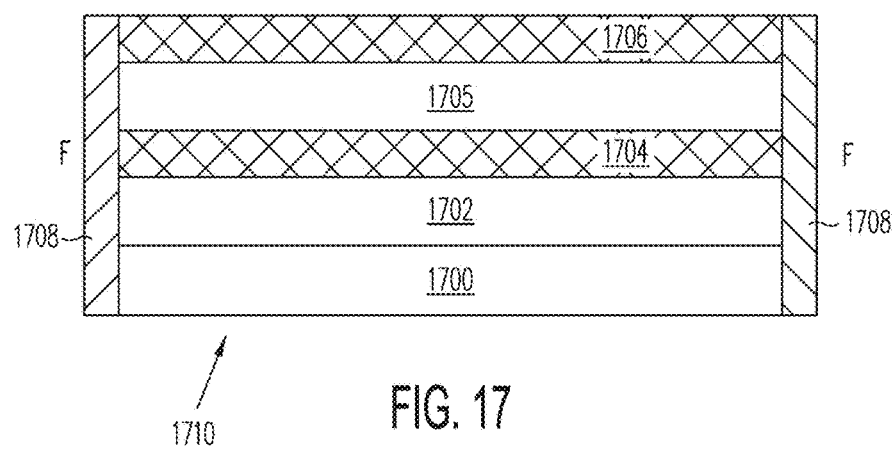
FIG. 17 illustrates layers of a device for in-coupling or out-coupling light, both specular and diffuse, according to some embodiments of the present invention.

FIG. 17 shows layers of a device for in-coupling or out-coupling light, both specular and diffuse. Layer 1705 can be a solid structure of transparent material such as glass or plastic. Layer 1700 can be an emissive region or an adjacent region wherein diffuse light would impinge. Layer 1702 can be an amorphous transparent layer according to some embodiments of the present invention having an index of refraction equal or greater than that of emissive layer 1700. The index of layer 1702 increases in index away from layer 1700 and toward layer 1704. Light incident on layer 1702 will be guided away from layer 1700 and concentrated in the higher index region of layer 1702. In some embodiments, layer 1704 and/or 1706 are crystalline layers, which will scatter the diffuse light. Light entering layer 1704 from layer 1702 will either be scattered back into layer 1702 or scattered in the opposite direction into layer 1705. Light scattered back to layer 1702 will be transported in layer 1702 higher index portion until it is again scattered by layer 1704 until the preponderance of the light transported in the layer 1702 will have been scattered into and through transparent structure 1705. Likewise, light impinging layer 1704 from structure layer 1705 will be scattered out of layer 1704 or scattered back through layer 1705. The light fraction reaching the high index portion of layer 1702 can be captured and transported until scattered by layer 1704 through layer 1705 and scattered out of structure 1710. In some embodiments mirrors or coatings 1708 reflect light which cycles as described and is emitted through layer 1704 from device 1710.

Figure 18:
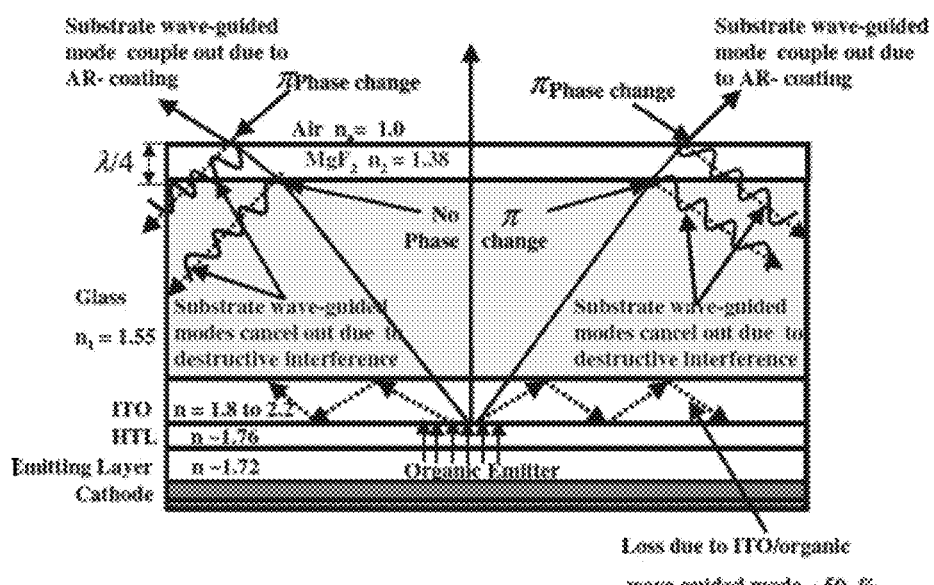
FIG. 18 shows that about 50% of the light emitted from an OLED structure is trapped by a wave guide of high index OLED and transparent conductive oxide ITO.

FIG. 18 shows that about 50% of the light emitted by an OLED structure is trapped by the waveguide formed between the OLED and the glass. See, e.g., K. Saxena, D. S. Mehta, V. K. Rai, R. Srivastava, G. Chauhan, M. N. Kamalasanan~J. Lumin. 128 (2008) 525. Improvement in the out-coupling of the light can, according to some embodiments of the present invention, be achieved by interposition of a graded layer having the index of the transparent oxide and increasing to a higher index either as a step index or a graded increase through the thickness of the interposed film. That structure can provide a grin or waveguide structure that is transparent and will transport the emitted light laterally. Additionally the glass may be roughened or patterned prior to deposition of such a graded or stepped index layer.

Figure 19:
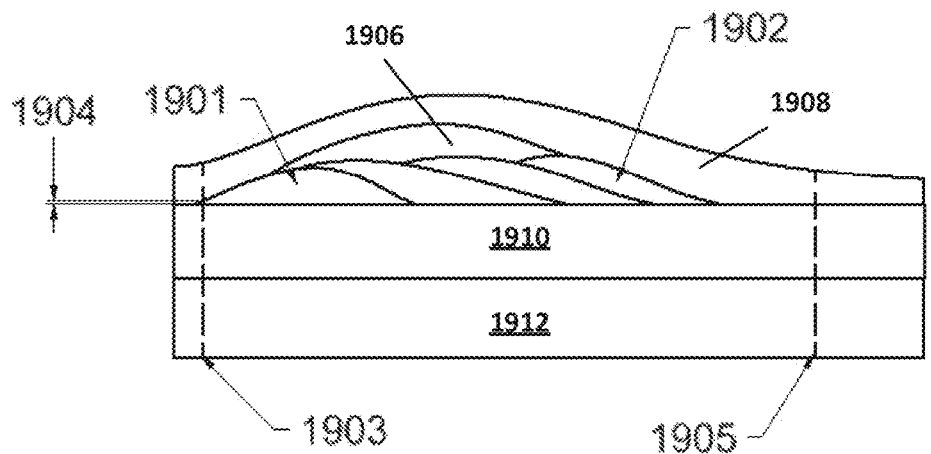
FIG. 19 shows a perspective view of layers of a device according to some embodiments of the present invention.

FIG. 19 shows a device according to some embodiments of the present invention. As shown in FIG. 19, layers 1901 through 1902 are deposited on substrate 1910 according to process 1300 with a lateral index gradient, which may be from high to low index. Cladding layer 1908 is deposited over layers 1901 through 1902 and has an index corresponding to lower cladding 1912. As is further illustrated, layer 1906, which can include a dopant such as a phosphor or be semiconductor material formed through a mask, can be deposited adjacent to or part of the core of the waveguide under cladding layer 1908 and over layers 1901 through 1902. The index of layer 1906 can be chosen such that a portion of light coupled through area 1904 travels through layer 1906, exciting fluorescence and stimulating emission. Cutting and polishing of the light guiding structure at facets 1903 and 1905 forms facets and provide a planar waveguide coupler transformer with an optical area at facet 1903 formed with core layer 1901 and an optical area at facet 1905 formed with the cladding 1908. Light coupled into the device at facet 1903 will propagate through the waveguide with a portion passing through layer 1906 depending on the index contrast between layer 1906 and the layers 1901 through 1902. The light will be guided by mode size conversion out of layers 1901 through 1902 and emerge from facet 1905 with the NA determined by the contrast between layers 1901 through 1902 with the fluorescent light from layer 1906 as well as a portion of the light incident on and transmitted from facet 1903. In some embodiments, layer portion 1906 can be a remote phosphore operating within the core, formed by layers 1901-1902, of a nonimaging waveguide for the purpose of down-conversion of the light incident on facet 1903.

Figure 20A:
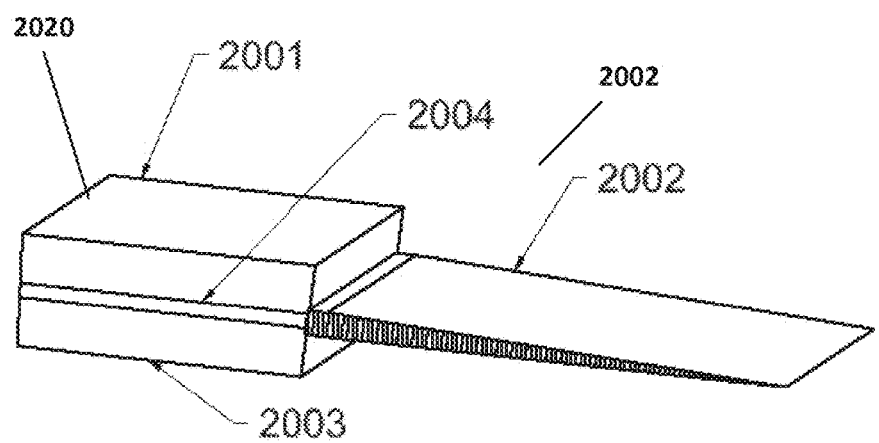
FIG. 20A shows a rendering of an edge emitting diode with three layers comprising the light emitting waveguide structure of a light emitting diode or pin structure according to some embodiments of the present invention.

FIG. 20A shows a rendering of an edge emitting diode 2020 with three layers comprising the light emitting waveguide structure of a light emitting diode or pin structure, n-portion 2003, p-portion 2001, and quantum well 2004 of the diode. The quantum well 2004 represents the combination region which may emit, for example blue light. A tapered core portion 2002 of a facet coupled waveguide device 2014 is shown having and an optical size equal to and aligned with the light emitting portion of the diode. In some embodiments, the tapered core 2002 has an index which decreases from left to right and thickness that decreases from left to right. Tapered core 2002 may be the core portion of the device shown FIG. 19 above (i.e. layers 1901 through 1902 and 1906.

Figure 20B:
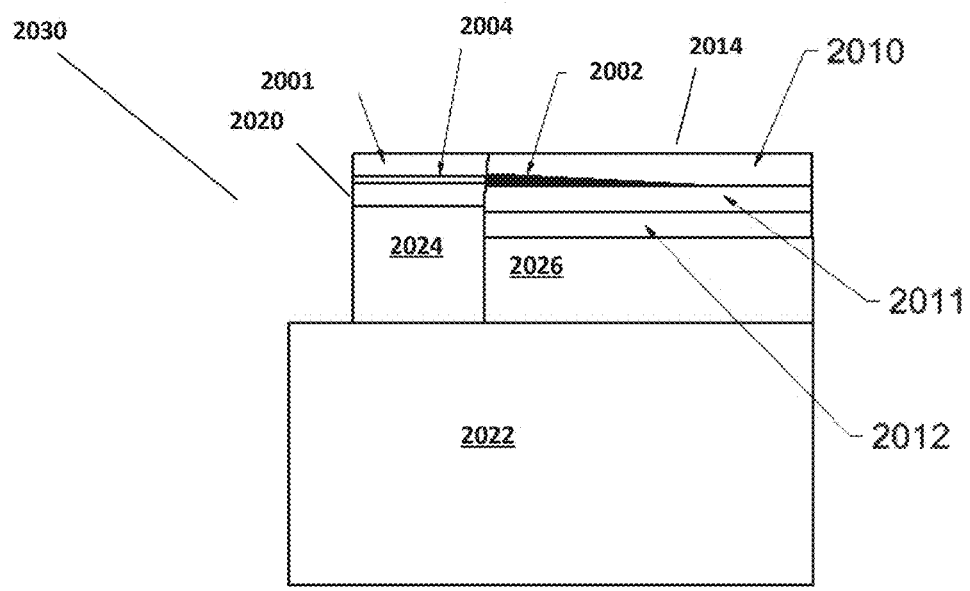
FIG. 20B illustrates the tapered core of FIG. 20A within a waveguide structure according to some embodiments of the present invention.
Figure 20C:
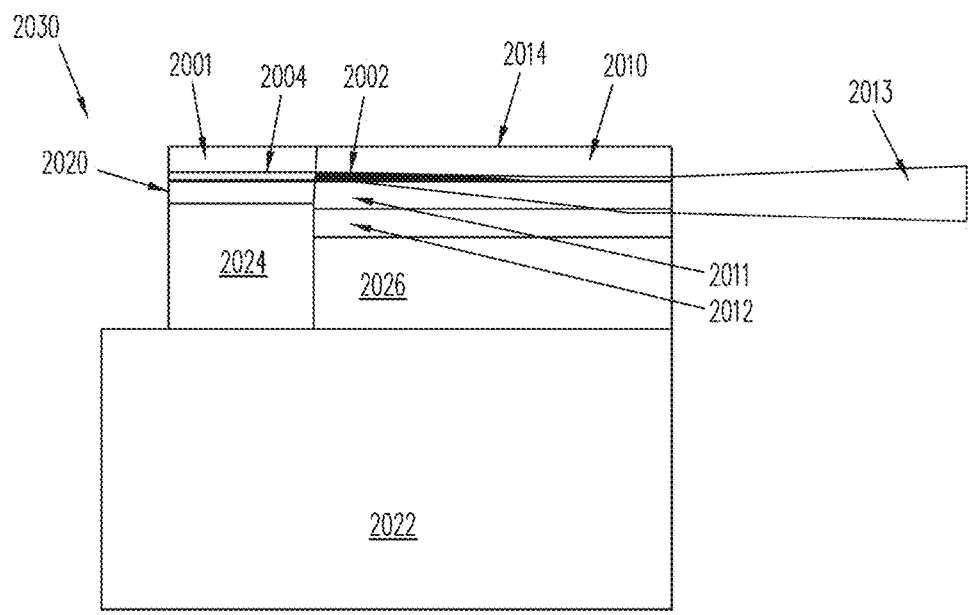
FIG. 20C is an elevation perspective of the diode and waveguide structure of FIG. 20B illustrating the path of the light from the diode according to some embodiments of the present invention.

FIG. 20B illustrates device 2014 with tapered core 2002 as illustrated in FIG. 20A within a waveguide structure coupled with diode 2020. As illustrated, tapered core 2002 is surrounded by cladding 2010, substrate 2011, and cladding 2012. Cladding 2010 and 2012 are lower index to form a waveguide with substrate 2011. As shown in FIG. 20B, diode 2020 is mounted on heat sink 2024. Device 2014 is mounted on positioning block 2026 so as to align with diode 2020. Heat sink 2024 and positioning block 2026 are mounted on submount heat sink 2022. Diode 2020 with device 2014, heat sink 2024, positioning block 2026, and submount heat sink 2022 form a device 2030. FIG. 20C illustrates light propagation from the diode through tapered core 2002 and coupling into substrate 2011 by mode-sized conversion. The light is laterally coupled into the tapered layer 2002 and wave guided in the tapered layer until that layer can no longer support a mode volume. At that lateral portion of the waveguide, the light undergoes a mode size conversion into the macroscopic waveguide and undergoes a transition to ray optic propagation in the macroscopic waveguide comprised of the substrate 2011 with cladding layers 2010 and 2012. The light undergoes emission 2013 at the free space facet of the macroscopic waveguide with a half angle illustrative of the contrast between substrate 2011 and cladding layers 2010 and 2012.

Figure 21:
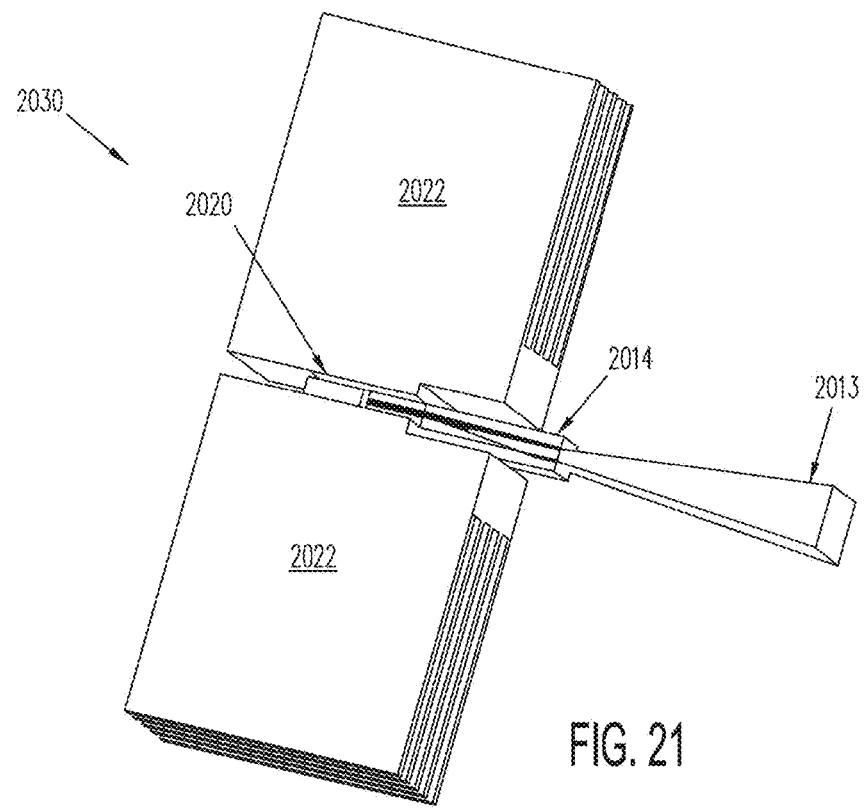
FIG. 21 shows the coupled waveguide structure of FIG. 20C showing the packaging of the diode with two heat sink structures, one on either primary planar side of the diode, according to some embodiments of the present invention.

FIG. 21 shows device 2030, which includes the coupled waveguide structure 2014 of FIG. 20C showing the packaging of diode 2020 with two heat sink structures 2022, one on either primary planar side of the diode 2020.

Figure 22:
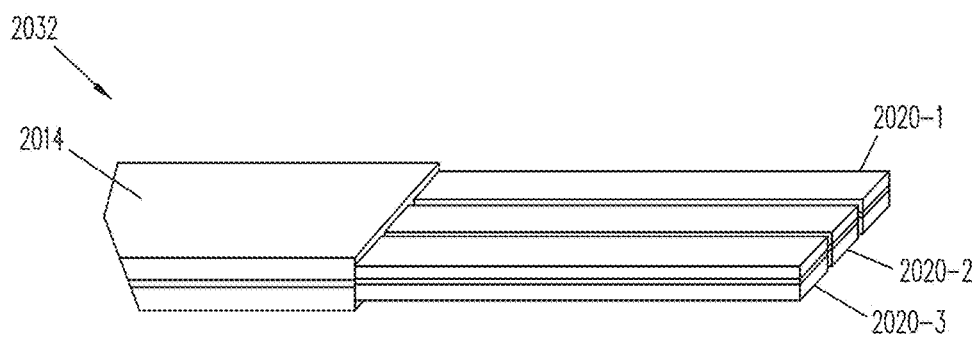
FIG. 22 shows the overlap of a three layer diode structure with a waveguide structure according to some embodiments of the present invention.

FIG. 22 shows a device 2032 that includes three diodes 2020-1 through 2020-3 that overlap waveguide structure 2014. Diodes 2020-1 through 2020-3 can represent red, green, and/blue (RGB) drivers, respectively.

Figure 23:
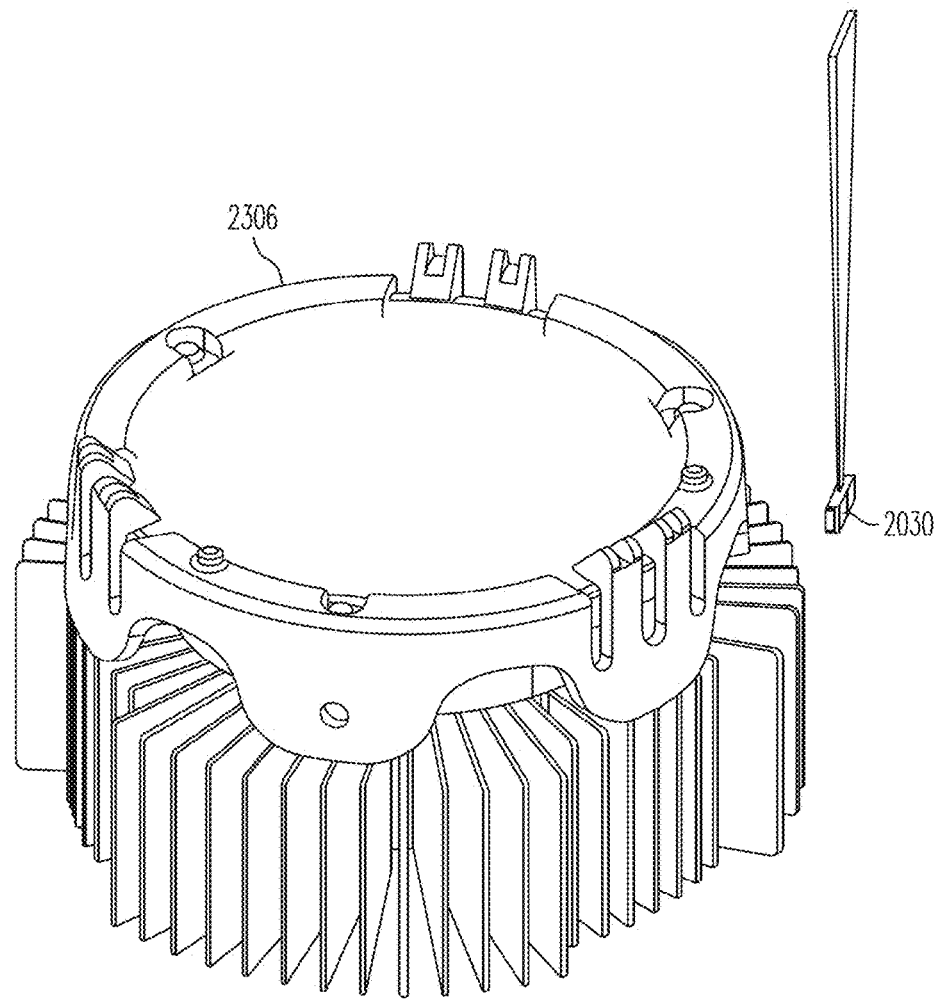
FIG. 23 shows a luminaire coupler planar package with a diode source according to some embodiments as illustrated above in comparison with a conventional light source.

FIG. 23A shows device 2030, which is a luminaire coupler planar package with a diode source 2020 with two sided thermal heat sinks 2022, next to a Cree LMH6 luminaire 2306. Device 2030 can have an NA of 0.087 with a light output cone half angle of 5 degrees. According to at least some aspects of the present invention, the planar waveguide coupler based luminaire may have an output luminance equivalent to the Cree LMH6 in a much smaller package as shown.

Figure 24:
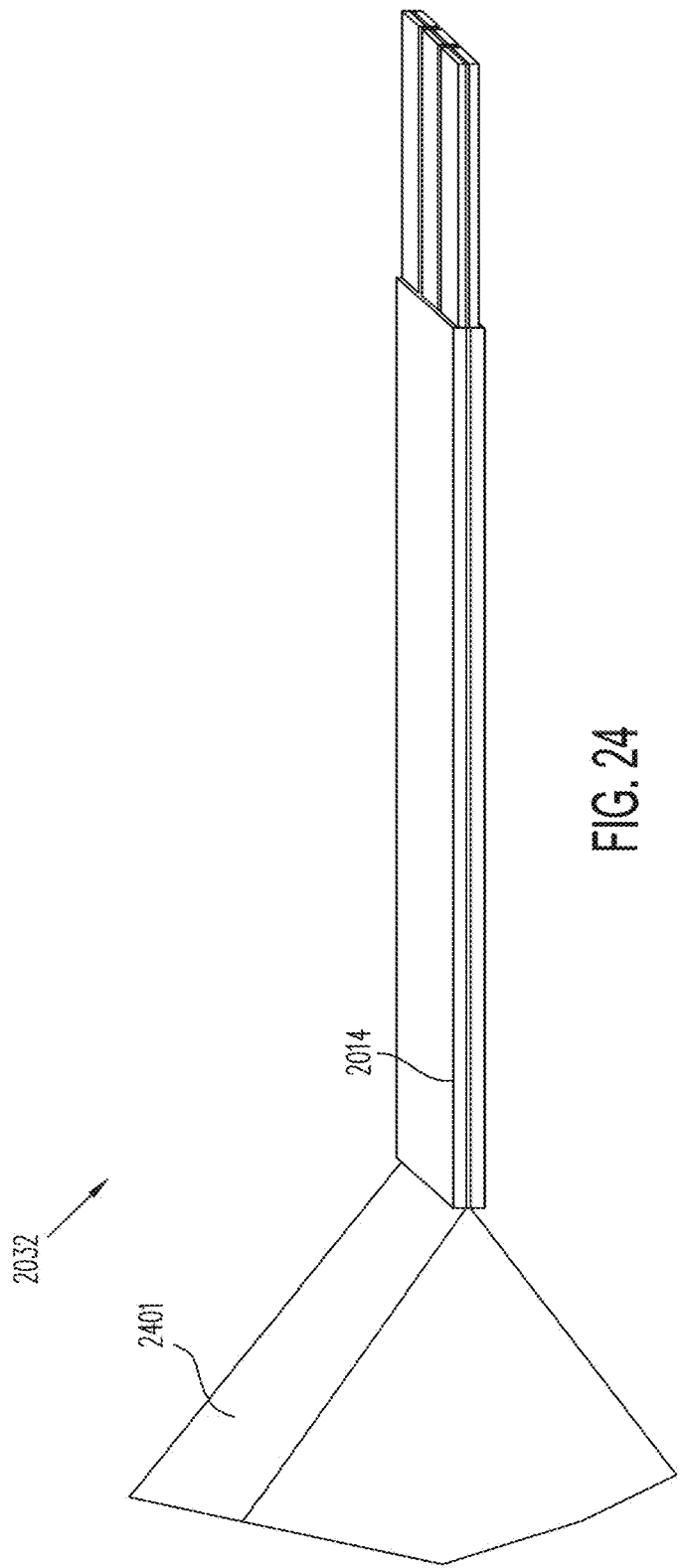
FIG. 24 shows three edge emitting diodes, right aligned with a waveguide coupler transformer according to some embodiments of the present invention.

FIG. 24 shows three edge emitting diode device 2032, right aligned with a waveguide coupler transformer 2014 according to the present invention. Emitted light cone 2401 is a mixture of light from the three diodes 2020-1 through 2020-3.

Figure 25:
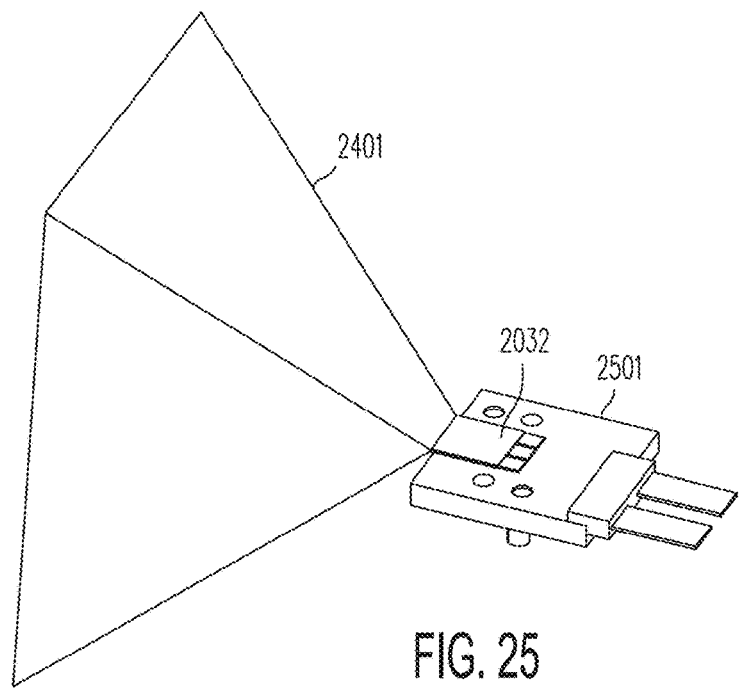
FIG. 25 shows a waveguide coupler aligned with three diodes and packaged on the surface of a substrate according to some embodiments of the present invention.
Figure 26:
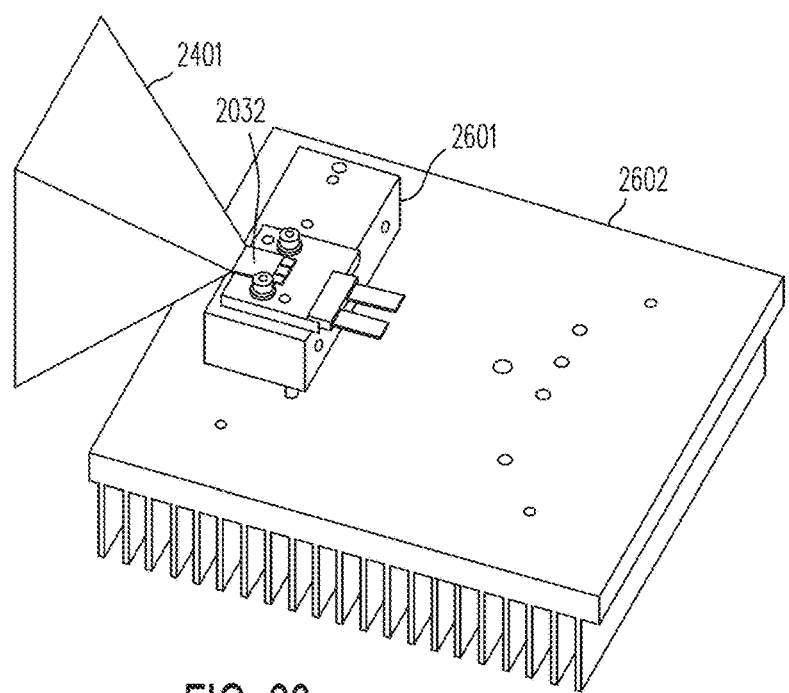
FIG. 26 shows the assembly of FIG. 25 joined to a heat dissipation device according to some embodiments of the present invention.
Figure 27:
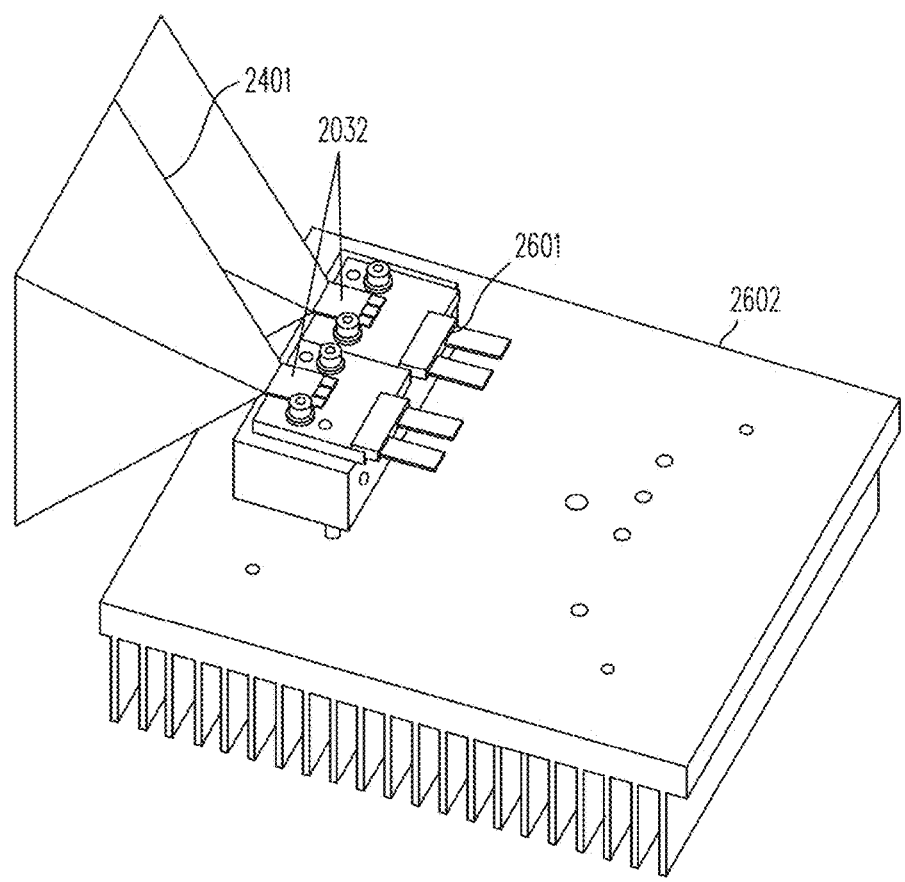
FIG. 27 shows two devices as shown in FIG. 25 fastened to a heat dissipation device according to some embodiments of the present invention.

FIG. 25 shows device 2032 packaged on the surface of a substrate 2501, which may be a thermal electric submount. The waveguide coupler includes a method of alignment and through holes for fastening. FIG. 26 shows device 2032 joined to a heat dissipation device 2601 and mounted on a package 2602. FIG. 27 shows two devices 2032 as shown in FIG. 25 fastened to a heat dissipation device.

Figure 28:
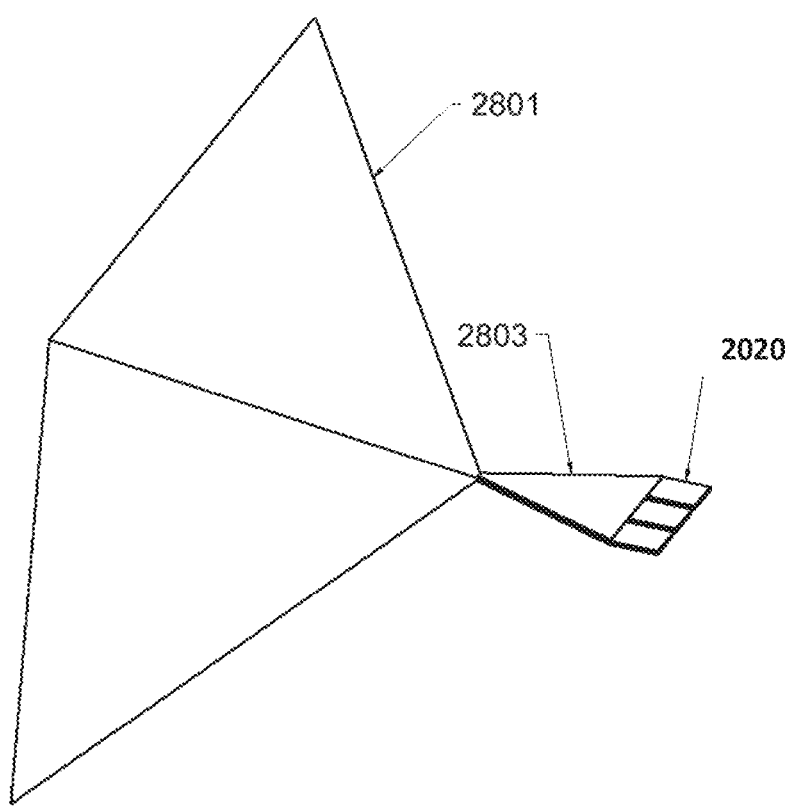
FIG. 28 shows three diode facets located with a coupler transformer according to some embodiments of the present invention.

FIG. 28 shows a device 2803 coupled to three diodes 2020. Device 2803 is a tapered coupler constructed similarly to device 2032 so as to concentrate light emission 2801. Device 2803 has an in-plane physical taper, which concentrate the light from diodes 2020. The coupler transformer is a non-imaging concentrator with an optical area less than or equal to the area of one or more diode light sources.

Figure 29:
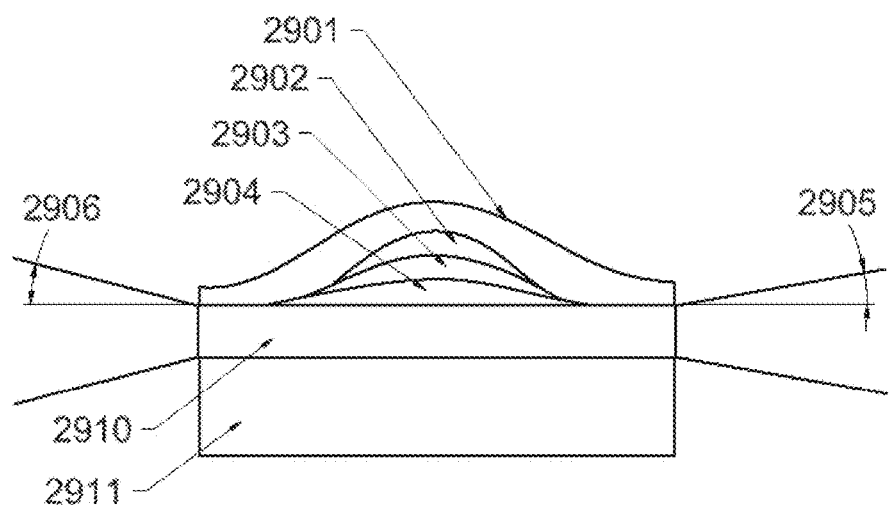
FIG. 29 shows a coupler transformer according to some embodiments of the present invention.

FIG. 29 shows a coupler transformer according to some embodiments of the present invention. The coupler transformer illustrated FIG. 29 includes in the core of the waveguide one or more layers 2902, 2903, and 2904 between cladding layer 2901 and waveguide core 2910. The coupler transformer also includes a lower cladding 2911. One or more of layers 2901, 2902, 2903, or 2904 are doped with a phosphor or are an active optical material or semiconductor. This device is a coupler between low NA devices, as shown by half angles 2905 and 2906. A doped layer as discussed above can provide an active component to the coupler device.

Figure 30A:
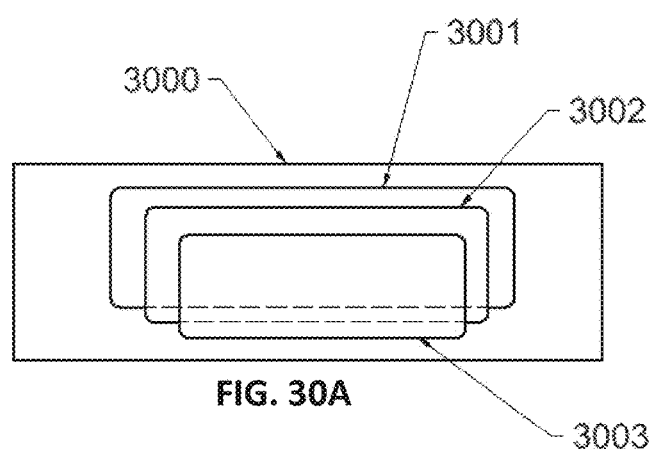
FIG. 30A and FIG. 30B show the plan and perspective view, respectively, of a substrate with three offset layers according to some embodiments of the present invention.
Figure 30B:
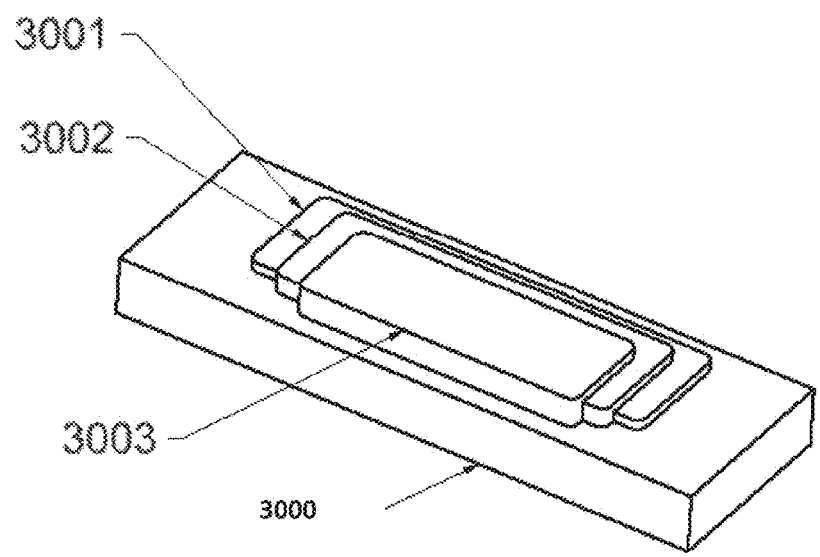

FIG. 30A and FIG. 30B show the plan and perspective view, respectively, of a substrate with three offset layers. Offset layers 3001, 3002, and 3003 can be made to have tapered lateral thickness profile according to some embodiments of the present invention similar to the profile of the layers 2901, 2902, 2903 or 2904 of FIG. 29. Layer 3002 can be an intrinsic semiconductor layer that insulates and separates doped PN or anode layers 3001 and 3003 to form a vertical PIN structure to conduct light laterally through the core of a waveguide. In some embodiments, layers 3001 and 3003 are conductive transparent layers. All layers are shown on a waveguide core 3000, having a lower index than deposited layers 3001, 3002, and 3003.

Figure 31A:
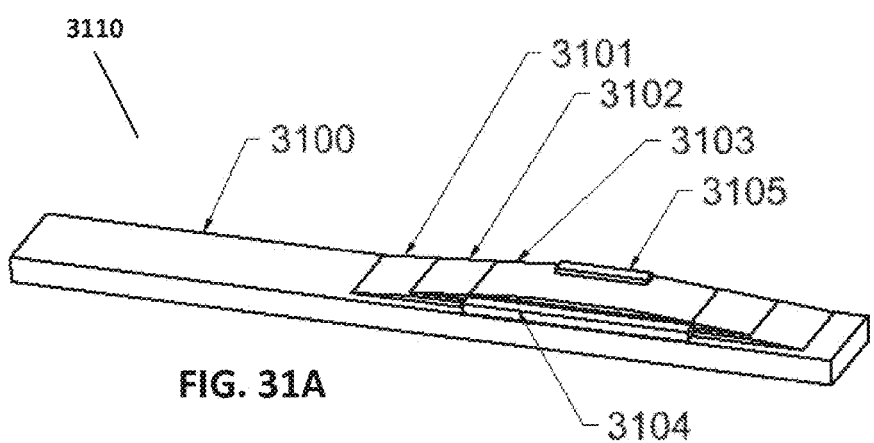
FIGS. 31A through 31B show the three offset layers of FIGS. 30A and 30B in perspective.
Figure 31B:
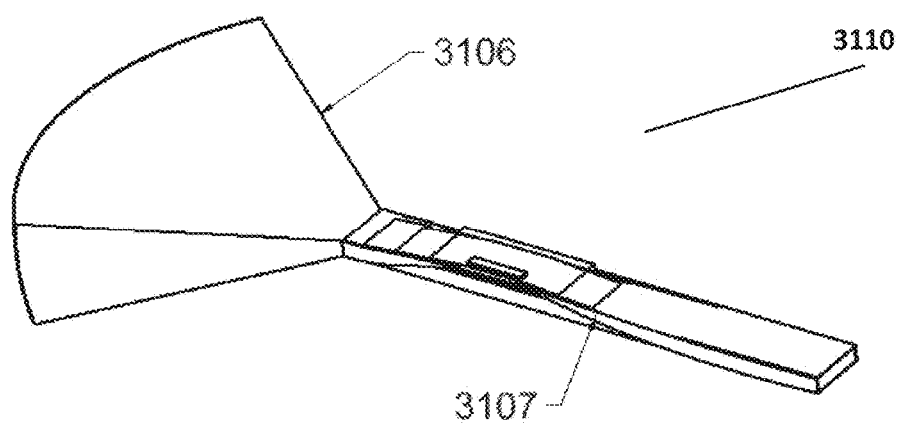
Figure 32A:
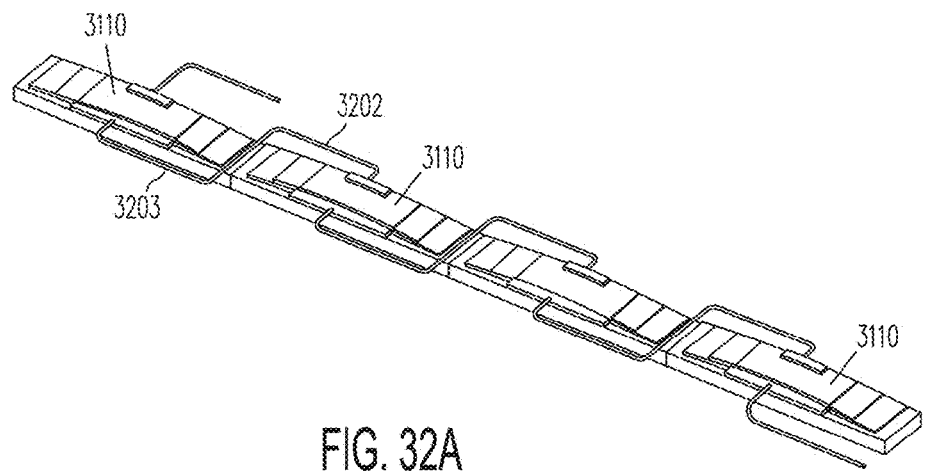
FIGS. 32A and 32B show electrical connection of three layer lateral absorbing solar cells formed in the code of a waveguide and connected in series so as to provide additive voltage at a reduced current according to some embodiments of the present invention.
Figure 32B:
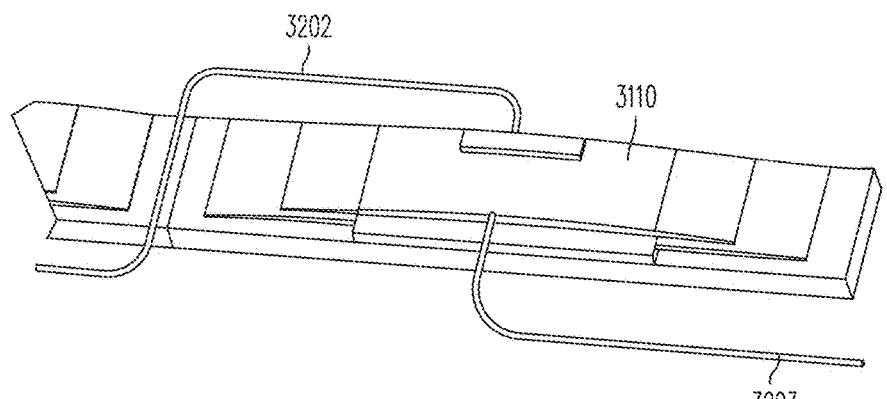

FIGS. 31A and 31B show the three offset layers 3101, 3102, and 3103 on a substrate 3100 similar to that shown in FIGS. 30A and 30B to form device 3110. Layers 3101, 3102, and 3103 are tapered versions of layers 3001, 3002, and 3003, respectively. Metallization 3105 is coupled to layer 3103 and metallization 3104 is coupled to layer 3101. FIG. 31B shows the path of light 3107 laterally through the PIN waveguide core from source 3106. FIGS. 32A and 32B shows electrical connection to device 3110. As is illustrated, multiple ones of device 3110 can be serially connected in the path of a light beam. Wires 3202 and 3203 serially couple multiple ones of devices 3110. Such a series of devices 3110 can be used as laterally absorbing solar cells formed in the code of a waveguide and connected in series so as to provide additive voltage at a reduced current. The band absorber materials may be the same or different. The band absorber materials in successive devices can be any suitable material, for example germanium, silicon CdTe, CIGS or a GaN or GaAs or Indium Phosphide based absorber.

FIG. 33 shows a lateral absorbing photovoltaic cell device 3110 in a waveguide receives source light 3106. A series transformer mode size converter 3303 according to some embodiments of the present invention can be used for out coupling below band light from device 3110 into an optical fiber 3306 with core 3307 for transport.

Figure 34:
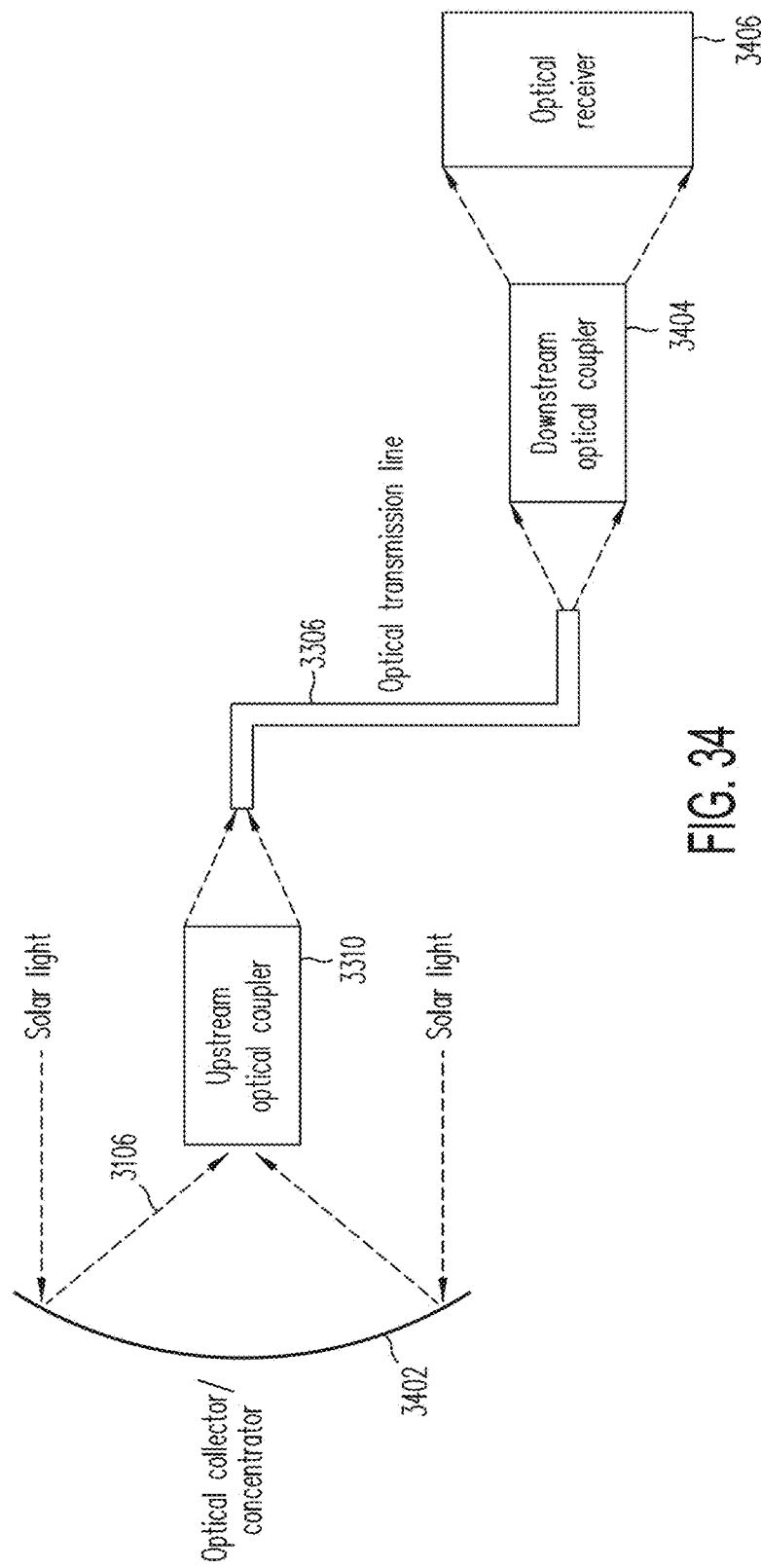
FIG. 34 shows a system for the concentration, coupling and transport of light to an optical receiver according to some embodiments of the present invention.

FIG. 34 shows a system for the concentration, coupling and transport of light to an optical receiver 3406. As shown in FIG. 34, solar light can be concentrated by mirror 3402 to form source light 3106 that is coupled into device 3310 as described above. Light not absorbed by the PIN junction in device 3310 is coupled into optical fiber 3306 and transported to optical coupler 3404. Optical coupler 3404 can be formed according to embodiments of the present invention and couples light from fiber 3306 to optical receiver 3406. The light can be absorbed and stored as thermal energy in receiver 3406.

Figure 35:
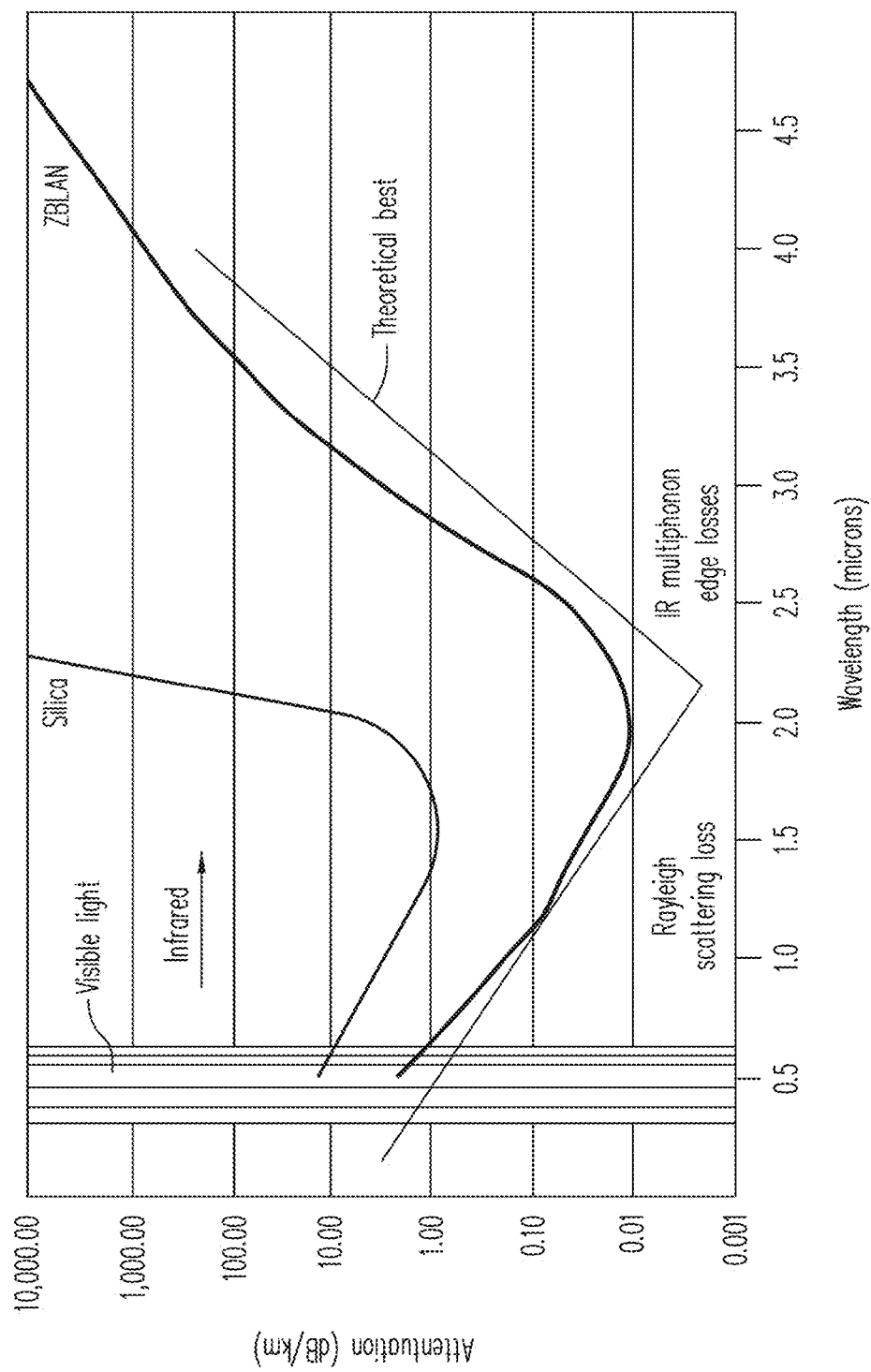
FIG. 35 illustrates optical attenuation in heavy fluoride glasses ZBLAN (ZrF4-BaF2-LaF3-AlF3-NaF compounds) as compared with Silica.

FIG. 35 illustrates optical attenuation in ZBLAN as compared with Silica. ZBLAN is part of the family of heavy-metal fluoride glasses. Ordinary glass is based on silica, molecules of silicon dioxide (like sand or quartz), plus other compounds to get different qualities (most eyeglasses, though, are made of special plastics). ZBLAN is fluorine combined with metals: zirconium, barium, lanthanum, aluminum, and sodium (Zr, Ba, La, Al, Na, hence the name).

One skilled in the art will recognize variations and modifications of the examples specifically discussed in this disclosure. These variations and modifications are intended to be within the scope and spirit of this disclosure. As such, the scope is limited only by the following claims.

What is claimed is:

1. A solar cell comprising:
   a waveguide core for receiving light;
   a first layer formed on the waveguide core;
   a second layer formed on the first layer;
   a third layer formed on the second layer;
   first metalization coupled to the first layer; and
   second metalization coupled to the third layer;
   wherein the first layer comprises a first optical film which varies in an index of refraction in a lateral direction between a first input end where the light is received and a first output end where the light is emitted.

2. The solar cell of claim 1, wherein the second layer is an intrinsic layer that separates the first and third layers.

3. The solar cell of claim 1, wherein one or more of the first, second, or third layers has a tapered lateral thickness.

4. The solar cell of claim 1, wherein one or more of the first layer or the third layer is a conductive transparent layer.

5. The solar cell of claim 1, wherein the first, second, and third layers form a PIN device.

6. The solar cell of claim 5, wherein the PIN device includes a band absorber material selected from a group consisting of germanium, silicon, CdTe, CIGS, GaN, GaAs, and indium phosphide.

7. The solar cell of claim 1, wherein the waveguide core has a first index of refraction that is lower than respective indexes of refraction for the first, second, and third layers.

8. A method comprising:
   receiving, by a solar cell, light, the solar cell comprising:
      a waveguide core for receiving the light;
      a first layer formed on the waveguide core;
      a second layer formed on the first layer;
      a third layer formed on the second layer;
      first metalization coupled to the first layer; and
      second metalization coupled to the third layer;
      wherein the first layer comprises a first optical film which varies in an index of refraction in a lateral direction between a first input end where the light is received and a first output end where the light is emitted; and
   generating a voltage.

9. The method of claim 8, wherein the second layer is an intrinsic layer that separates the first and third layers.

10. The method of claim 8, wherein one or more of the first, second, or third layers has a tapered lateral thickness.

11. The method of claim 8, wherein one or more of the first layer or the third layer is a conductive transparent layer.

12. The method of claim 8, wherein the first, second, and third layers form a PIN device.

13. The method of claim 12, wherein the PIN device includes a band absorber material selected from a group consisting of germanium, silicon, CdTe, CIGS, GaN, GaAs, and indium phosphide.

14. The method of claim 8, wherein the waveguide core has a first index of refraction that is lower than respective indexes of refraction for the first, second, and third layers.

15. A solar cell comprising:
   a waveguide core for receiving light;
   a first PIN device formed on the waveguide core;
   a second PIN device formed on the waveguide core and coupled in series with the first PIN device;
   wherein the first PIN device comprises:
      a first layer formed on the waveguide core;
      a second layer formed on the first layer;
      a third layer formed on the second layer;
      first metalization coupled to the first layer; and
      second metalization coupled to the third layer;
      wherein the first layer comprises a first optical film which varies in an index of refraction in a lateral direction between a first input end where the light is received and a first output end where the light is emitted.

16. The solar cell of claim 15, further comprising a conductor electrically coupling the second metalization to a third metalization of the second PIN device.

17. The solar cell of claim 15, wherein the first PIN device and the second PIN device include a same band absorber material.

18. The solar cell of claim 15, wherein the first PIN device and the second PIN device include a different band absorber material.

19. The solar cell of claim 15, wherein the first PIN device includes a band absorber material selected from a group consisting of germanium, silicon, CdTe, CIGS, GaN, GaAs, and indium phosphide.

20. The solar cell of claim 15, wherein one or more of the first, second, or third layers has a tapered lateral thickness.

* * * * *